United States Patent
Woo et al.

(10) Patent No.: US 12,176,139 B2
(45) Date of Patent: *Dec. 24, 2024

(54) MAGNETIC FILM

(71) Applicant: 3M INNOVATIVE PROPERTIES COMPANY, St. Paul, MN (US)

(72) Inventors: Seong-Woo Woo, Gyeonggi-do (KR); Jung Ju Suh, Seoul (KR); Charles L. Bruzzone, Woodbury, MN (US); Jennifer J. Sokol, Mahtomedi, MN (US); Sergei A. Manuilov, Bayport, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/105,980

(22) Filed: Feb. 6, 2023

(65) Prior Publication Data

US 2023/0187125 A1    Jun. 15, 2023

Related U.S. Application Data

(62) Division of application No. 16/630,006, filed as application No. PCT/IB2018/055793 on Aug. 1, 2018, now Pat. No. 11,605,499.

(60) Provisional application No. 62/547,737, filed on Aug. 18, 2017.

(51) Int. Cl.
*H01F 27/36* (2006.01)
*H01F 1/153* (2006.01)
*H01F 10/13* (2006.01)

(52) U.S. Cl.
CPC .......... *H01F 27/36* (2013.01); *H01F 10/131* (2013.01); *H01F 27/361* (2020.08); *H01F 1/15333* (2013.01); *Y10T 428/32* (2015.01)

(58) Field of Classification Search
None
See application file for complete search history.

(56) References Cited

U.S. PATENT DOCUMENTS

| 7,042,310 | B1 | 5/2006 | Petzold | |
| 11,605,499 | B2 * | 3/2023 | Woo | H01F 27/36 |
| 2009/0159451 | A1 * | 6/2009 | Tomantschger | C25D 5/611 |
| | | | | 205/148 |

(Continued)

FOREIGN PATENT DOCUMENTS

| CN | 1596436 | 3/2005 |
| CN | 105632756 | 10/2017 |
| EP | 2811816 | 12/2014 |

(Continued)

OTHER PUBLICATIONS

Machine Translation and Abstract Translation of JP 2010-229466 A (from parent) (Year: 2010).*

(Continued)

*Primary Examiner* — Kevin M Bernatz
(74) *Attorney, Agent, or Firm* — Jonathan L. Tolstedt

(57) ABSTRACT

A magnetic film includes iron and copper distributed between opposing first and second major surfaces of the magnetic film. The copper has a first atomic concentration C1 at a first depth d1 from the first major surface and a peak second atomic concentration C2 at a second depth d2 from the first major surface, d2>d1, C2/C1≥5.

3 Claims, 38 Drawing Sheets

(56) References Cited

U.S. PATENT DOCUMENTS

2010/0230010 A1    9/2010   Yoshizawa et al.

FOREIGN PATENT DOCUMENTS

| JP | 2004256831 |   | 9/2004 |
|----|------------|---|--------|
| JP | 2005183781 |   | 7/2005 |
| JP | 2010229466 |   | 10/2010 |
| JP | 2010229466 A | * | 10/2010 |
| JP | 4836749 |   | 10/2011 |
| JP | 2017214616 A | * | 12/2017 |
| KR | 20050019948 |   | 3/2005 |
| WO | WO 2014-162177 |   | 10/2014 |
| WO | WO 2015-126865 |   | 8/2015 |
| WO | WO 2017-099993 |   | 6/2017 |
| WO | WO 2019-034967 |   | 2/2019 |

OTHER PUBLICATIONS

Abstract Translation of JP 2017214616 A (from parent) (Year: 2017).*
Han, "Formation of Nitride Film on Amorphous Ribbon Using Chemical Vapor Deposition", Materials Science and Engineering A, 2007, vol. 449, No. 451, pp. 741-746.
Dossett, "Fundamentals of Nitriding and Nitrocarburizing", ASM Handbook, Steel Heat Treating Fundamentals and Processes, 2013, vol. 4A, pp. 619-646.
Grognet, "Microstructural Study of Nanocrystalline Fe—(Cu—Nb)—Si—B Ribbons Obtained By a Nitriding Thermochemical Treatment", Journal of Magnetism and Magnetic Materials, 2000, vol. 210, pp. 167-180.
Liu, "Nanocrystalline Soft Magnetic Ribbon With $\alpha''$-$Fe_{16}N_2$ Nanocrystallites Embedded In Amorphous Matrix", Journal of Magnetism and Magnetic Materials, 2008, vol. 320, pp. 2752-2754.
Tang, "Formation of Nanocrystalline Fe—N—B—Cu Soft Magnetic Ribbons", Journal of Non-Crystalline Solids, 2004, vol. 337, pp. 276-279.
International Search Report for PCT International Application No. PCT/IB2018/055793, mailed on Jan. 7, 2019, 6 pages.

* cited by examiner

MAGNETIC FILM

CROSS REFERENCE TO RELATED APPLICATION

This application is a divisional filing of U.S. application Ser. No. 16/630,006, filed Jan. 10, 2020, issued as U.S. Pat. No. 11,605,499, which is a national stage filing under 35 C.F.R. 371 of PCT/IB2018/055793, filed Aug. 1, 2018, which claims the benefit of U.S. Provisional Application No. 62/547,737, filed Aug. 18, 2017, the disclosures of which are incorporated by reference in their entireties herein.

BACKGROUND

The emergence and evolution of wearable electronic systems, such as smart phones, has led to technological advances in high-efficiency power storage, power conversion, and power transfer. Power transfer applications require high-performance magnetic materials for functions such as inductive coupling and electromagnetic interference shielding of the stray radio frequency power from rest of the system.

Inductive coupling is the near field wireless transmission of electrical energy between two magnetically coupled coils that can resonate at the same frequency. Inductive coupling is widely used in wireless power systems. In this approach a transmitter coil in one device transmits electric power across a short distance to a receiver coil in other device. The inductive coupling between the coils can be enhanced by using high permeability magnetic materials.

BRIEF SUMMARY

A magnetic film includes iron and copper distributed between opposing first and second major surfaces of the magnetic film. The copper has a first atomic concentration C1 at a first depth d1 from the first major surface and a peak second atomic concentration C2 at a second depth d2 from the first major surface, d2>d1, C2/C1≥5.

According so some embodiments, a magnetic film comprises iron and copper distributed between opposing first and second major surfaces of the magnetic film. The copper has atomic concentrations C1 and C2 at the respective first and second major surfaces and a peak atomic concentration C3 in an interior region of the film between the first and second major surfaces, C3/Cs≥5, Cs being a greater of C1 and C2.

According so some embodiments, a magnetic film includes a plurality of interconnected channels forming a two-dimensional array of electrically conductive magnetic islands. The channels at least partially suppress eddy currents induced within the magnetic film by a magnetic field. Each magnetic island comprises iron and a copper migration layer at each major surface of the magnetic island by migrating copper from an interior region of the magnetic island to the migration layer.

According to some embodiments, a magnetic film includes an alloy comprising iron, silicon, boron, niobium and copper, wherein at least portions of the copper have phase separated from the alloy and migrated from a first region of the magnetic film farther from a first major surface of the magnetic film to a second region of the magnetic film closer to the first major surface, so that the second region has a higher % atomic copper concentration than the first region.

These and other aspects of the present application will be apparent from the description below. In no event, however, should the above summaries be construed as limitations on the claimed subject matter, which subject matter is defined solely by the attached claims.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DESCRIPTION OF ILLUSTRATIVE EMBODIMENTS

This disclosure relates to soft magnetic films and to methods of making soft magnetic films. Soft magnetic films such as those described herein have application in wireless charging of batteries that power electronic devices, such as cellular telephones. The magnetic films can serve to guide magnetic fields during wireless charging, to shield the battery and/or other electronic device components from electromagnetic fields, to reduce eddy currents induced by magnetic fields, and/or to enhance transfer efficiency and/or Q factor of wireless charging systems, for example.

Figure 1A:
FIGS. 1A through 1C are diagrams of a magnetic film through various stages of a manufacturing process in accordance with some embodiments.
Figure 1B:
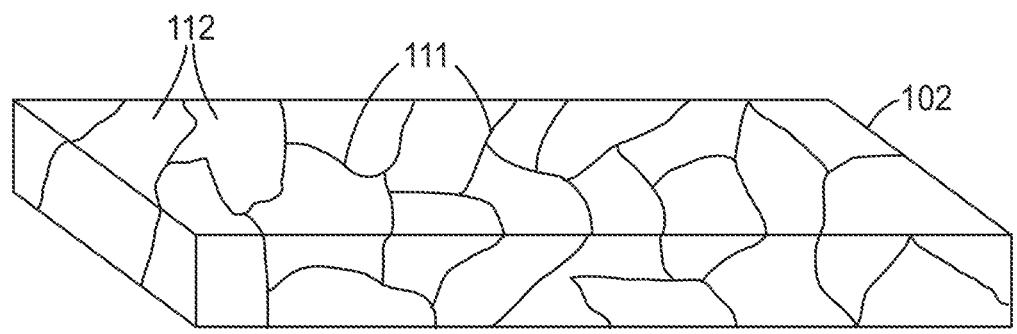
Figure 1C:
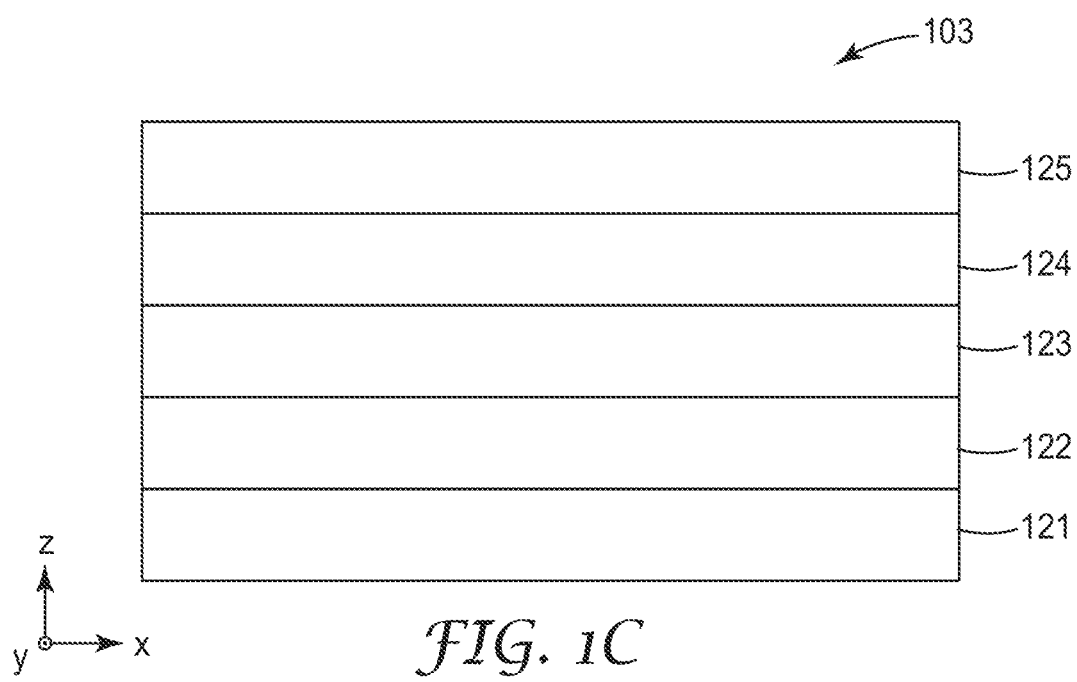
Figure 3A:
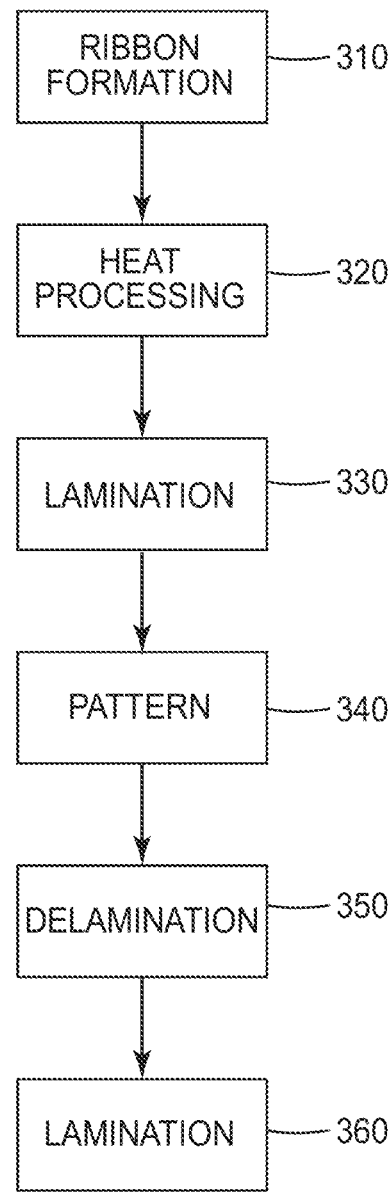
FIG. 3A is a flow diagram that illustrates several stages in a process of forming a multilayer construction that includes a magnetic film in accordance with some embodiments.
Figure 3B:
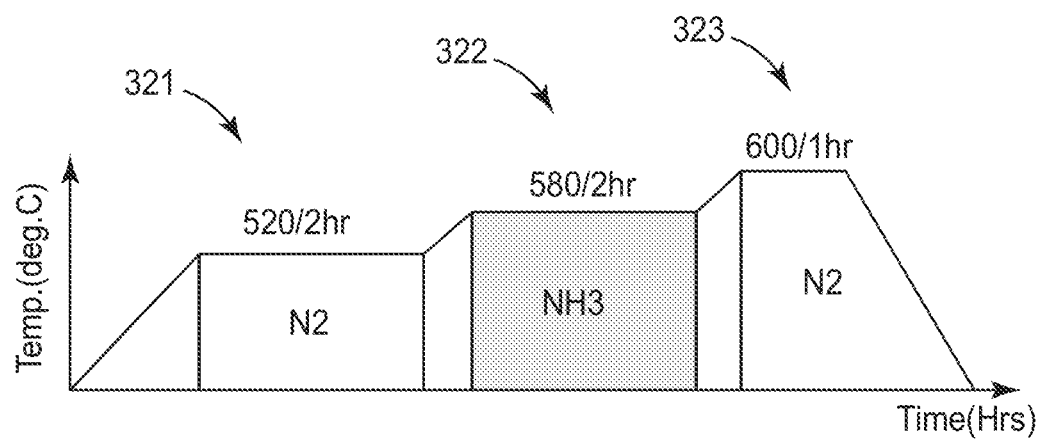
FIG. 3B illustrates a multi-stage heat process for fabricating a magnetic film, the heat process including two $N_2$ (nitrogen) sub-stages and an $NH_3$ (ammonia) sub-stage in accordance with some embodiments.
Figure 3C:
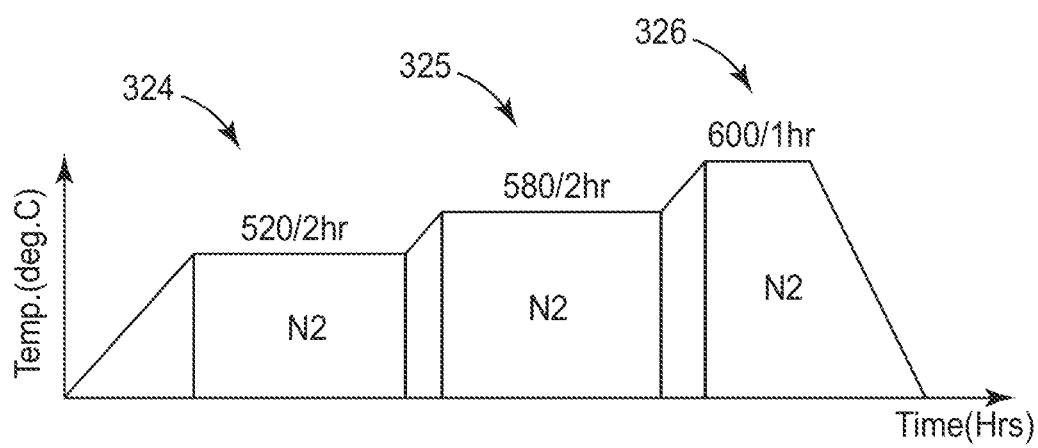
FIG. 3C illustrates a multi-stage heat process for fabricating a magnetic film, the heat process including three $N_2$ (nitrogen) sub-stages in accordance with some embodiments.

FIGS. 1A through 1C are diagrams of a magnetic film through various stages of a manufacturing process 200 which is illustrated in FIGS. 3A through 3C. FIG. 1A is a cross sectional diagram of a magnetic film 101 having material, magnetic, and/or functional characteristics described in more detail below. Magnetic film 101 is formed by the ribbon formation 310 and heat processing 320 stages of the manufacturing process shown in the flow diagram of FIG. 3A. In some implementations, after formation of the magnetic film 101, the film 101 is fractured into a number of fragments having random shapes and arrangements.

FIG. 1A shows a cross sectional view of an uncracked FIG. 1B shows a perspective view of the fractured (cracked) magnetic film 102 that may have material, magnetic, and/or functional characteristics described in more detail below. FIG. 1A shows a cross sectional view of an uncracked magnetic film 101 that may have material, magnetic, and/or functional characteristics described in more detail below. The cracked film 102 comprises a plurality of interconnected channels 111 forming an array, e.g., a two or three dimensional array, of conductive magnetic islands 112. Many of the channels 111 may extend through the thickness of the film 102. The channels 111 and islands 112 are configured to suppress eddy currents that can arise in the film 102 when in the presence of a magnetic field. In some embodiments, the channels 111 may be partially (less than 50%), substantially (more than 50%), or even completely (100%) filled with a material that is different from the material of the magnetic islands 112. For example, the channels may contain an electrically nonconductive material, and/or a non-magnetic material in some embodiments. The material in the channels may comprise an oxide and/or an adhesive, for example. The uncracked magnetic film 101 shown in FIG. 1A may be particularly suitable for magnetic shielding. The cracked magnetic film 102 shown in FIG. 1B may be particularly suitable for wireless charging.

A multilayer construction useful for wireless charging and/or magnetic shielding can include one or more magnetic films, such as one or more films 101 and/or one or more films 102. FIG. 1C depicts one such multilayer construction that includes a stack 123 of magnetic films, e.g., 2, 3, 4, or 5 magnetic films, such as films 101 and/or 102.

The finished construction 103 can also include an adhesive layer 122 disposed adjacent a first surface of the stack 123 that provides for securing the multilayer structure in place. The adhesive layer 122 may comprise a pressure sensitive adhesive, for example, and/or may have a thickness of about 5 μm. A removable liner 121 can be disposed adjacent to the adhesive layer 122. In some embodiments, removable liner is clear polyethylene terephthalate (PET) having a thickness of about 50-60 μm.

According to some embodiments, the multilayer construction 103 includes a cover film, 124 such as black colored PET film, having a thickness of about 5 μm to about 8 μm. A removable protective film 125 may be disposed over the cover film 124. For example, the protective film 125 can be a clear PET film having a thickness of about 80-90 μm. The values and ranges discussed here are provided as examples and other values are also possible.

Figure 2:
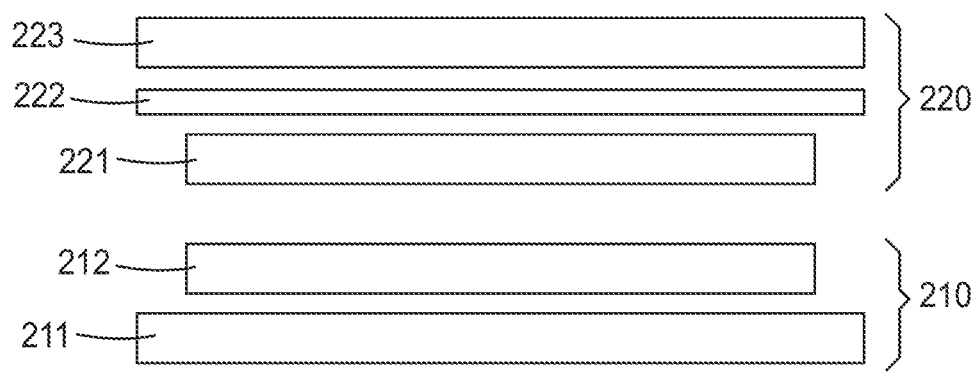
FIG. 2 is a diagram illustrating a wireless charging system in which the magnetic film shown in FIGS. 1A and 1B can be used.

FIG. 2 is a diagram illustrating a wireless charging system in which the magnetic film described herein may be used. A power transmitting device 210 generates a magnetic field for inductively charging a power receiving device 220. For example, the receiving device may be a mobile telephone, or other portable electronic device. A transmitting coil 212 of the transmitting device 210 is arranged on a substrate 211 which may include a soft magnetic film as described herein.

The receiving coil 221 is disposed within the power receiving device 220. The receiving coil 221 is electrically coupled to charge a battery 223 of the power receiving device 220. A soft magnetic film 222 as discussed herein can be disposed between the battery 223 and the receiving coil 221.

When an AC signal is applied to the transmitting coil 212, the transmitting coil 212 generates a magnetic field inducing an electromotive force (emf) in the receiving coil 221. The emf induced in the receiving coil 221 charges the battery 223. The magnetic film 222 disposed between the receiving coil 221 and the battery 223 may guide the magnetic field within the magnetic film, substantially block the magnetic field generated by the receiving coil from reaching the battery and/or other components of the electronic device powered by the battery, reduce eddy currents induced in the magnetic film, and/or enhance power transfer of the charging system.

A method of making a magnetic film having high magnetic permeability includes the following steps in sequence: 1) providing a nanocrystalline soft magnetic layer comprising an iron alloy; 2) heating the soft magnetic layer at a first elevated temperature for a first time interval under a nitrogen atmosphere; 3) heating the soft magnetic layer at a second elevated temperature, greater than the first elevated temperature, for a second time interval under an ammonia or a nitrogen atmosphere; and 4) heating the soft magnetic layer at a third elevated temperature, less than the second elevated temperature, for a third time interval under a nitrogen environment.

FIG. 3A is a flow diagram that illustrates several stages in a process of forming a multilayer construction that includes the magnetic film, such as multilayer construction 103 shown in FIG. 1C. A magnetic film is formed 310 by rapid solidification of a molten material deposited onto a rapidly rotating, cooled drum. The molten material can include a combination of elements including any combination of Fe, Cu, Nb, Si, B and Mn, for example. When deposited on the cooled drum, the molten material forms a ribbon-like amorphous magnetic film comprising the elements of molten material. In some embodiments, the amorphous magnetic film comprises 74.5 atomic % iron, 1.0 atomic % copper, 3.0 atomic % niobium, 15.5 atomic % silicon, and 1.5 atomic % boron. In some embodiments, the film comprises 73.6 atomic % iron, 1.0 atomic % copper, 3.0 atomic % niobium, 15.5 atomic % silicon, and 6.9 atomic % boron. In some embodiments, the magnetic film includes magnesium. After formation, the magnetic film is heat processed 320. The heat processing stage 320 can include several sub-stages. FIGS. 3B and 3C illustrate two possible variations of the heat processing stage. During the heat processing stage 320, the magnetic film nanocrystallizes into a two phase structure comprising fine crystalline grains having a mean diameter of about 10 nm to about 20 nm embedded in an amorphous residual phase. The heat processing stage 320 of the manufacturing process 300 imparts various characteristics that enhance the functionality of the magnetic film as discussed in more detail below. For example, the characteristics imparted to the magnetic film by the heat processing stage 320 can enhance the performance of the magnetic film with respect to power transfer efficiency of the magnetic film of a wireless charging system that incorporates the magnetic film, as shown in FIG. 2.

FIGS. 3B and 3C illustrate multi-stage heat processes in accordance with some embodiments. According to some embodiments, as indicated in FIG. 3B, the first sub-stage 321 involves heating the soft magnetic layer at the first elevated temperature including ramping the temperature from room temperature to about 520 degrees C. and holding the soft magnetic layer in an $N_2$ environment at about 520 degrees C. for about 2 hours.

The second sub-stage 322 comprises heating the soft magnetic layer at the second elevated temperature by ramping the temperature from about 520 degrees C. to about 580 degrees C. during which the environment of the soft magnetic film is smoothly transitioned from $N_2$ to $NH_3$. After the ramp-up in temperature, the magnetic film is held at the second elevated temperature for about 2 hours.

During the third sub-stage 323, the temperature is ramped from about 580 degrees C. to about 600 degrees C. The soft magnetic film is held at about 600 degrees C. for a period of about 1 hour. In embodiments in which the environment of the magnetic film is changed to $NH_3$ during the second heating, the environment is smoothly changed back to $N_2$ for the third heating. After the third heating, the soft magnetic film is allowed to cool.

FIG. 3C illustrates another possible multi-stage heat processing in accordance with some embodiments. The multistage heat processing illustrated in FIG. 3C includes a first sub-stage 324 ramping the temperature from room temperature to about 520 degrees C. and holding the soft magnetic layer in an $N_2$ environment at about 520 degrees C. for about 2 hours.

A second sub-stage 325 follows the first sub-stage 324 in during which the temperature is ramped up from 520 degrees C. to about 580 degrees C. The magnetic film is heated in the $N_2$ environment at a temperature of about 580 degrees C. for about 2 hours.

During the third sub-stage 326, the temperature is ramped up from about 580 degrees C. to about 600 degrees C. The magnetic film is heated in the $N_2$ environment at about 600 degrees C. for about 1 hour. After the third sub-stage 326, the magnetic film is allowed to cool to room temperature.

An optional lamination stage 330 follows the heat processing stage 320, during which an adhesive film 122 and liner 121 are laminated to a first major surface of the magnetic film. Lamination of the adhesive layer with liner film can assist in the optional patterning sub-stage 324 that follows.

During the patterning stage 340 the magnetic film is cracked into fragments that are separated by channels. In some implementations, the cracking occurs when the film is compressed between two rollers. The pressure applied by the rollers to the magnetic film crushes the film into irregular and random-shaped fragments. In some embodiments, crushing the film forces some of the adhesive from the adhesive film 122 into the channels between the fragments.

In an optional second lamination stage 360, a cover film and/or removable protective film may be applied.

The heat processing stage 320 outlined in FIGS. 3B and 3C modifies the material characteristics of the pre-heat processed magnetic film. The magnetic film disclosed herein provides enhanced performance characteristics when compared to a magnetic film that is not heat processed according to the methods shown in FIGS. 3B and 3C, for example.

Magnetic films formed using different processes were analyzed. The magnetic films tested were formed 1) without heat processing (referred to herein as "untreated"; 2) after heat processing according to the time and temperature profile shown in FIG. 4A (referred to herein as "heat process 1"); and 3) after heat processing according to the time and temperature profile shown in FIG. 4B (referred to herein as "heat process 2") The process indicated in FIG. 4B is the same as the multi-stage heat processing shown in FIG. 3B or 3C.

The material properties of the magnetic films processed as described above were tested using a variety of analytical techniques. These analytical techniques indicate distinguishing changes in the films that were fabricated according to the process shown in FIG. 4B (heat process 2) in comparison to the films that were not untreated or were heat processed according the process shown in FIG. 4A (heat process 1). The changes observed included visual changes at the surface of the magnetic films, changes in material composition profiles at the surface of the magnetic films, and changes in the magnetic permeability of the magnetic films, among other changes, which are discussed in more detail below.

Figure 5A:
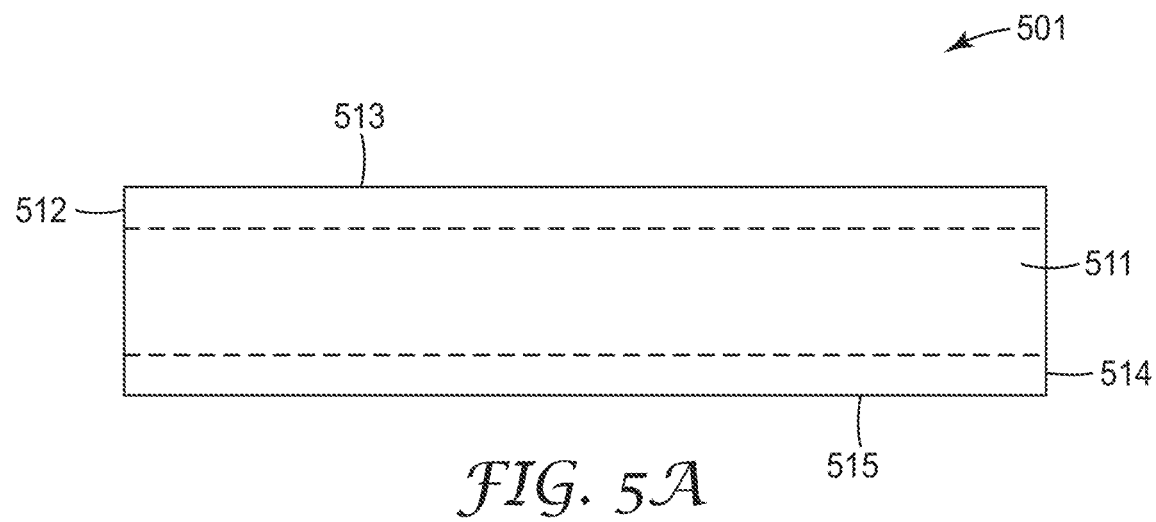
FIG. 5A shows a magnetic film having migration regions before fragmentation by cracking in accordance with some embodiments.
Figure 5B:
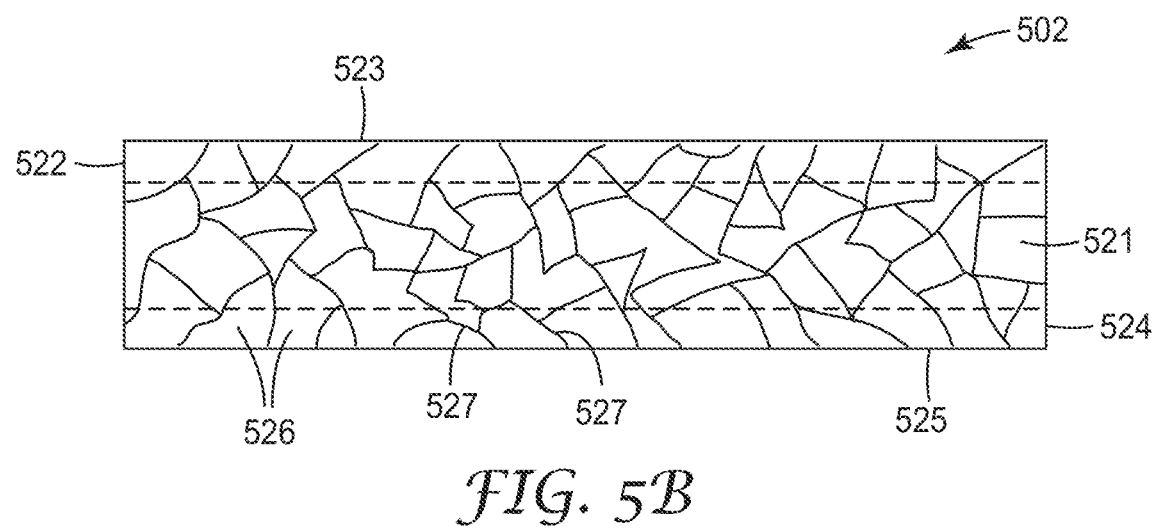
FIG. 5B shows a magnetic film having migration regions after fragmentation by cracking in accordance with some embodiments.

FIG. 5A shows a magnetic film 501 before fragmentation by cracking and FIG. 5B shows a magnetic film 502 after cracking Films 501 and 502 may optionally be disposed on a substrate, such as a PET film (see FIG. 1C), or other type of substrate. As previously indicated, the film may optionally be cracked after the heat processing. Cracking the film creates a two or three dimensional array of electrically conductive magnetic islands 526 separated by interconnected channels 527 as shown in the magnetic film 502 of FIG. 5B. The channels 527 and magnetic islands 526 at least partially suppress eddy currents induced within the magnetic film by a magnetic field. Each magnetic island 526 may comprise the materials of the magnetic film, such as one or more of iron, copper, silicon, boron, manganese, and niobium. The channels 527 can contain one or more materials that are electrically non-conductive and/or non-magnetic such as an adhesive and/or an oxide, for example.

Figure 4A:
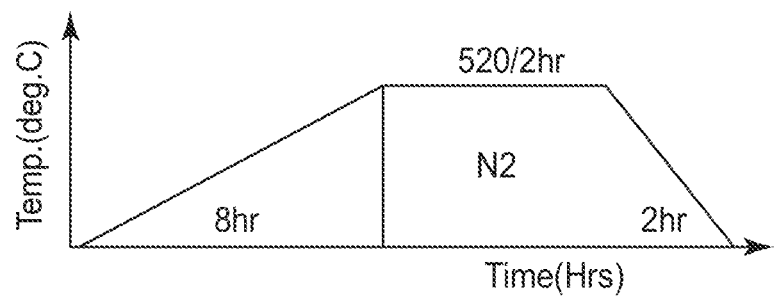
FIG. 4A depicts a single stage heat process for fabricating a magnetic film.
Figure 4B:
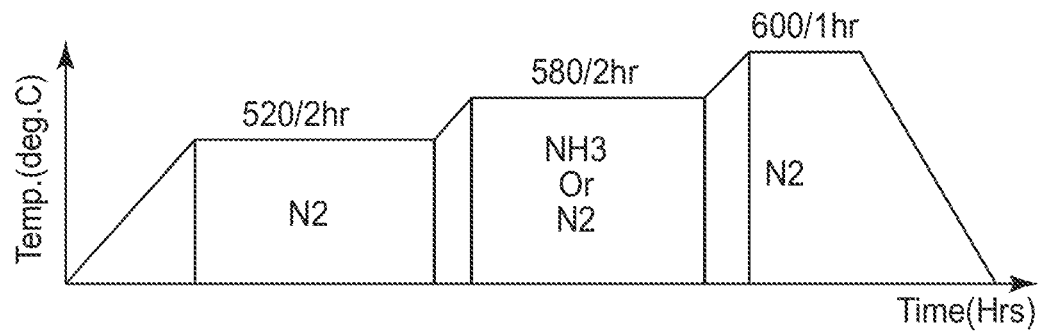
FIG. 4B depicts a multi-stage heat process for fabricating a magnetic film including an $NH_3$ or $N_2$ sub-stage in accordance with some embodiments.

In some embodiments, the heat process 2 illustrated in FIG. 4B creates a magnetic film comprising one or more migration regions 512, 514, 522, 524 near major surfaces 513, 515, 523, 525 of the magnetic film 501, 502 as depicted in FIGS. 5A and 5B. For example, in some embodiments, the magnetic film 501, 502 may comprise an alloy that includes one or more of iron, silicon, boron, manganese, copper, and niobium. At least one material in the film may migrate from one location to another location during the heat processing such that the atomic % concentration of the material in the migration region changes. The migration of the material changes the atomic % concentration of the material in the migration region such that the atomic % concentration of the material in the migration region is different from the atomic % concentration of the material in a comparative magnetic film having the same composition which does not undergo the heat processing. For example, the comparative film may be untreated or may undergo the process shown in FIG. 4A instead of the heat processing.

Figure 6:
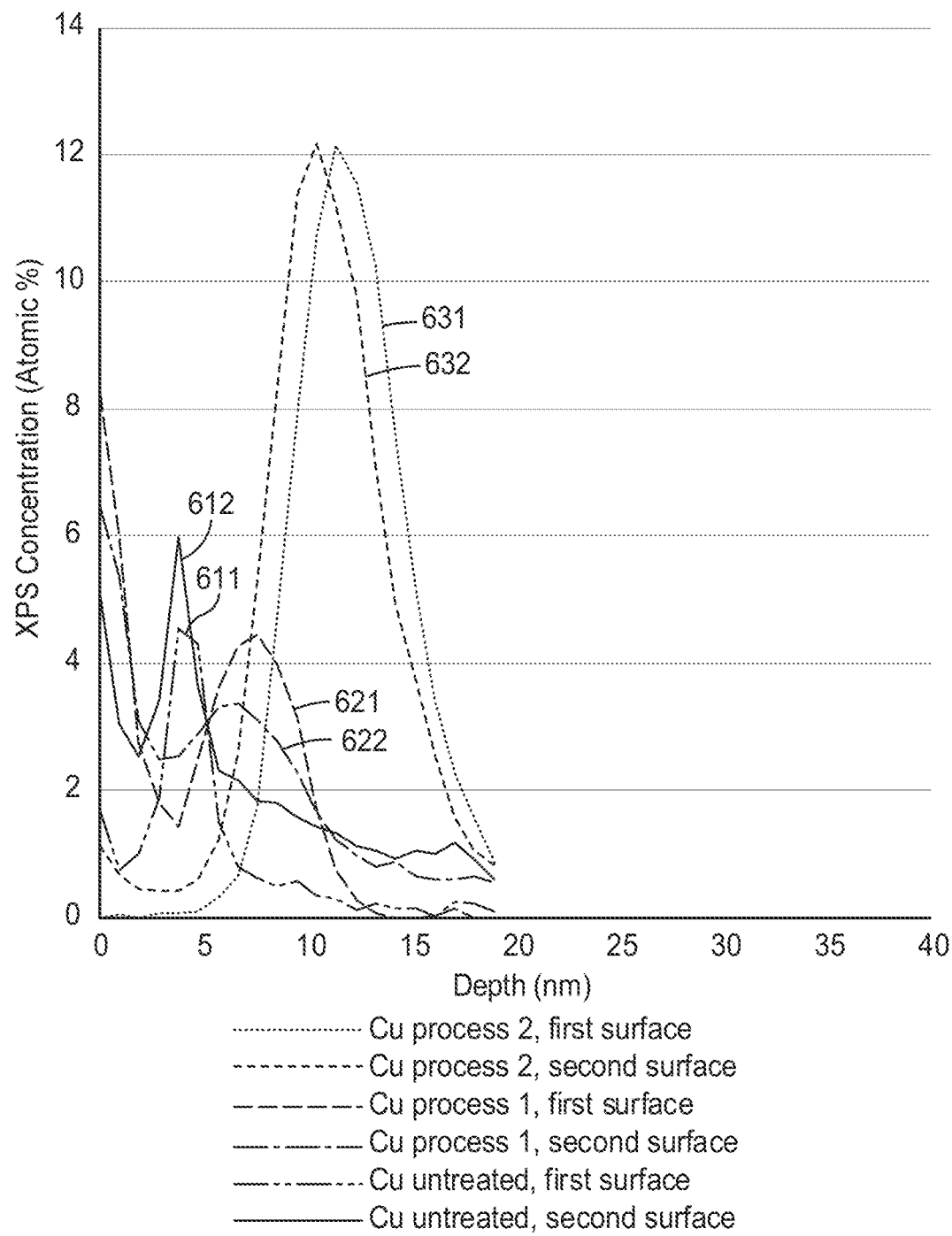
FIG. 6 provides overlaid graphs of the atomic % concentration of copper near the first and second surfaces of a magnetic film in accordance with some embodiments.

In some embodiments, the heat processing shown in FIG. 4B creates a Cu migration region in the magnetic films 501, 502. FIG. 6 provides overlaid graphs of the atomic % concentration of copper near the first and second surfaces of a magnetic film. The atomic % concentration was obtained through x-ray photoelectron spectroscopy (XPS) analysis. FIG. 6 shows graphs of the copper profile atomic % concentrations within about 40 nm of the first and second major surfaces of magnetic films. Graphs 611, 612 show the atomic % concentration profile of copper near the first and second surfaces, respectively, of an untreated magnetic film. Graphs 621, 622 show the atomic % concentration profile of copper near the first and second surfaces, respectively, of a magnetic film after fabrication by heat process 1 shown in FIG. 4A. Graphs 631, 632 shows the atomic % concentration profile of copper of the first and second surfaces of a magnetic film fabricated by the heat process 2 shown in FIG. 4B.

Comparison of the graphs for the untreated magnetic film (611, 612) and the heat process 1 magnetic film (621, 622) indicates a relatively small amount of migration of copper near the surface of the magnetic film. The migration of copper causes relatively small changes in the compositional profile of copper at the surfaces of the magnetic film between the untreated and heat process 1 magnetic films. Comparing the graphs of the compositional profile of copper in the untreated magnetic film (graphs 611, 612) or the heat process 1 magnetic film (graphs 621, 622) to the magnetic film (graphs 631, 632) fabricated by heat process 2 indicates that a significant amount of copper migration occurs as a result of the heat process 2.

Returning to FIGS. 5A and 5B there is shown an uncracked magnetic film 501 and a cracked magnetic film 502, respectively, in accordance with some embodiments. The magnetic film 501, 502 may include Cu migration regions 512, 514 after the heat processing. At least portions of the copper may phase separate from the alloy and migrate from a first region 511, 521 of the magnetic film 501, 502 that is farther from a first 513, 523 or second 515, 525 major surface of the magnetic film 501, 502 to a second 512, 522 and/or a third 514, 524 region of the magnetic film 501, 502 that is closer to the first 513, 523 or second 515, 525 major surface. The second 512, 522 and/or third 514, 524 regions may have a higher % atomic copper concentration than the first region 511, 521 in some embodiments. In some embodiments, the copper migration layer 512, 522, 514, 524 may have a peak copper atomic % concentration at a depth of in a range of about 17 nm to about 7 nm from a major surface 513, 515, 523, 525 of the magnetic film 501, 502. The atomic % concentration of copper near one or both of the major surfaces 513, 515 may be non-linear. In some embodiments, the migration of the copper from the first region 511, 521 to the second 512, 522 and/or 514, 524 regions is at least part of the reason that the magnetic permeability of the magnetic film 501, 502 increases during the heat process 2 such that the magnetic film 501, 502 has a larger magnetic permeability when compared to an identical magnetic film that has not undergone the multi-stage heat processing according to heat process 2 shown in FIG. 4B.

Figure 7A:
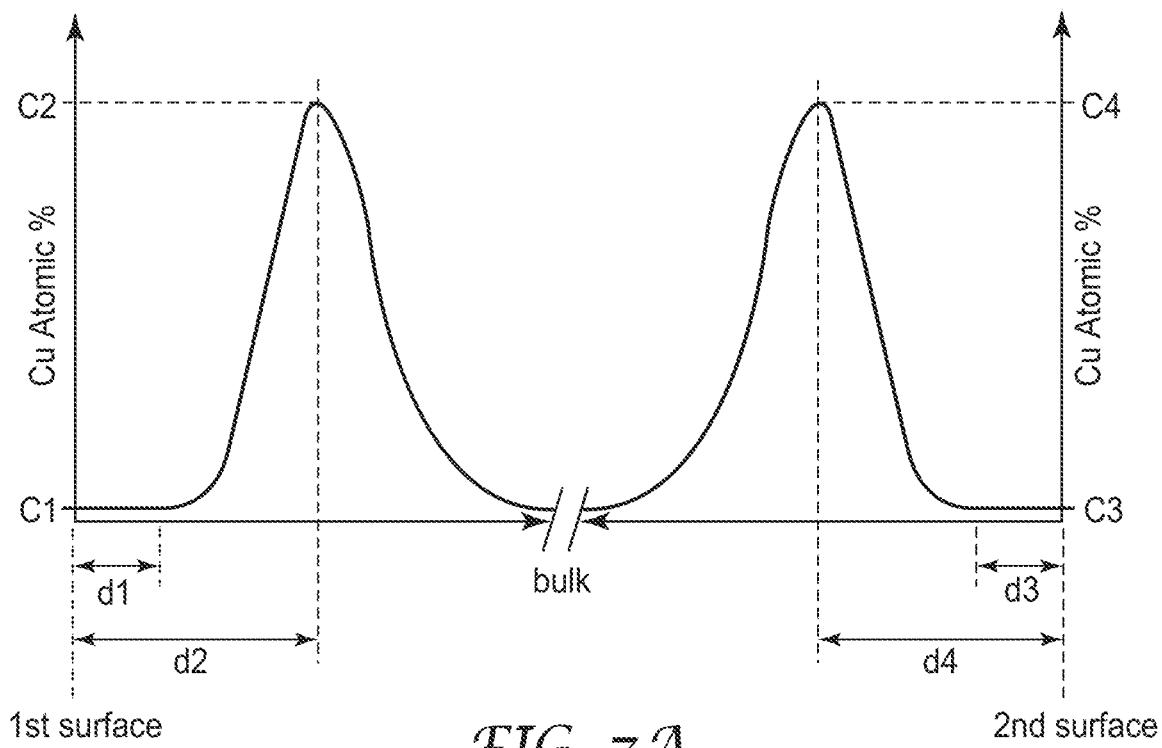
FIGS. 7A and 7B are graphs illustrating example compositional profiles of copper in a magnetic film near the first and second surfaces of the magnetic film in accordance with some embodiments.
Figure 7B:
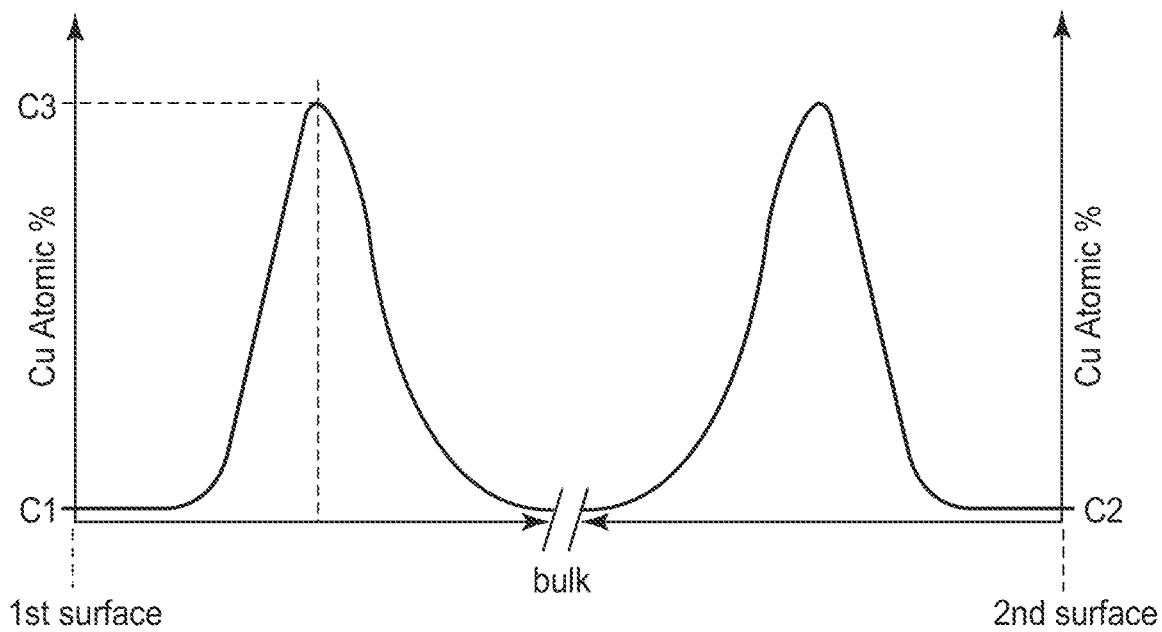

FIGS. 7A and 7B are graphs illustrating example compositional profiles of copper in a magnetic film near the first and second surfaces of the magnetic film in accordance with some embodiments. The compositional profiles of copper shown in FIGS. 7A and 7B are for a magnetic film that has undergone a multi-stage heat process, e.g., heat process 2 shown in FIG. 4B. According to some implementations, after the heat processing, the magnetic film includes at least copper and iron distributed between opposing first and second major surfaces of the magnetic film. The magnetic film may also include one or more of silicon, manganese, boron, nitrogen, and niobium.

As shown in FIG. 7A, copper in the magnetic film has a first atomic % concentration C1 at a first depth d1 from the first major surface of the magnetic film and a peak second atomic % concentration C2 at a second depth d2 from the first major surface of the film, where d2>d1. The concentration C2 of copper at d2 is at least five times the concentration C1 of copper at d1, such that $C2/C1 \geq 5$. For example, d1 may be less than about 5 nm, or less than about 3 nm. According to some embodiments, d2 can be between about 5 nm and about 20 nm.

As illustrated in FIG. 7A, there is a third atomic % concentration, C3, of copper at a third depth d3 measured from the second major surface of the magnetic film. There is a peak fourth atomic % concentration, C4, of copper at a fourth depth d4 measured from the second major surface of the magnetic film, wherein d4 is greater than d3, and C4 is at least 5 times greater than C3 such that $C4/C3 \geq 5$.

For example, d3 may be less than about 5 nm, or less than about 3 nm. According to some embodiments, d4 can be between about 5 nm and about 20 nm. In some embodiments, the first atomic % concentration C1 may be about equal to the third atomic % concentration, C3, the second atomic % concentration C2 may be about equal to the fourth atomic % concentration, C4. The first distance, d1 may be about equal to the third distance, d3, and the second distance, d2, may be about equal to the fourth distance, d4. In some embodiments, the value of d1 and the value of d3 are within about 5%, about 10%, about 15%, about 20% or about 25% of each other. In some embodiments, the value of d2 and the value of d4 are within about 5%, about 10%, about 15%, about 20%, or about 25% of each other.

According to some embodiments, as illustrated by the copper atomic % concentration profile of FIG. 7B, a magnetic film that has undergone the multi-stage heat processing (heat process 2) includes copper distributed between opposing first and second major surfaces of the magnetic film. The copper has atomic concentrations C1 and C2 at the respective first and second major surfaces and a peak atomic concentration C3 in an interior region of the film between the first and second major surfaces. The concentration C3 is at least five times greater than Cs, Cs being a greater of C1 and C2.

Figure 8A:
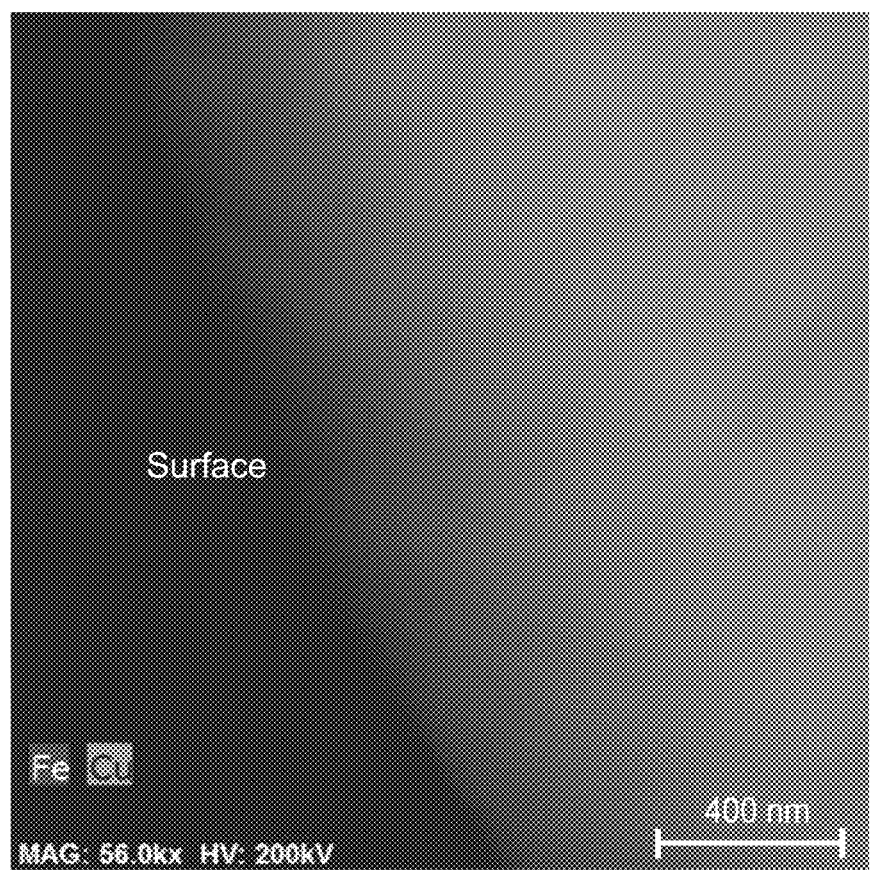
FIG. 8A shows a transmission electron microscope (TEM) image of magnetic film sample heat processed according to heat process 1 shown in FIG. 4A.
Figure 8B:
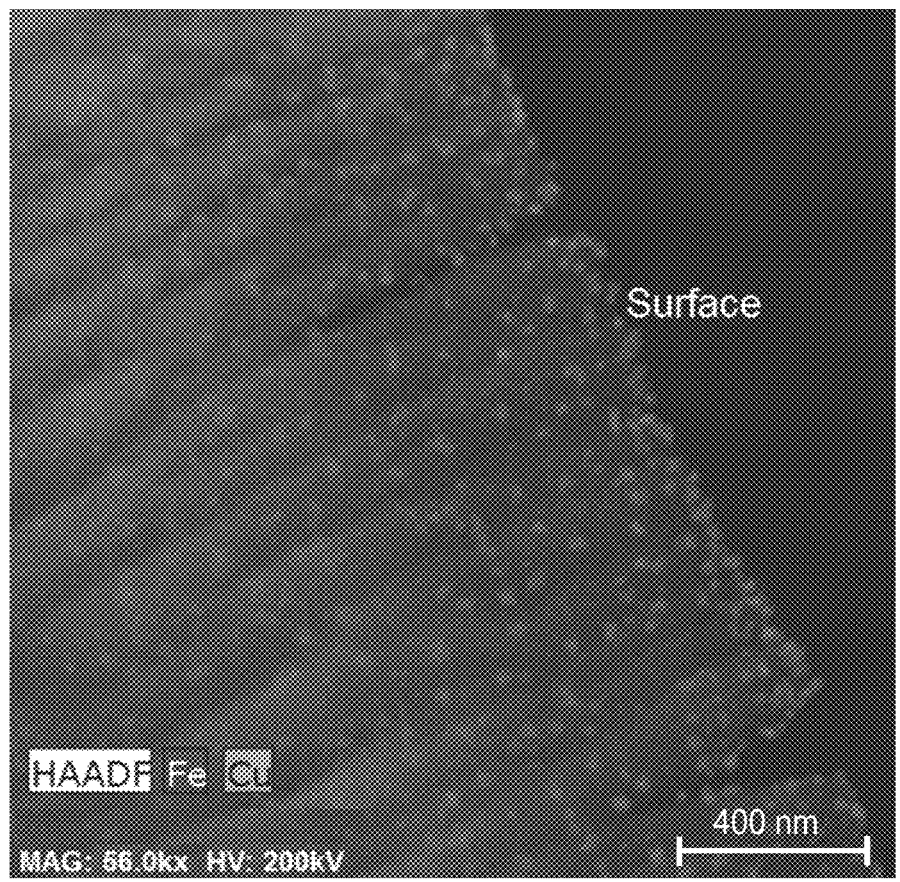
FIG. 8B shows a TEM image of a magnetic film sample comprising at least iron, silicon, and copper produced using the heat process 2 shown in FIG. 4B in accordance with some embodiments.

In samples of magnetic films, transmission electron microscopy images (TEM) indicate that the multi-stage heat processing (heat process 2 shown in FIG. 4A) increases the presence of metallic copper grains that are present at the surface of the film. FIG. 8A shows a TEM image of magnetic film sample heat processed according to heat process 1 shown in FIG. 4A, comprising at least iron, silicon, and copper. FIG. 8B shows a TEM image of a magnetic film sample comprising at least iron, silicon, and copper produced according to heat process 2 shown in FIG. 4B.

The image of the magnetic film sample of FIG. 8B shows substantially crystalline copper grains having maximum cross sectional diameters less than about 50 nm, less than about 40 nm, or even less than about 30 nm distributed in the magnetic film. The copper grains may be distributed non-uniformly along the thickness direction of the film. Review of the XPS and/or TEM analysis indicates that the copper particles are dispersed in the magnetic film so that Cu has a first peak atomic concentration within the magnetic film at a depth of about 50 nm from a major surface of the magnetic film in some embodiments.

Figure 9:
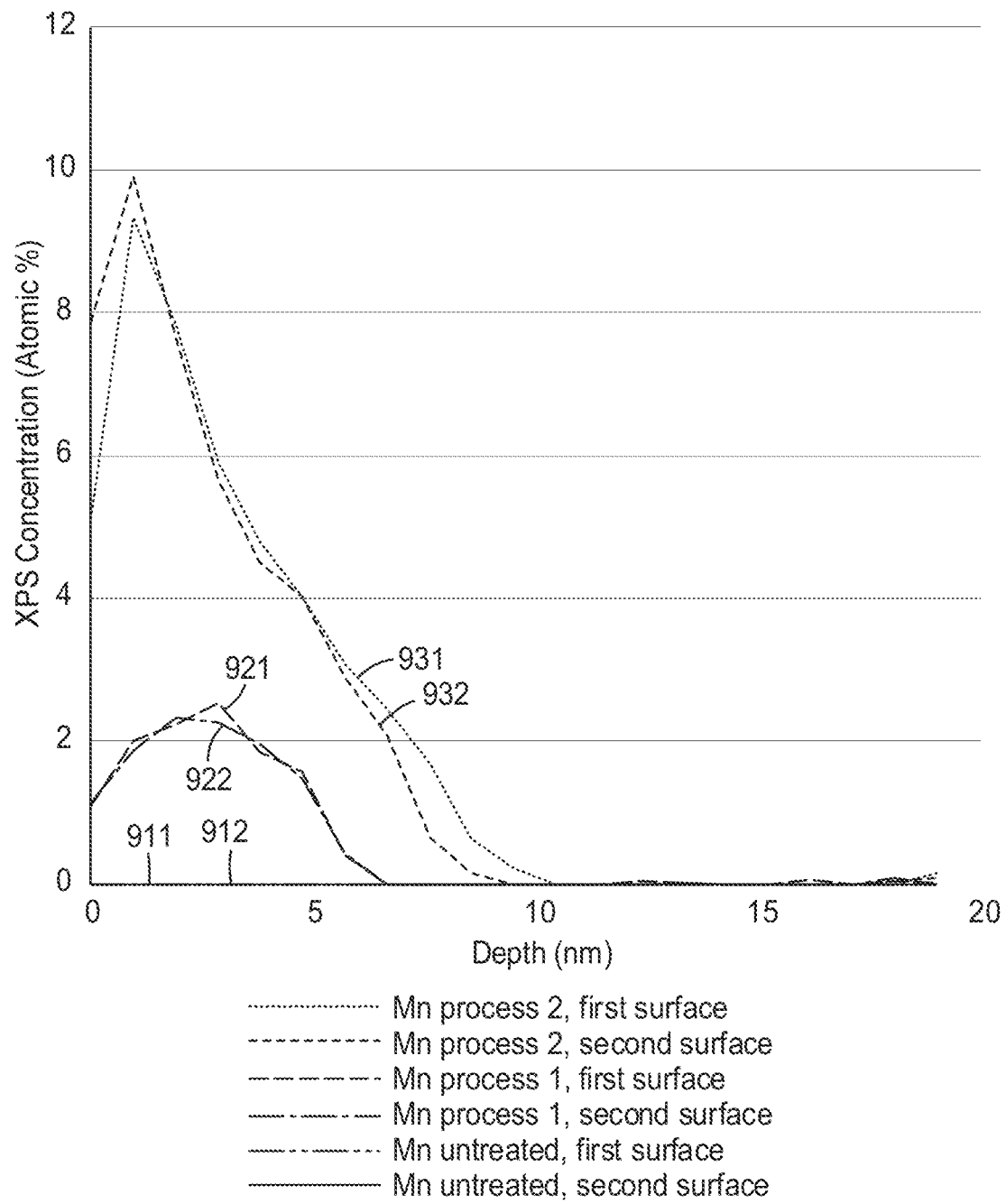
FIG. 9 shows overlaid graphs of the manganese profile atomic % concentrations near the first and second major surfaces of a magnetic film in accordance with some embodiments.

In some embodiments, the multi-stage heat process 2 shown in FIG. 4B creates a manganese migration region in the magnetic film. FIG. 9 shows overlaid graphs of the manganese profile atomic % concentrations within about 20 nm of the first and second major surfaces of the magnetic film as obtained by XPS.

Graphs 911, 912 indicate the manganese profile composition of the first and second surfaces of an untreated magnetic film. Graphs 921, 922 show the manganese profile composition of the first and second surfaces of a magnetic film after heat process 1 of FIG. 4A. Graphs 931, 932 show the manganese profile composition of the first and second surfaces of a magnetic film after the heat process 2 of FIG. 4B. Graphs 911, 912 show that the manganese atomic % concentration of the untreated magnetic film indicate a very small amount of manganese at the surface in the untreated film. After the heat process 1 shown in FIG. 4A, a manganese migration layer near the major surfaces includes relatively small amount of manganese, as indicated in graphs 921, 922. Graphs 931, 932 indicate the amount of manganese near the surface of the magnetic film after processing according to heat process 2 of FIG. 4B. The amount of manganese in the migration regions near the surfaces of the magnetic film increases in comparison to the untreated and annealed film (compare graphs 911, 912, 922, 923 to graphs 931, 932).

We turn again to FIGS. 5A and 5B, which show an uncracked magnetic film 501 and a cracked magnetic film 502, respectively. The magnetic films 501, 502 may be bonded to a substrate, such as the cover film, 124 of FIG. 1C. In some embodiments, the magnetic film 501, 502 may include manganese migration regions 512, 514 near the one or both surfaces 513, 515 of the magnetic film after the heat processing stage. In accordance with some embodiments, when processed according to heat process 2, at least portions of the manganese may have phase separated from the alloy and migrated from a first region 511, 521 of the magnetic film 501, 502 that is farther from a first 513, 523 or second 515, 525 major surface of the magnetic film 501, 502 to a second region 512, 522 and/or a third 514, 524 region of the magnetic film 501, 502 that is closer to the first 513, 523 or second 515, 525 major surface. In the high permeability magnetic film 510, 502, the second 512, 522 and/or third 514, 524 regions have a higher % atomic manganese concentration than the first region 511, 521. The atomic % concentration of Mn near or on both of the major surfaces 513, 515 may be non-linear. In some implementations, the Mn migration layer 512, 522, 514, 524 may have a peak manganese concentration at a depth of between about 15 nm to about 2 nm from a major surface, e.g., about 7 nm, about 5 nm or even about 2.5 nm from a major surface 513, 515, 523, 525 of the magnetic film 501, 502. The peak atomic % concentration of manganese in the manganese migration layer may be greater than about 3%, greater than about 5%, or even greater than about 9%, for example. According to some embodiments, the migration of the manganese from the first region 511, 521 to the second 512, 522 and/or third 514, 524 regions is at least part of the reason that the magnetic permeability of the magnetic film 501, 502 increases during the multi-stage heat process 2 such that the magnetic film 501, 502 has a larger magnetic permeability when compared to an identical magnetic film that has not undergone the heat processing or has undergone heat processing according the heat process 1 of FIG. 4A.

Figure 10:
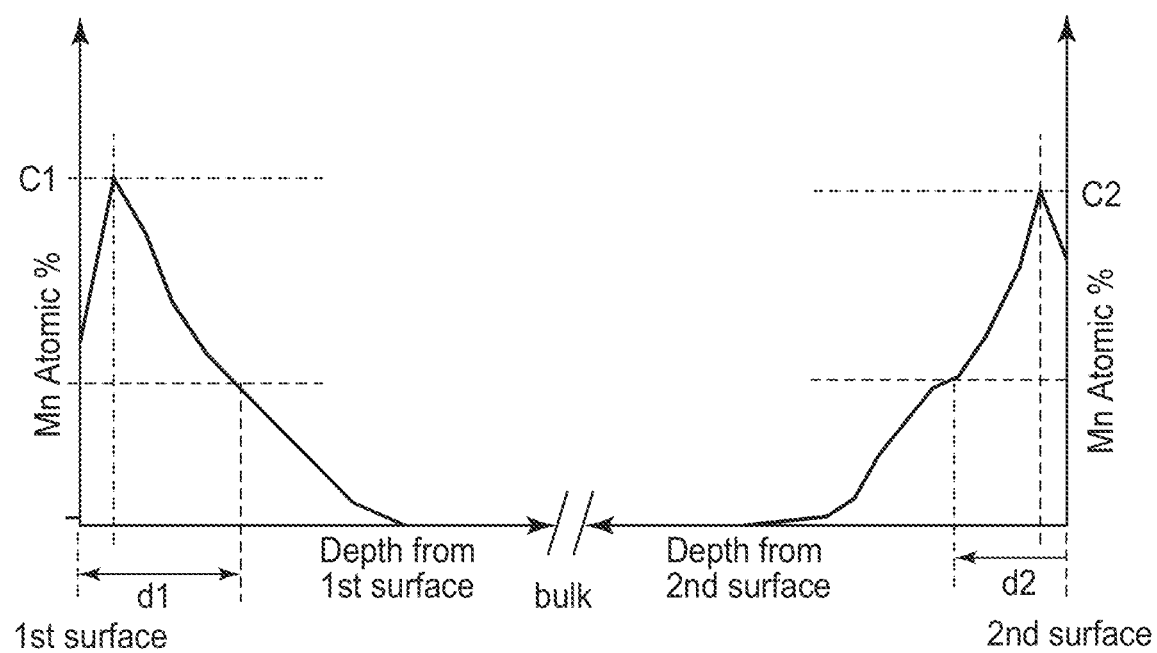
FIG. 10 is a graph illustrating an example compositional profile of manganese in a magnetic film in accordance with some embodiments.

FIG. 10 is a graph illustrating an example compositional profile of manganese in a magnetic film in accordance with some embodiments. According to some implementations, after the multi-stage heat processing of FIG. 4B, the magnetic film includes at least manganese and iron distributed between opposing first and second major surfaces of the magnetic film. The magnetic film may also include one or more of silicon, copper, boron, nitrogen, and niobium and/or other elements, for example.

As shown in FIG. 10, the concentration of manganese in the high permeability magnetic film has a peak first atomic concentration C1 within a first depth, d1, from the first major surface. According to some embodiments, the atomic concentration of the manganese throughout the first depth d1 is greater than about 4%, greater than about 5%, greater than about 7%, or even greater than about 8%. The depth d1 may be less than about 4 nm, or even less than about 3 nm, for example.

According to some embodiments, a magnetic film may comprise at least iron and manganese distributed between opposing first and second major surfaces of the magnetic film. The manganese in the magnetic film has a first peak atomic concentration C1 within a first depth, d1, from the first major surface and a second peak atomic concentration C2 within a second depth, d2, from the second major surface, wherein C1 and C2 are each greater than about 4%. For example, the peak atomic % concentration C1 and/or C2 may be greater than about 5%, greater than about 7%, or even greater than about 8%. According to some configurations, the value of d1 and d2 may be within about 20% of each other. In some configurations, d1 and d2 may each be less than about 10 nm.

Figure 11:
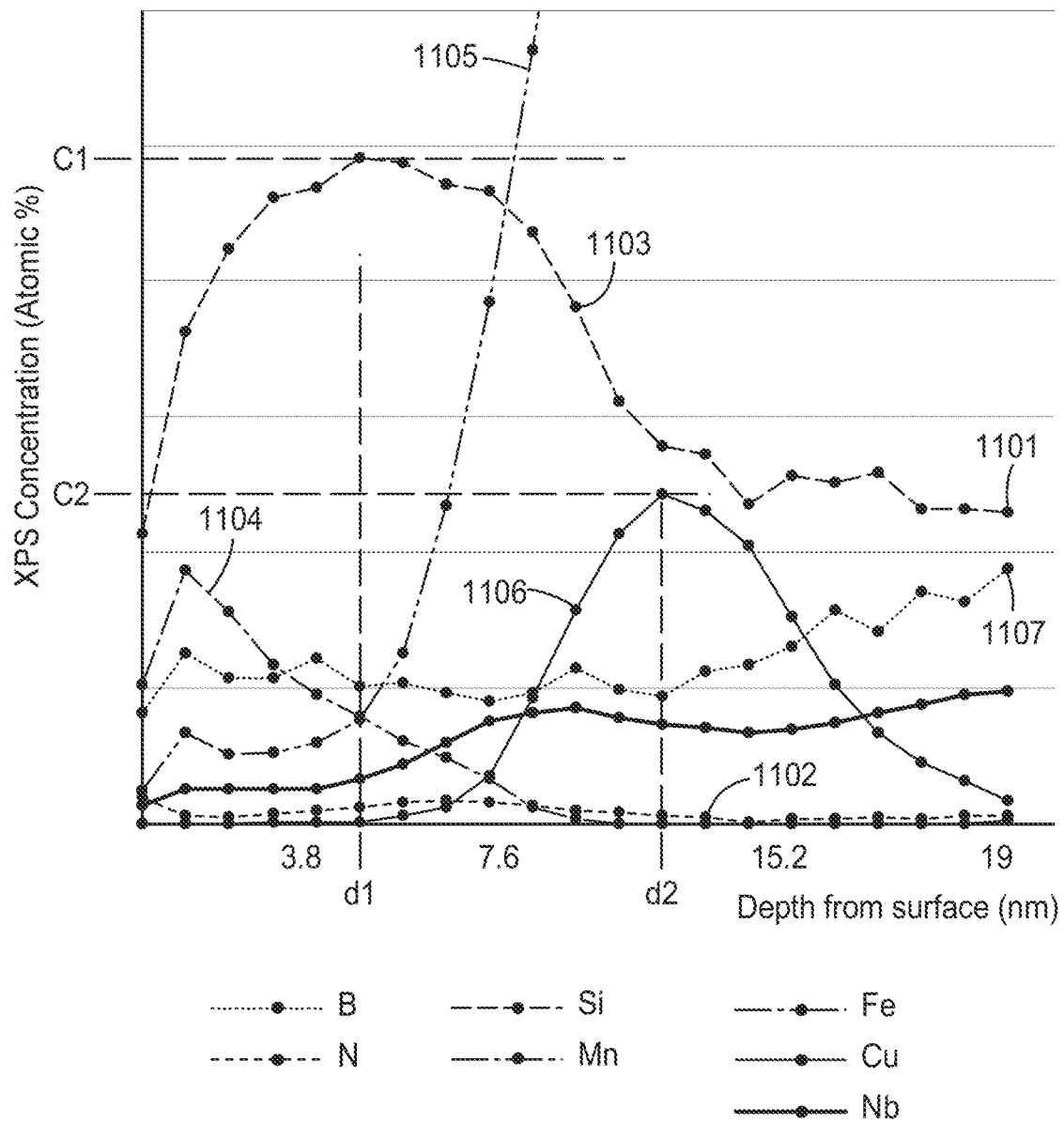
FIG. 11 shows overlaid graphs of atomic % concentrations of, boron, nitrogen, silicon, manganese, iron, copper, and niobium near a first major surface of a magnetic film in accordance with some embodiments.
Figure 12:
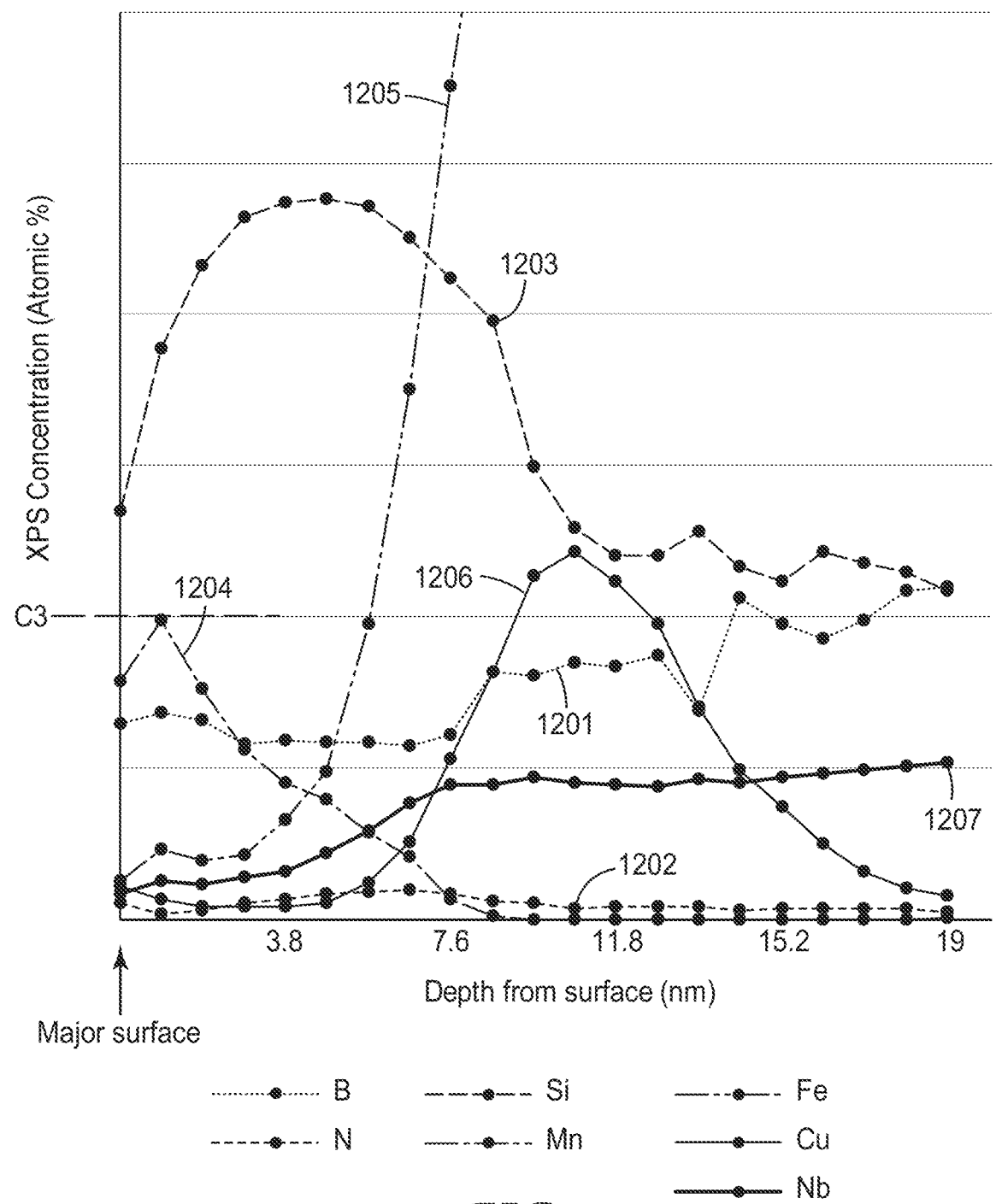
FIG. 12 shows overlaid graphs of atomic % concentrations of, boron, nitrogen, silicon, manganese, iron, copper, and niobium near a second major surface of the magnetic film of FIG. 11.

FIG. 11 shows overlaid graphs of atomic % concentrations of, boron 1101, nitrogen 1102, silicon 1103, manganese 1104, iron 1105, copper 1106, and niobium 1107 near a first major surface of a magnetic film obtained by XPS analysis. FIG. 12 shows overlaid graphs of atomic % concentrations of, boron 1201, nitrogen 1202, silicon 1203, manganese 1204, iron 1205, copper 1206, and niobium 1207 near a second major surface of the magnetic film of FIG. 11 obtained by XPS analysis.

Figure 13:
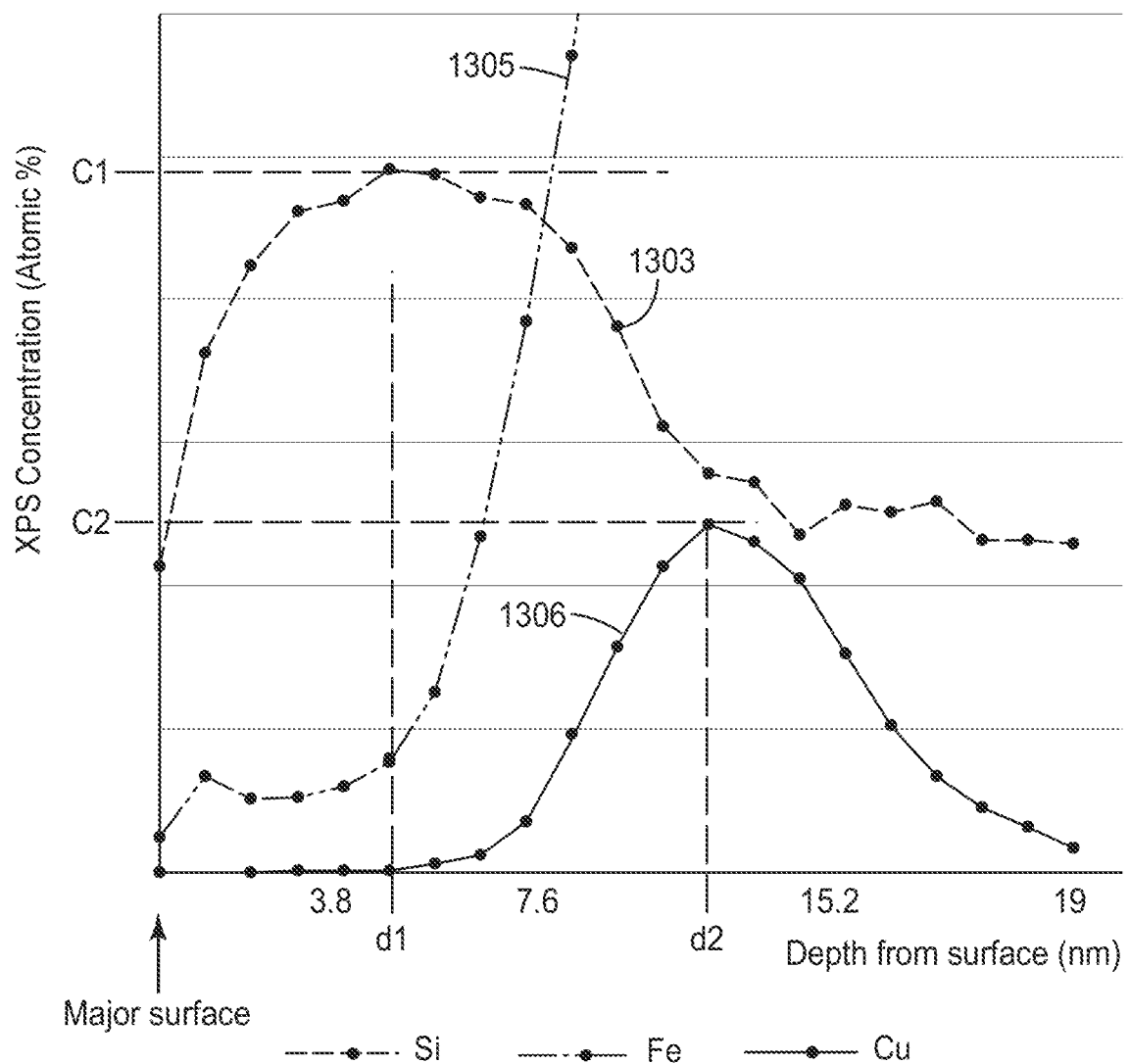
FIG. 13 shows overlaid graphs of the atomic % concentration of silicon, iron, and copper in a region of a magnetic film near a major surface of the magnetic film in accordance with some embodiments.

In some embodiments, a magnetic film includes at least iron, silicon, and copper distributed between opposing first and second major surfaces of the magnetic film. FIG. 13 shows overlaid graphs of the atomic % concentration of silicon 1303, iron 1305, and copper 1306 in a region of a magnetic film near a major surface of the magnetic film. As illustrated by the overlaid graphs FIG. 13, in this embodiment, the atomic % concentration of silicon may have a first peak atomic % concentration, C1, at a first depth d1 from the major surface of the magnetic film. Copper may have a second peak atomic % concentration, C2, at a second depth d2 from the major surface. In some embodiments, d1<d2 and/or C1>C2. For example, the distances d1 and d2 may be within about 20 nm from the major surface. The atomic % concentration of iron may increase between the major surface and d1 and increases substantially between d1 and d2.

Figure 14:
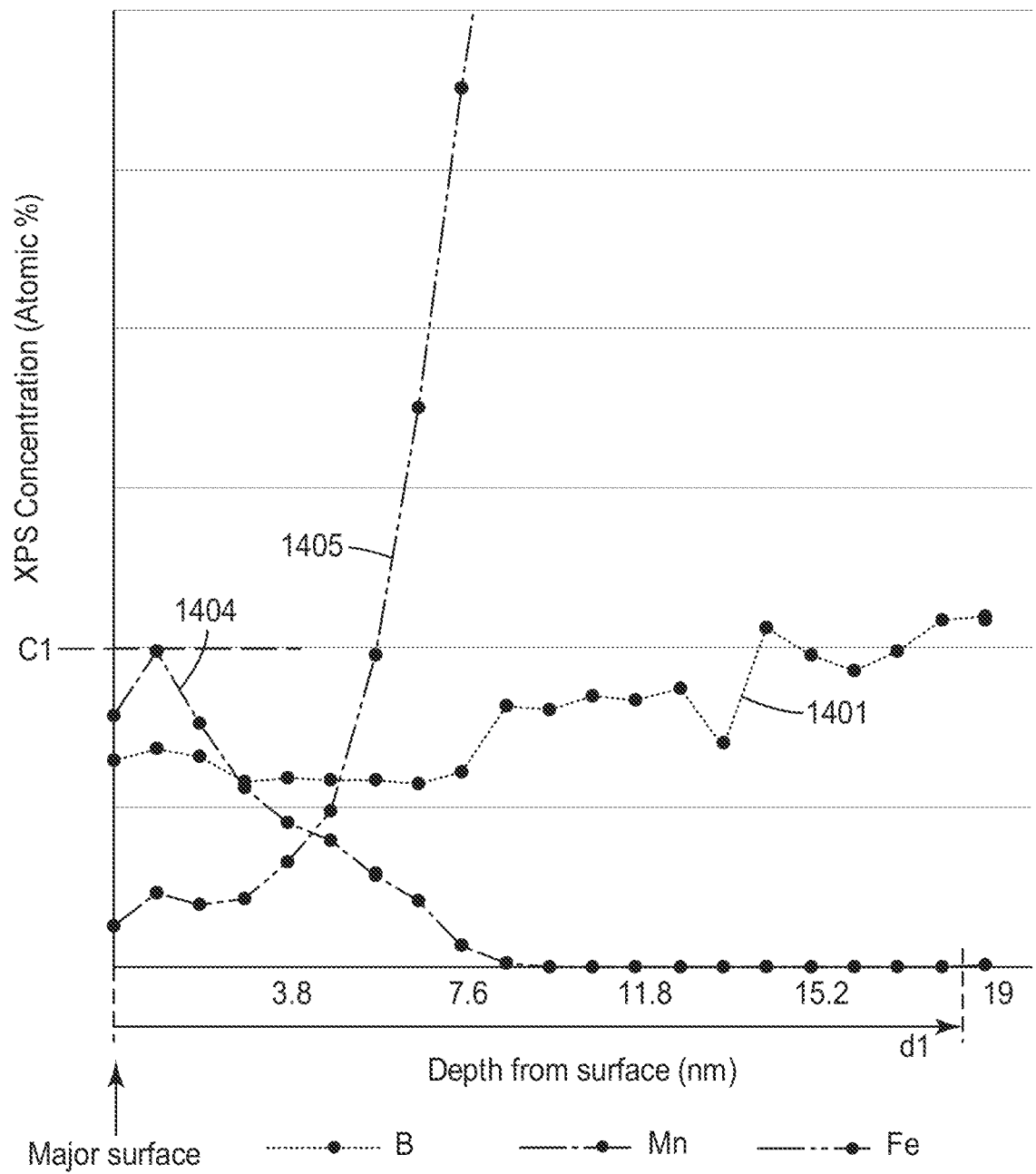
FIG. 14 includes graphs indicating the atomic % concentrations of boron, manganese, and iron, in a depth, d1, adjacent the first and/or second major surface in accordance with some embodiments.

According to some embodiments, a magnetic film comprises at least boron, manganese, and iron distributed between opposing first and second major surfaces of the magnetic film. As shown in overlaid plots of FIG. 14, in a depth, d1, adjacent the first and/or second major surface, atomic % concentrations of boron 1401 and iron 1405 increase along a thickness direction of depth, d1, and the manganese has a first peak atomic concentration C1 within d1. The depth, d1, may extend from the major surface about 20 nm along the thickness direction of the magnetic film.

Figure 15:
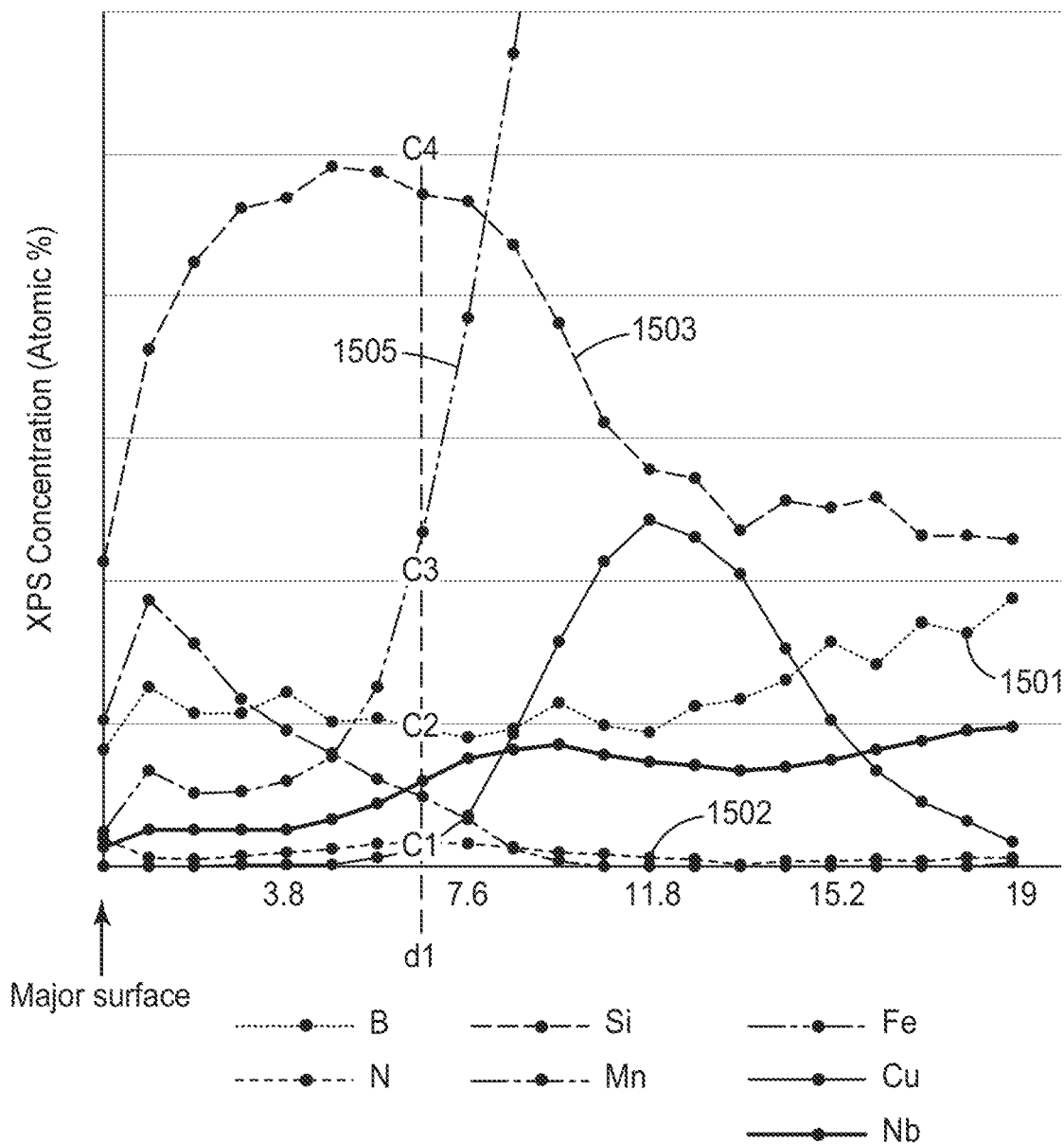
FIG. 15 shows graphs of the atomic % concentration of boron, nitrogen, silicon, and iron near a major surface of a magnetic film in accordance with some embodiments.

In some embodiments, a magnetic film comprises at least iron, silicon, boron, and nitrogen distributed between opposing first and second major surfaces of the magnetic film. FIG. 15 shows graphs of the atomic % concentration of boron 1501, nitrogen 1502, silicon 1503, and iron 1505 near a major surface of a magnetic film in accordance with some embodiments. The atomic % concentration of nitrogen as shown in graph 1502 has a first peak atomic concentration C1 at a first non-zero depth, d1, from the major surface. At first depth, d1, the boron in the magnetic film has an atomic concentration C2 as indicated by graph 1501, iron has an atomic concentration C3, as indicated by graph 1505, and the silicon has an atomic concentration C4, as indicated by graph 1503. In some embodiments of the magnetic film, C4>C3>C2>C1. The depth d1 may be within about 20 nm of the major surface, for example.

Figure 16:
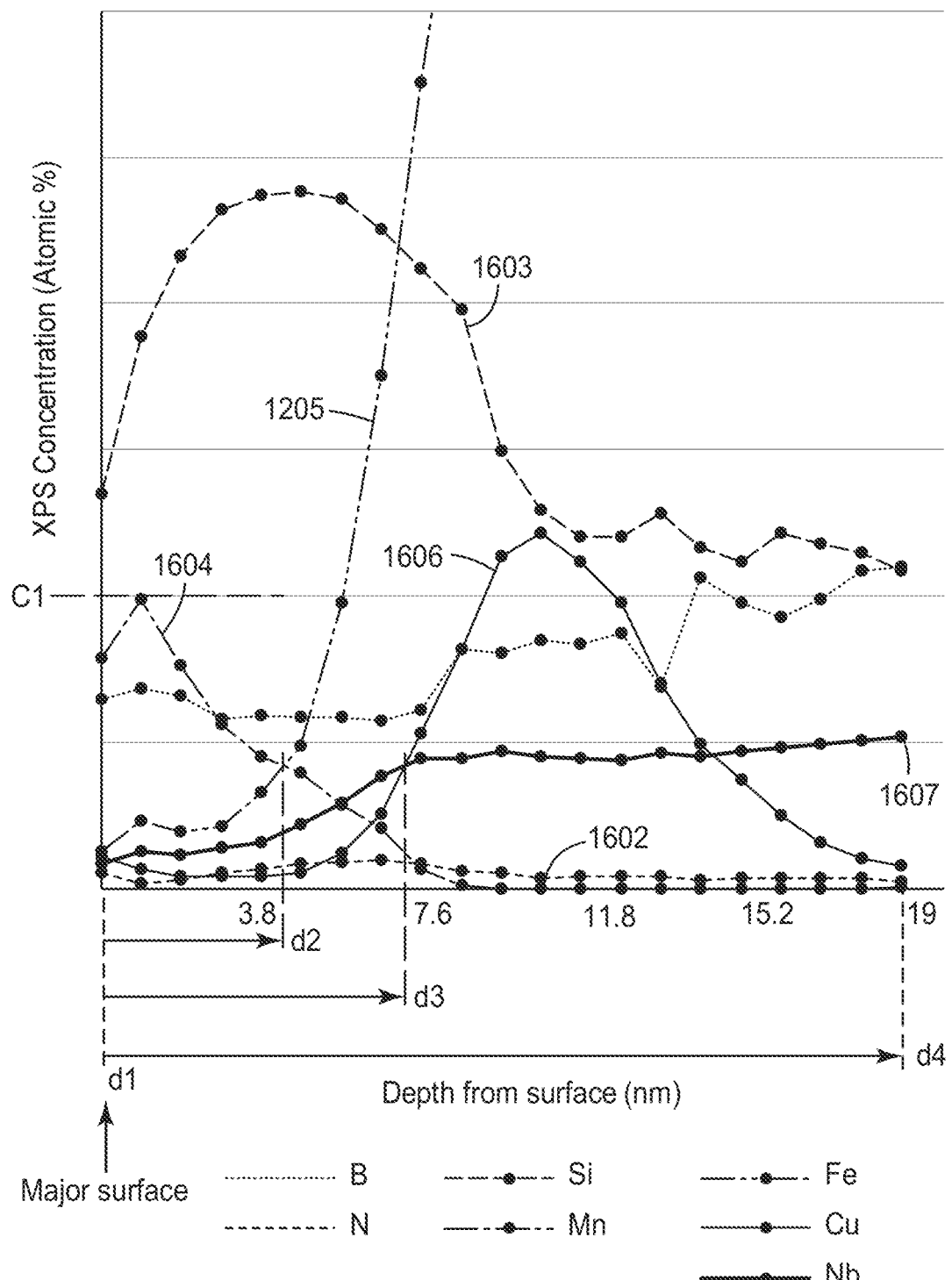
FIG. 16 shows graphs of the atomic % concentration of nitrogen, manganese, iron, copper, and niobium near a major surface of a magnetic film in accordance with some embodiments.

In some embodiments, a magnetic film comprises at least nitrogen, manganese, iron, copper, and niobium distributed between opposing first and second major surfaces of the magnetic film. FIG. 16 shows graphs of the atomic % concentration of nitrogen 1602, manganese 1604, iron, 1605, copper 1606, and niobium 1607 near a major surface of a magnetic film in accordance with some embodiments. The atomic concentration of manganese is greater than the atomic concentrations of nitrogen, iron, copper, and niobium in a first region extending between a first depth d1 from the major surface to a second depth, d2, from the first major surface. Across a second region of the magnetic film extending between a third depth, d3, from the major surface to a fourth depth, d4, from the major surface, the manganese has a smaller atomic concentration than each of the iron, copper, nitrogen and niobium, wherein d4>d3≥d2>d1.

Figure 17A:
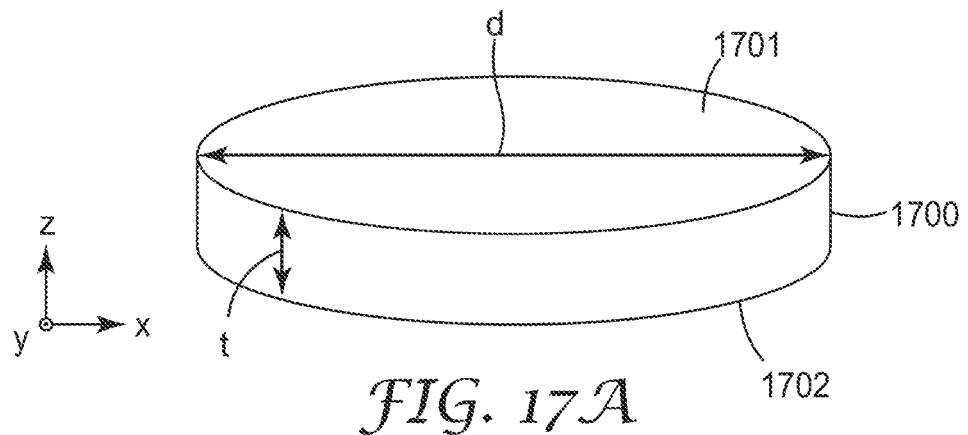
FIG. 17A is a diagram of an uncracked magnetic film in a form of a magnetic disc having a diameter, d, and a thickness, t.
Figure 17B:
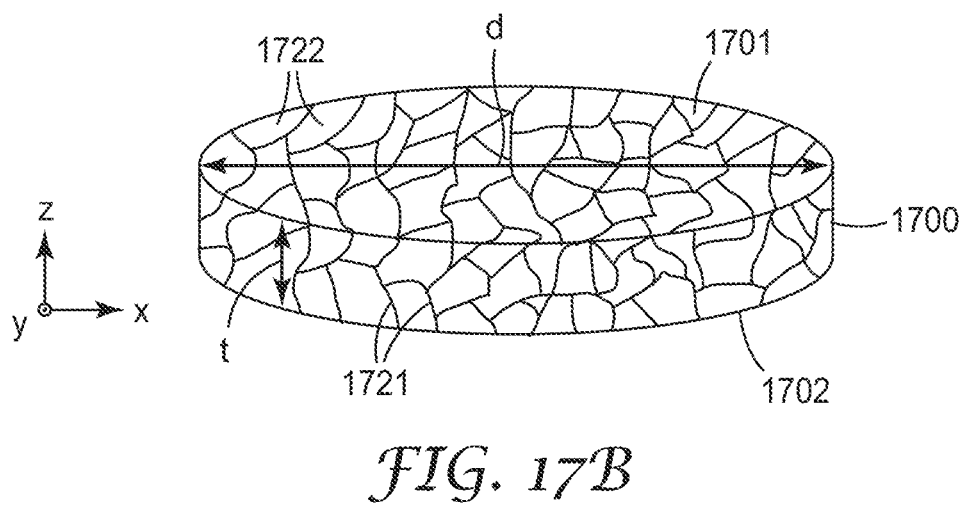
FIG. 17B is a diagram of a cracked magnetic film in a form of a magnetic disc having a diameter, d, and a thickness, t.
Figure 18A:
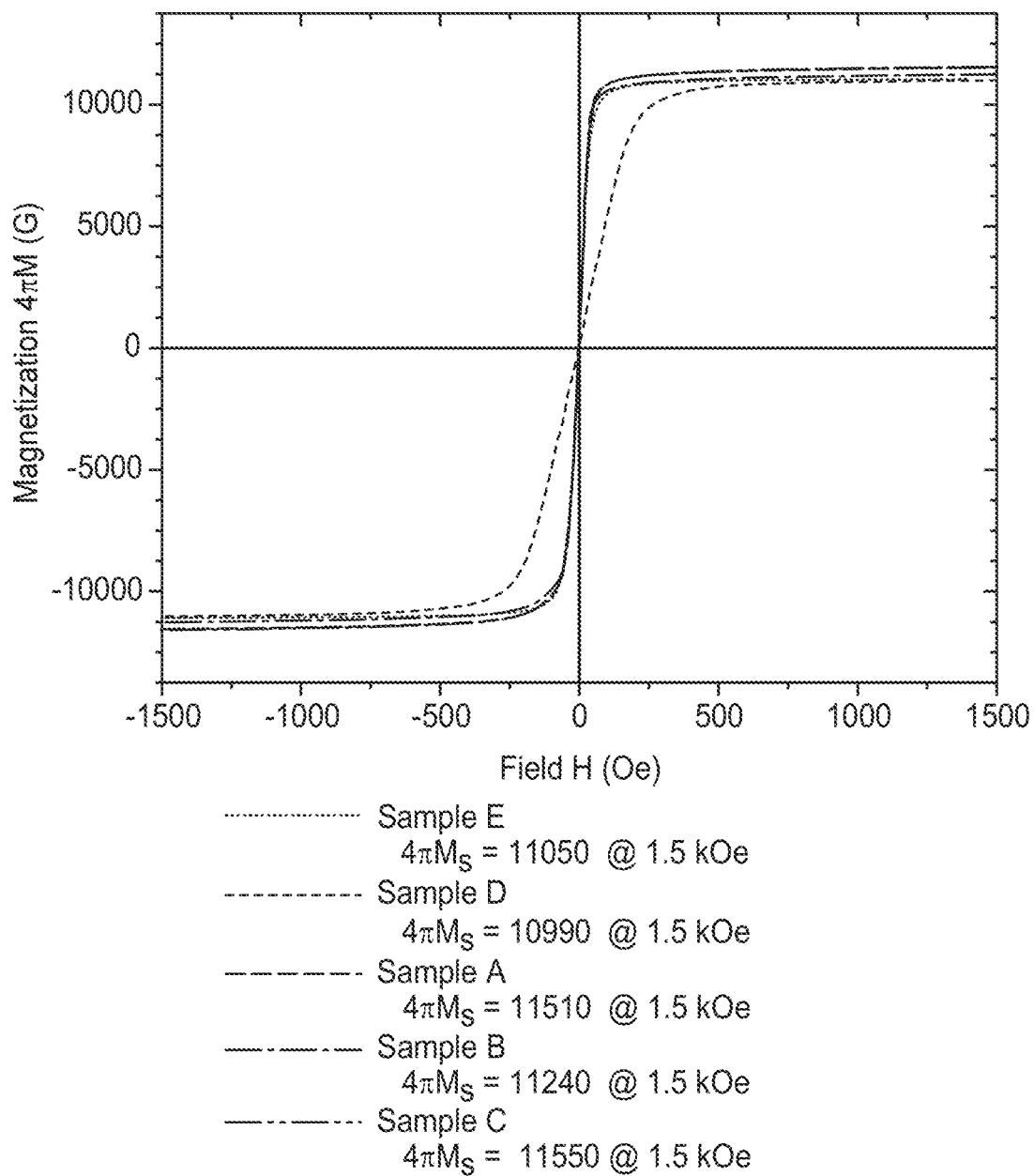
FIG. 18A shows MH curves of sample magnetic films obtained by the vibrating sample magnetometer (VSM) testing.

The concentrations of various materials near the major surfaces of the magnetic film as discussed herein caused by the heat processing of FIG. 4B produce changes in the magnetic properties of the film. A sample of a magnetic film fabricated according to the heat process 1 of FIG. 4A and a sample of a magnetic film fabricated according to the heat process 2 of FIG. 4B where analyzed using a vibrating sample magnetometer before and after fragmenting the magnetic films. FIGS. 17A and 17B respectively show uncracked and cracked high permeability magnetic disc samples analyzed using a vibrating sample magnetometer (VSM). FIG. 18A shows MH curves of sample magnetic films obtained by the VSM testing.

Sample A is an uncracked magnetic film fabricated using heat process 1;

Sample B is an uncracked magnetic film fabricated using heat process 2 with an $N_2$ environment for the second heat cycle;

Sample C is an uncracked magnetic film fabricated using heat process 2 with an $NH_3$ environment for the second heat cycle;

Sample D is a cracked magnetic film fabricated using heat process 1; and Sample E is a cracked magnetic film fabricated using heat process 2 with an $NH_3$ environment for the second heat cycle.

Figure 18B:
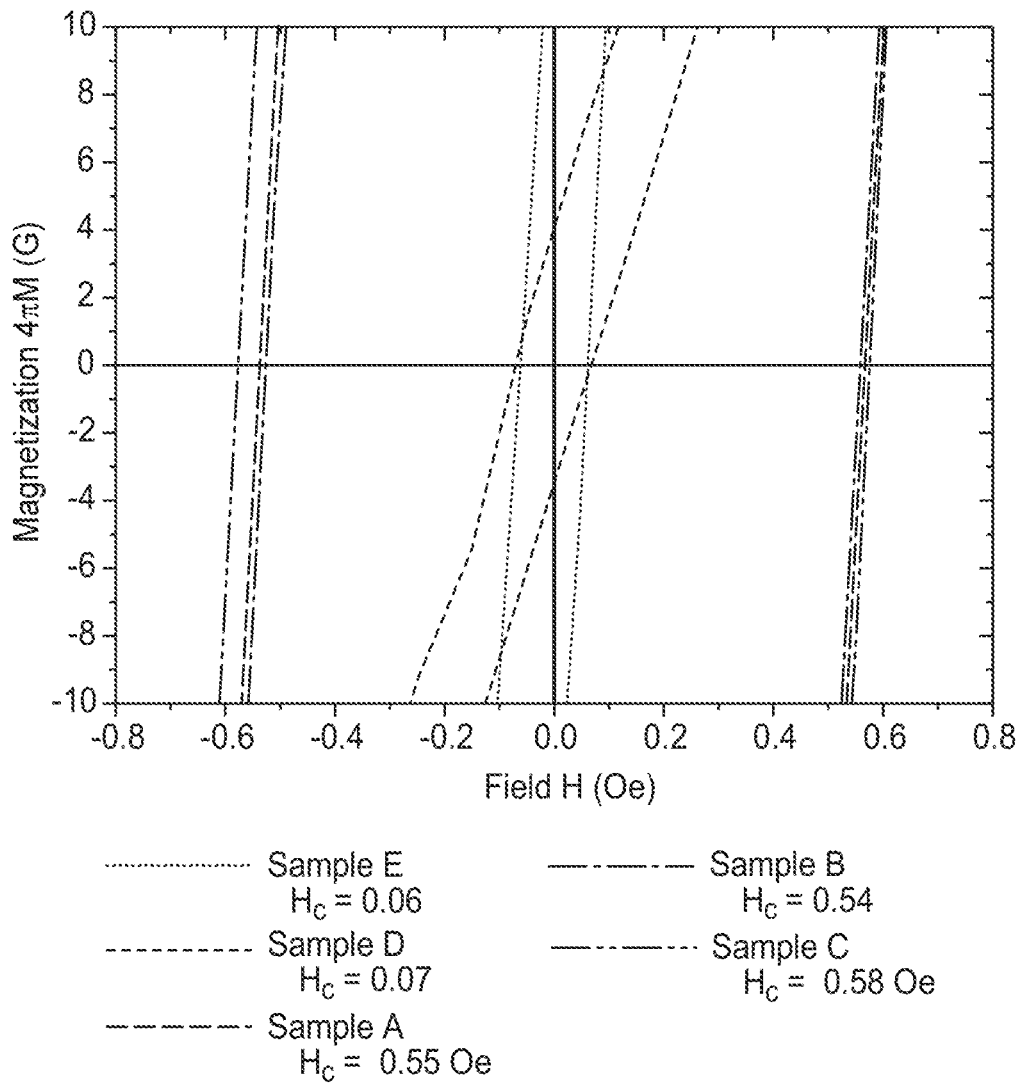
FIG. 18B shows a close up of the MH curve of FIG. 18A.

FIG. 18B shows a close up of the MH curve of FIG. 18A. Measurement data obtained from the VSM testing and calculated data based on the measured data obtained from the VSM testing is provided in Table 1.

TABLE 1

|  | Heat process 1 Magnetic film Cracked Sample D | Heat process 2 ($2^{nd}$ sub-stage NH$_3$) Magnetic film Cracked Sample E | Heat process 1 Magnetic film Uncracked Sample A | Heat process 2 ($2^{nd}$ sub-stage NH$_3$) Magnetic film Uncracked Sample C | Heat process 2 ($2^{nd}$ sub stage N$_2$) Magnetic film Uncracked Sample B |
|---|---|---|---|---|---|
| Hc VSM (Oe) | 0.07 | 0.06 | 0.55 | 0.58 | 0.54 |
| $\mu_{VSM}$(±5%) | 50.9 | 234 | 225 | 225 | 225 |
| $\mu'_{1\ kHz}$ | 450 | 1600 | 3000 | 50000 | 23000 |
| $\mu'_{1\ MHz}$ | 420 | 1200 | 1150 | 1350 | 1300 |
| $\mu''_{1\ MHz}$ | 54 | 500 | 950 | 3500 | 3200 |
| $4\pi M_s$ (G) | 10990 | 11050 | 11400 | 11730 | 11360 |
| $\mu'$(1 kHz)/$\mu'$(1 MHz) | 1.142857 | 1.333333 | 2.60869565 | 37.037037 | 17.69230769 |
| $\mu'$(1 MHz)/$\mu''$(1 MHz) | 2.625 | 2.4 | 1.21052632 | 0.3857143 | 0.40625 |
| $\mu$/Hc (VSM) | 727.8335 | 3896.605 |  |  |  |
| M/$\mu_{VSM}$ | 215.7087 | 47.26337 | 50.6666667 | 52.1985 | 50.552 |
| M/$\mu''$ @1 MHz | 27.475 | 22.1 | 12 | 3.3514286 | 3.55 |
| M/$\mu'$ @1 MHz | 10.46667 | 9.208333 | 9.91304348 | 8.6888889 | 8.738461538 |
| M/$\mu'$ @1 kHz | 0.10919 | 0.144796 | 0.26315789 | 4.2625746 | 2.024647887 |
| fg | 2.32 | 1.74 | 0.93 | 0.12 | 0.06 |

As indicated in FIG. 17A, according to some embodiments, a magnetic film 1700 comprises at least one or more of iron, silicon, and manganese distributed between opposing first 1701 and second 1702 major surfaces of the magnetic film 1700. The magnetic film 1700 shown in FIG. 17A is in a form of a magnetic disc having a diameter, d, of about 6 mm and a thickness, t, of about 20 microns. Cracking the magnetic disc 1700 creates a plurality of interconnected cracks 1721 defining a plurality of electrically conductive magnetic islands 1722 as depicted in FIG. 17B. Cracking the film changes the measured DC magnetic permeability of the magnetic disc 1700 for a DC magnetic field applied substantially perpendicular to a thickness direction (thickness direction is the z direction in FIGS. 17A and 17B) of the magnetic disc by less than about 10%.

The measured DC magnetic permeability of the magnetic disc for the DC magnetic field applied substantially perpendicular to the thickness direction of the magnetic disc may greater than about 100 and less than about 500, may be greater than about 150 and less than about 400, or may be greater than about 200 and less than about 300, for example.

In some embodiments, the magnetic film 1700 can have a minimum lateral dimension d and a maximum thickness t, wherein the ratio d/t is greater than or equal to about 100. Cracking the magnetic film 1700 to form a plurality of electrically conductive magnetic islands 1722 changes the measured DC magnetic permeability of the magnetic film 1700 for a DC magnetic field applied substantially along the lateral direction (x direction in FIGS. 17A and 17B) of the magnetic film by less than about 10%.

In some embodiments, a magnetic film comprising iron, silicon, and manganese distributed between first and second major surfaces of the magnetic film has a real part, µ', of the complex magnetic permeability at 1 kHz and a saturation magnetization M, wherein M/µ'≥2.5.

According to some implementations, a magnetic film 1700 comprises a plurality of interconnected channels 1721 forming a multi-dimensional array of electrically conductive magnetic islands 1722. The channels 1721 at least partially suppress eddy currents induced within the magnetic film 1700 by a magnetic field. Each magnetic island 1722 comprises copper having a peak atomic concentration inside the island 1722. The film has real part, µ', of the measured DC magnetic permeability and a coercivity $H_C$ for a DC magnetic field applied substantially along a lateral direction of the magnetic film. The ratio of µ' to Hc (µ'/Hc) can be greater than about 1000, greater than about 2000, or even greater than about 3000.

Figure 19:
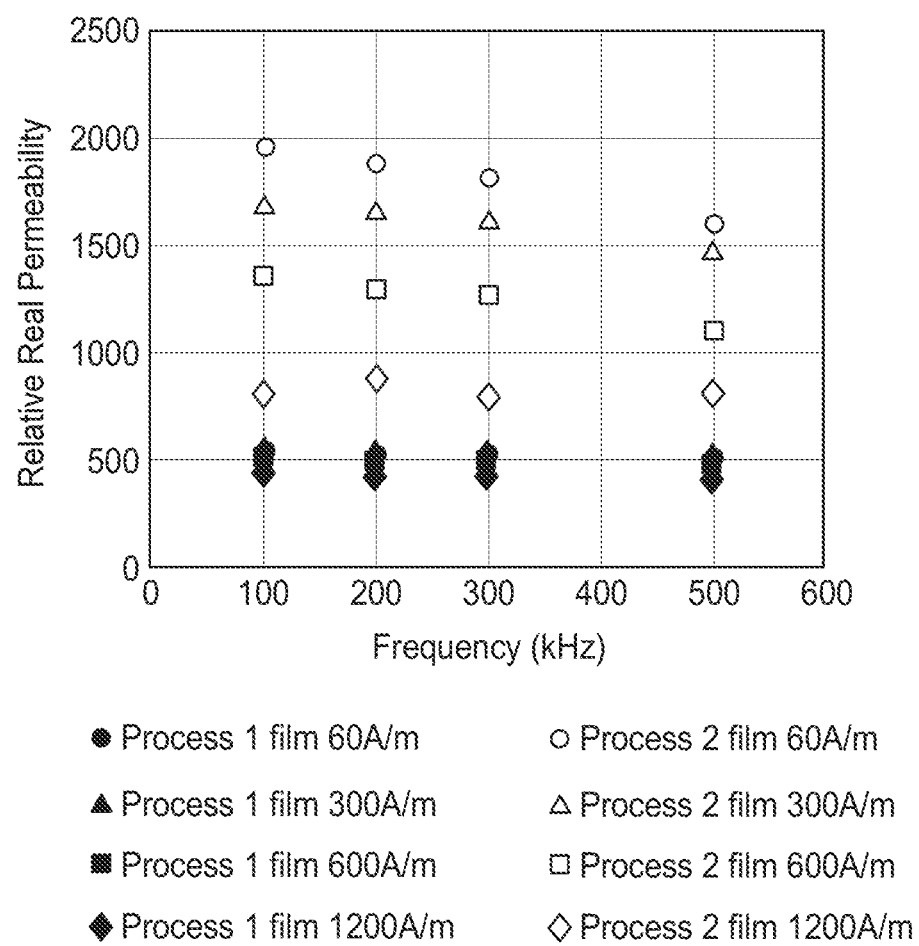
FIG. 19 shows the relative real permeability as a function of frequency of the VSM test for various values of applied magnetic field H for sample magnetic films.

FIG. 19 shows the relative real permeability as a function of frequency of the VSM test for various values of applied magnetic field H for sample magnetic films. In this test, the changes in relative real permeability of the magnetic film fabricated using heat process 2 change substantially for different applied magnetic field. In comparison, the changes in relative real permeability of the normal film are modest. In a magnetic film comprising a plurality of electrically conductive magnetic islands 1 separated by a plurality of interconnected channels, the channels at least partially suppress eddy current induced within the magnetic film by a magnetic field. The magnetic film has a real magnetic permeability µ' measured at an applied magnetic field H and a frequency f, For fin a range from about 100 kHz to about 500 kHz and H in a range from about 60 A/m to about 1200 A/m, µ' changes by more than about 20%, more that about 50%, more than about 80%, or event more than about 100% in some embodiments.

Figure 20:
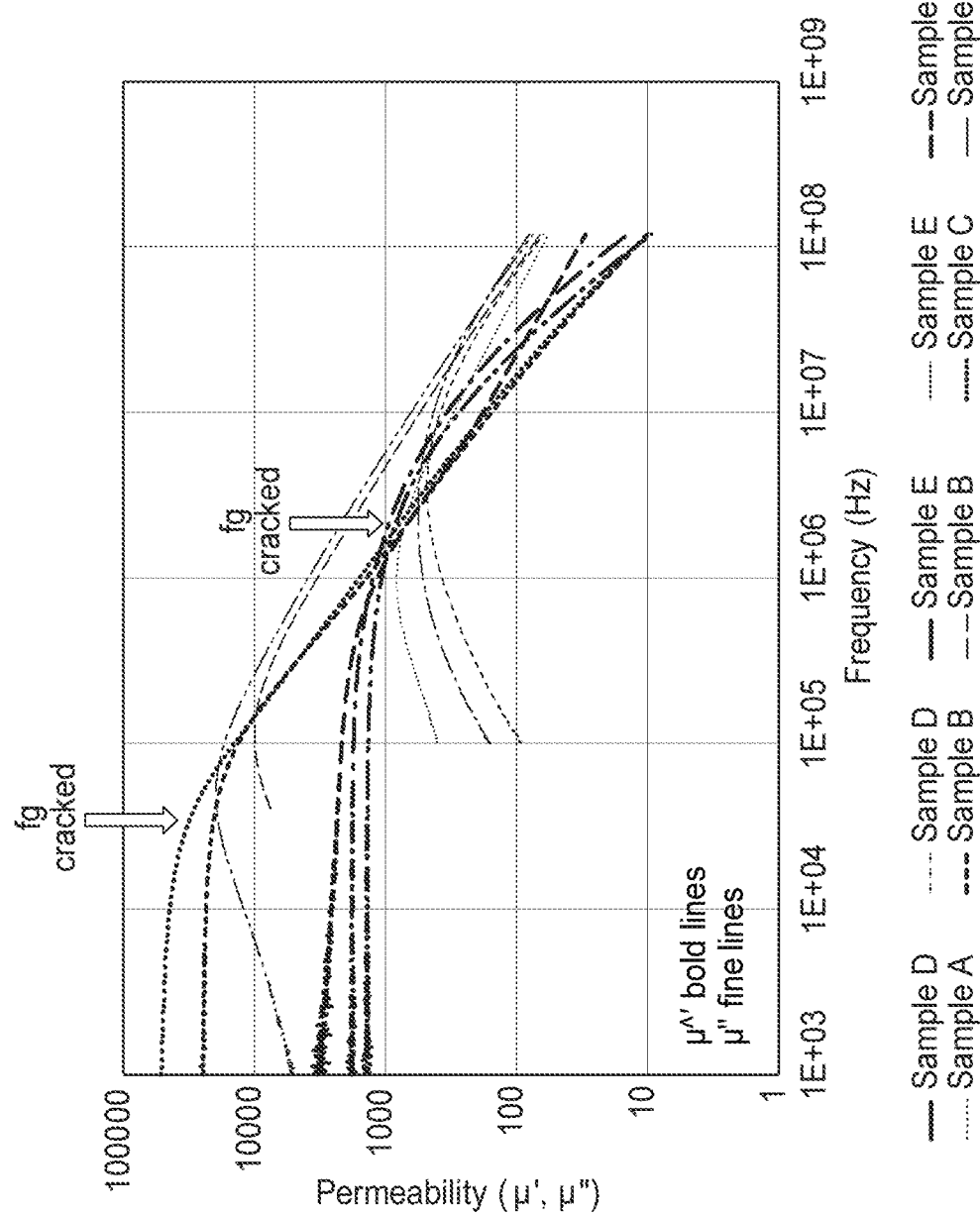
FIG. 20 is a graph showing the change in the relative real ($\mu'$) and imaginary ($\mu''$) components of the complex magnetic permeability as a function of frequency for sample magnetic films.

FIG. 20 is a graph showing the change in the relative real (µ') and imaginary (µ") components of the complex magnetic permeability as a function of frequency for sample magnetic films. The peak value of µ" as a function of frequency is the ferromagnetic resonance frequency of the material. The ferromagnetic resonance frequency of a material can be calculated:

$$f_g = \frac{4}{\pi} \frac{\rho_{el}}{\mu_0 \mu_{dc} d^2}$$

where ρel is the resistivity of the magnetic film, $\mu_0$ is the permeability of free space, $\mu_{dc}$ is the permeability at DC, and d is the thickness of the magnetic film.

Figure 21:
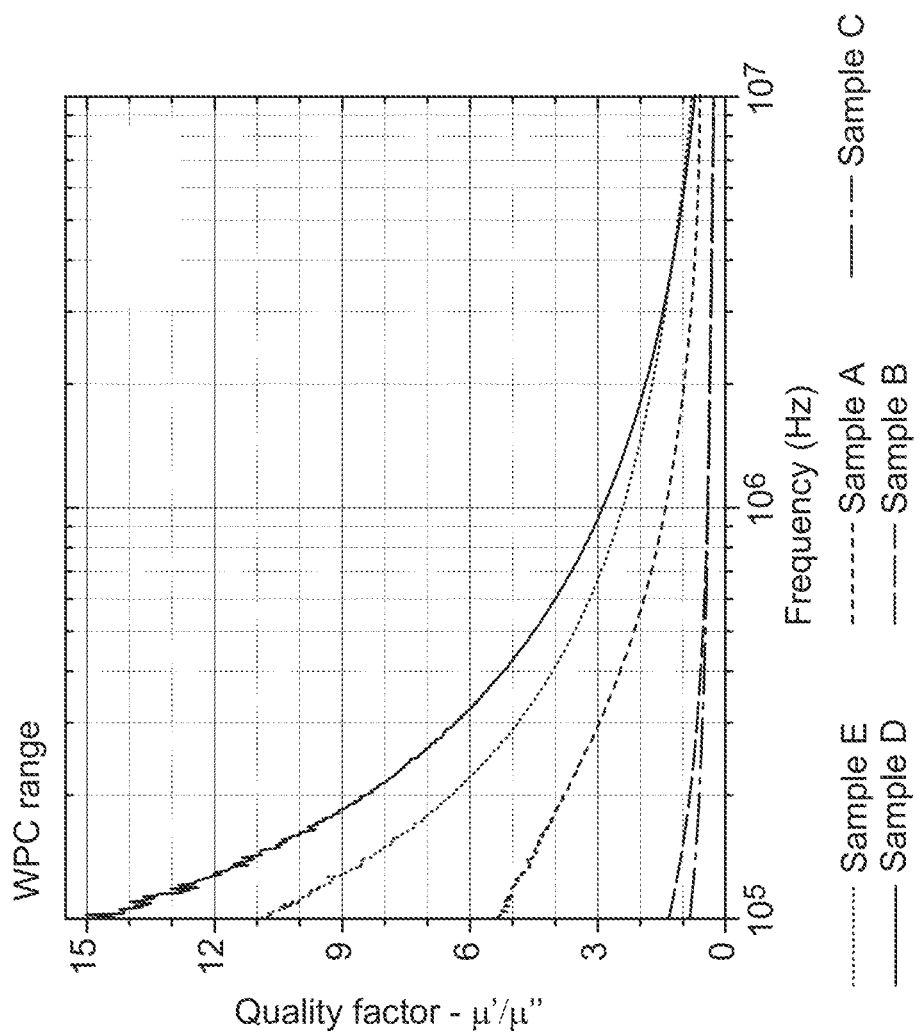
FIG. 21 shows the ratio $\mu'/\mu''$ as a function of frequency for sample magnetic films.

According to some embodiments, a cracked magnetic film includes at least iron, silicon and manganese distributed between opposing first and second major surfaces of the cracks defining a plurality of electrically conductive islands as shown in FIG. 17B. When the cracked magnetic film 1700 is in a form of a disc having a diameter of about 6 mm and a thickness of about 20 microns, the cracked magnetic disc 1700 has a ferromagnetic resonance frequency, $f_{gc}$, that is at least five times greater than a ferromagnetic resonance frequency, $f_{gun}$, of an identical magnetic film that is not cracked FIG. 21 compares the ratio μ'/μ" as a function of frequency for Samples A through E as discussed above. As indicated by the graph for Sample E, according to some embodiments, a magnetic film comprises a plurality of interconnected channels forming a two-dimensional array of electrically conductive magnetic islands wherein the channels at least partially suppressing eddy currents induced within the magnetic film by a magnetic field. Each magnetic island comprises copper having a peak atomic concentration inside the island. The magnetic film has a complex magnetic permeability comprising a real part μ' and an imaginary part μ" and quality factor μ'/μ" According to some embodiments, μ'/μ" of magnetic film is between 6 and 14 (6≤μ'/μ"≤14) at a frequency of $10^5$ Hz, and μ'/μ"≤6 at a frequency of about $3×10^5$ Hz.

Figure 22:
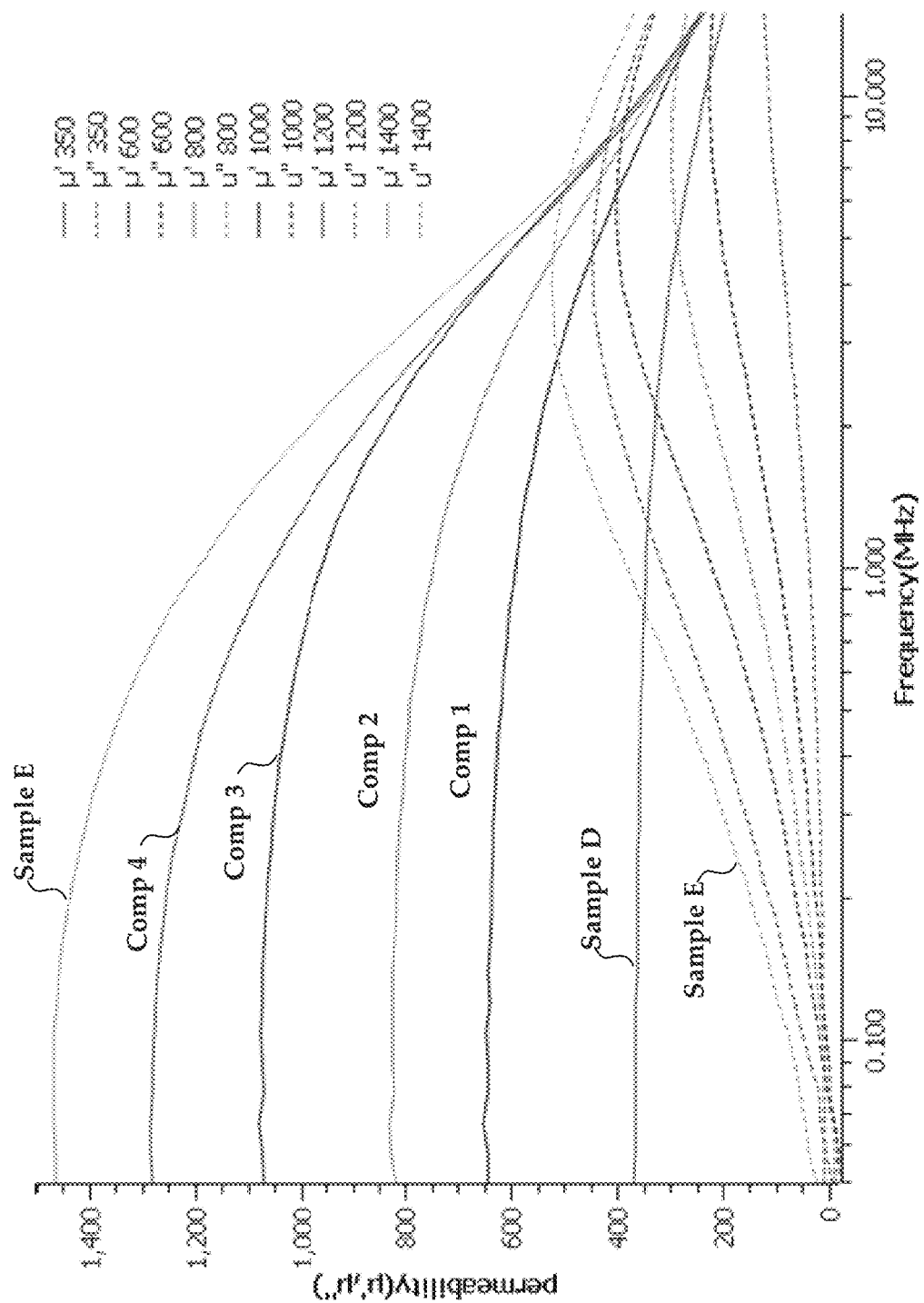
FIG. 22 shows overlaid graphs of $\mu'$ and $\mu''$ as a function of frequency for several magnetic films.

FIG. 22 shows overlaid graphs of μ' and μ" as a function of frequency for the Sample E and F films along with comparative films 1 through 4. Solid lines represent μ' as a function of frequency for each film, dashed lines represent μ" as a function of frequency for each film. It will be appreciated that the Sample E film exhibits higher real and imaginary permeability than the Sample D film. The Sample F film can have a real component of permeability greater than 400, greater than 500, greater than 750, or even greater than 1000 at 1 MHz. The Sample F film can have a complex component of permeability greater than 100, greater than 200 or even greater than 300 at 1 MHz.

Figure 23:
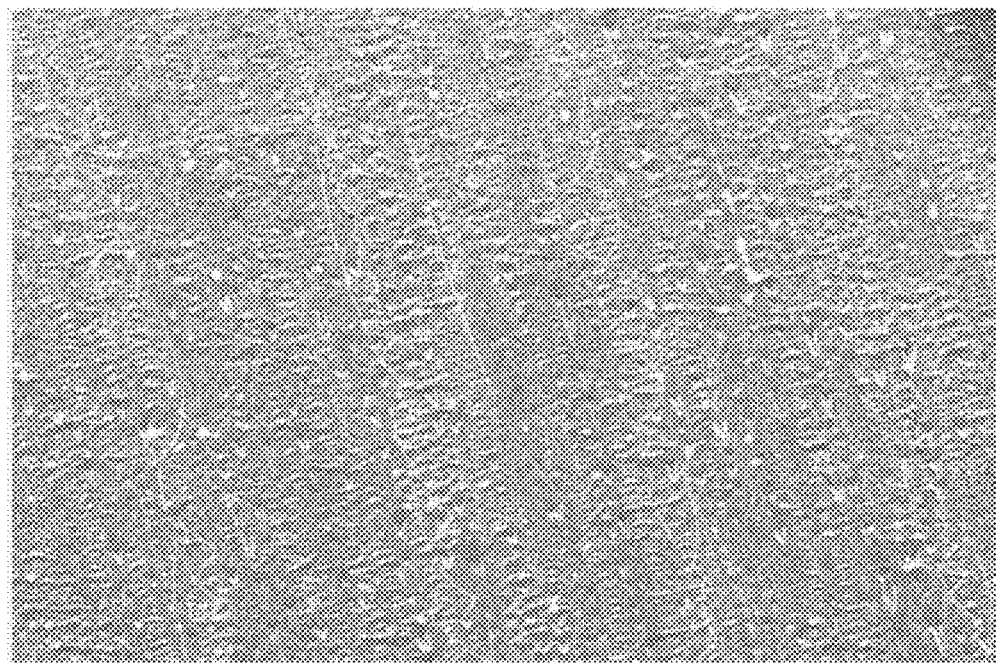
FIGS. 23 and 24 show scanning electron microscope (SEM) images of a magnetic film at magnifications of 50× and 15000×, respectively.
Figure 24:
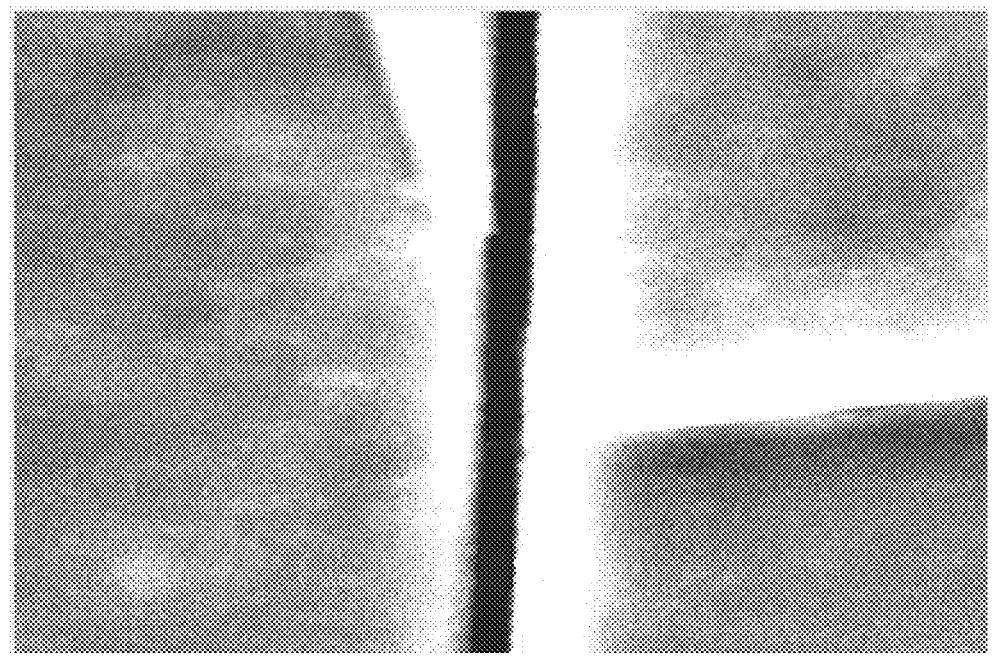

Films fabricated using heat process 2 shown in FIG. 4B exhibit different cracking behavior when compared to other types of magnetic films fabricated, e.g., fabricated using heat process 1 shown in FIG. 4A. FIGS. 23 and 24 show scanning electron microscope (SEM) images of a magnetic film fabricated using the heat process 2 shown in FIG. 4B with an NH3 environment during the second sub stage at magnifications of 50× and 15000×, respectively. According to some embodiments, an electromagnetic interference suppression multilayer stack comprises one or more stacked magnetic films. Each magnetic film comprises a plurality of interconnected gaps forming a two-dimensional array of electrically conductive magnetic islands, the gaps extending substantially vertically between opposing first and second major surfaces of the magnetic film and at least partially suppressing eddy currents induced within the magnetic film by a magnetic field. In some embodiments, a maximum width of the gaps in the plurality of interconnected gaps is less than about 500 nm, or less than about 450 nm, or less than about 400 nm, or even less than about 350 nm.

In some embodiments, the multilayer stack includes at least two stacked magnetic films. Alternatively, the interference suppression multilayer stack may include one or more stacked repeat units, each repeat unit comprising a magnetic film of the one or more stacked magnetic films and an adhesive layer.

Figure 25:
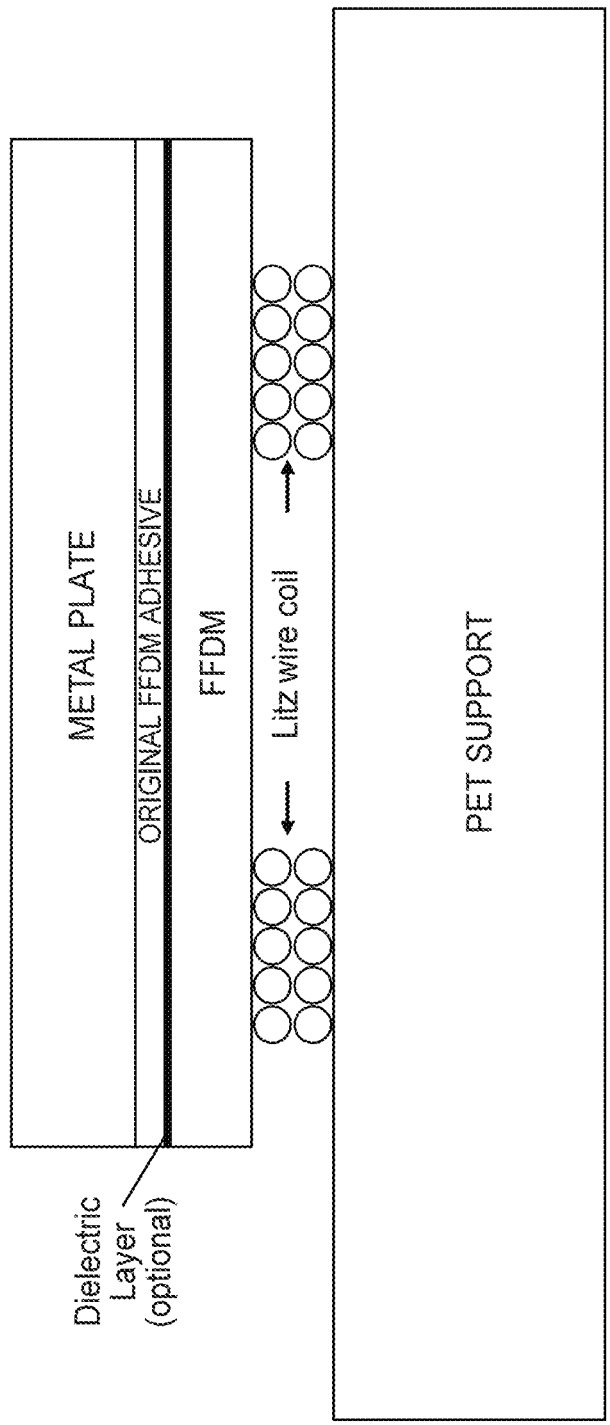
FIG. 25 is a block diagram of an assembly incorporating magnetic films as disclosed herein.

The Q value of an assembly incorporating the magnetic films as disclosed herein was tested as shown in the block diagram of FIG. 25. The metal plate can be made of aluminum and may have a thickness of between about 0.2 mm to about 1 mm, e.g., about 0.4 mm in some embodiments. The dimensions of the magnetic film and metal plate can be about 50 mm×about 50 mm. The magnetic film can be glued to the metal plate by an adhesive. In some embodiments, an optional dielectric layer is disposed on the magnetic film as shown in FIG. 25. The magnetic film and metal plate structure may be centered with the coil with less than about 1 mm precision. The coil used was WE 760308111 available from available from WURTH Electronics with the original ferrite removed. According to some configurations, the coil has two wires (Litz wires) in parallel. The total diameter of the multi-strand wires can be about 1 mm with a strand diameter of about 80 μm in some embodiments. For example, in some configurations, the inner diameter of the coil is about 20 mm and the outer diameter of the coil is about 43 mm, although other dimensions are possible. The number of turns of the coil may be 5. According so some implementations, the DC resistance of the coil is 0.0218 Ohms LS-RS measurements were performed with Impedance analyzer E4990A and 16047E test fixture. DC resistance measurements were made with a Keithley 2400 in 4 wire sense mode.

Figure 26:
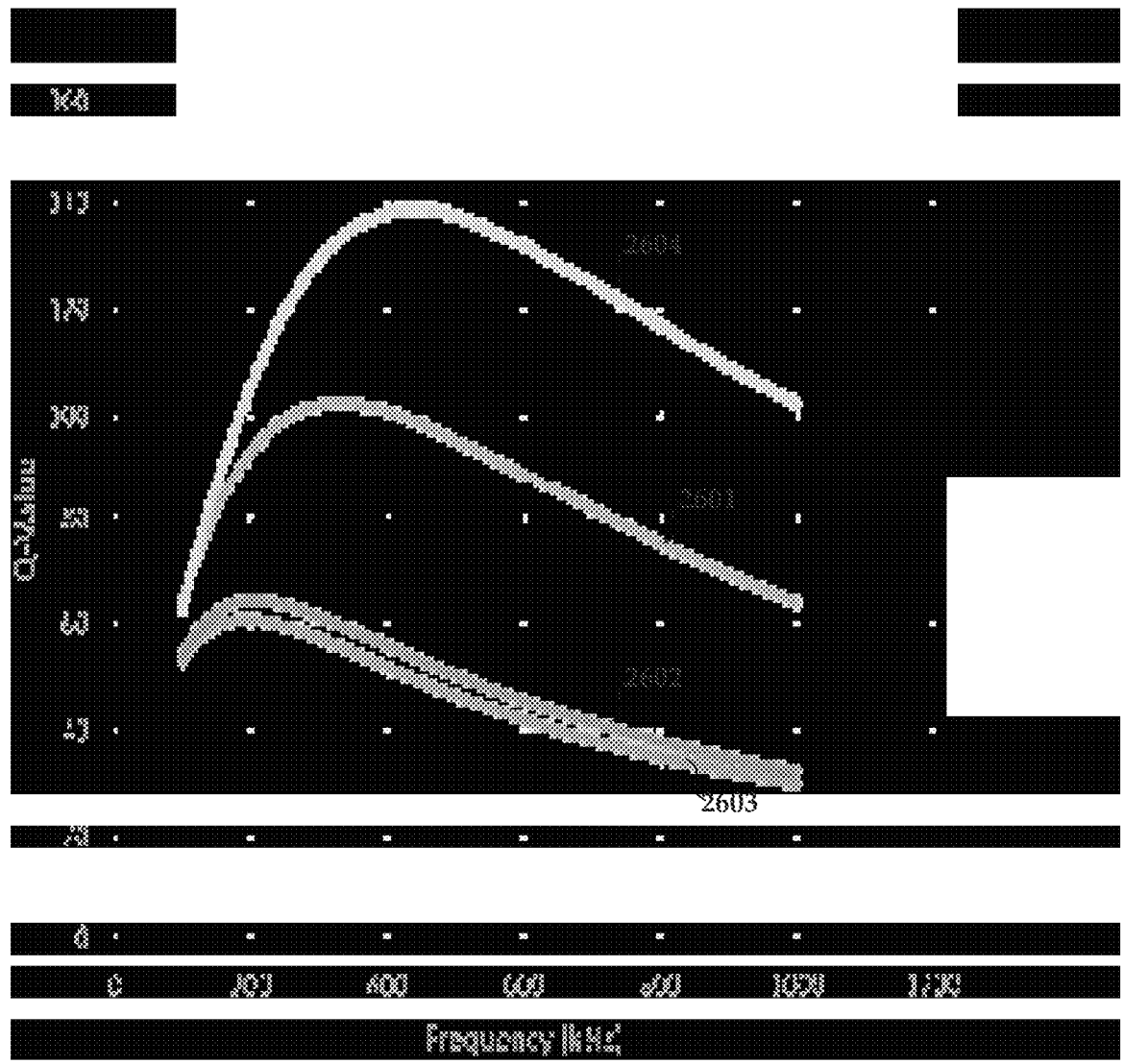
FIG. 26 shows graphs of the Q-value as a function of frequency for several magnetic films obtained from measurements made using the test set up of FIG. 25.

FIG. 26 shows graphs of the Q-value as a function of frequency for several magnetic films obtained from measurements made using the test set up of FIG. 25. Quality factor in FIG. 26 is dependent on the geometry of the configuration and equal to 2πfL/R, where L is the inductance of the coil with the plates next to it, and R is the measured Resistance of the coil with the plates next to it. R is chosen so that the total power dissipated=$I^2R$, though some of the power loss can be due to μ" and not just the resistance of the coil.

Sample F indicated in FIG. 26 is a Ferrite, electrically non-conductive film which includes Ni and Zn and is included for comparison. The Q-value as a function of frequency of Sample F is shown in Graph 2601. Graph 2603 shows the Q-value as a function of frequency for a five layer construction of Sample E. Each magnetic film in the five layer construction was fabricated using heat process 2 of FIG. 4B with NH3 as the environment of the second sub stage. Graph 2602 shows the Q-value as a function of frequency for a five layer construction of Sample D. Each magnetic film in the five layer construction was fabricated using heat process 1 of FIG. 4A. For comparison, graph 2604 shows the Q value for an empty coil.

According to some embodiments, a magnetic film is heat treated at a temperature exceeding 530 degrees C. under an ammonia (NH3) or a nitrogen (N2) atmosphere (as in FIG. 4B) and is intentionally cracked to form a plurality of interconnected cracks covering substantially the entire magnetic film. The cracks define a plurality of electrically conductive magnetic islands. A magnetic stack is formed by stacking five repeat units, each repeat unit comprising the magnetic film having an average thickness in a range from about 15 microns to about 25 microns and an adhesive layer having a thickness in a range from about 2 microns to about 10 microns. An assembly is formed by disposing the magnetic stack between a metal plate and a coil. The coil has an outer diameter in a range from about 40 mm to about 45 mm, an inner diameter in a range from about 15 mm to about 25 mm, and is formed by wrapping two parallel copper wires a preselected number of turns. Each copper wire has a wire diameter in a range from about 0.5 mm to about 1.5 mm. The assembly has a Q-value less than about 90 at a frequency of about 400 kHz and a Q-value less than about 60 at a frequency of about 800 kHz for a current in a range from about 8 milli-Amps to about 12 milli-Amps passing through the coil.

For example, the magnetic film in each repeat unit can have an average thickness in a range from about 16 microns to about 24 microns, or from about 17 microns to about 23 microns, for about 18 microns to about 22 microns, or about 18 microns to about 21 microns, or from about 18 microns to about 20 microns.

The adhesive layer in each repeat unit can have a thickness in a range from about 2 microns to about 8 microns, or from about 3 microns to about 7 microns, or from about 4 microns to about 6 microns. In some embodiments, the adhesive layer in each repeat unit has a thickness of about 5 microns.

The metal plate can be an aluminum plate having a thickness in a range from about 0.2 mm to about 1 mm, or a thickness of about 0.4 mm.

The coil may have an outer diameter in a range from about 41 mm to about 44 mm, or from about 42 mm to about 44 mm. In some implementations, the coil has an outer diameter of about 43 mm.

The coil may have an inner diameter in a range from about 16 mm to about 24 mm, or in a range from about 17 mm to about 23 mm or in a range from about 18 mm to about 22 mm, or in a range from about 19 mm to about 21 mm. For example, the inner diameter of the coil may be about 20 mm.

The pre-selected number of turns can be between 2 and 10, or between 3 and 8, or between 4 and 7, or between 4 and 6. In some embodiments, the number of preselected number of turns is 5.

The copper wire diameter may be in a range from about 0.6 mm to about 1.4 mm, or between about 0.7 mm to about 1.3 mm, or between about 0.8 mm to about 1.2 mm, or between about 0.9 mm to about 1.1 mm. For example, the copper wire diameter can be about 1 mm. The copper wire may be an insulated wire having a dimeter of about 1 mm and a core copper conductor having a dimeter of about 80 microns in some embodiments.

The Q-value may be less than about 90 at a frequency of about 400 kHz for a current in a range from about 9 milli-Amps to about 11 milli-Amps passing through the coil. The Q-value may be less than about 60 at a frequency of about 800 kHz for a current in a range from about 9 milli-Amps to about 11 milli-Amps passing through the coil.

According to some embodiments, the Q-value can be less than about 90 at a frequency of about 400 kHz and/or may be less than about 60 at a frequency of about 800 kHz for a current of about 10 milli-Amps passing through the coil.

According to some embodiments, the Q-value may be less than about 80 at a frequency of about 400 kHz and/or may be less than about 55 at a frequency of about 800 kHz for a current of about 10 milli-Amps passing through the coil.

According to some embodiments, the Q-value may be less than about 70 at a frequency of about 400 kHz and/or may be less than about 50 at a frequency of about 800 kHz for a current of about 10 milli-Amps passing through the coil.

The Q-value can be less than about 65 at a frequency of about 400 kHz and/or the Q-value can be less than about 45 at a frequency of about 800 kHz for a current of about 10 milli-Amps passing through the coil.

The coil may have a thickness in a range from about 2 mm to about 3 mm, or between about 2.2 mm to about 2.8 mm, or between about 2.4 mm to about 2.6 mm.

The magnetic stack can further include a dielectric cover layer disposed on the five repeat units. The dielectric cover can have a thickness in a range from about 2 to 10 microns, or in a range from about 3 to 9 microns, or in a range from about 2 to 10 microns.

Figure 27:
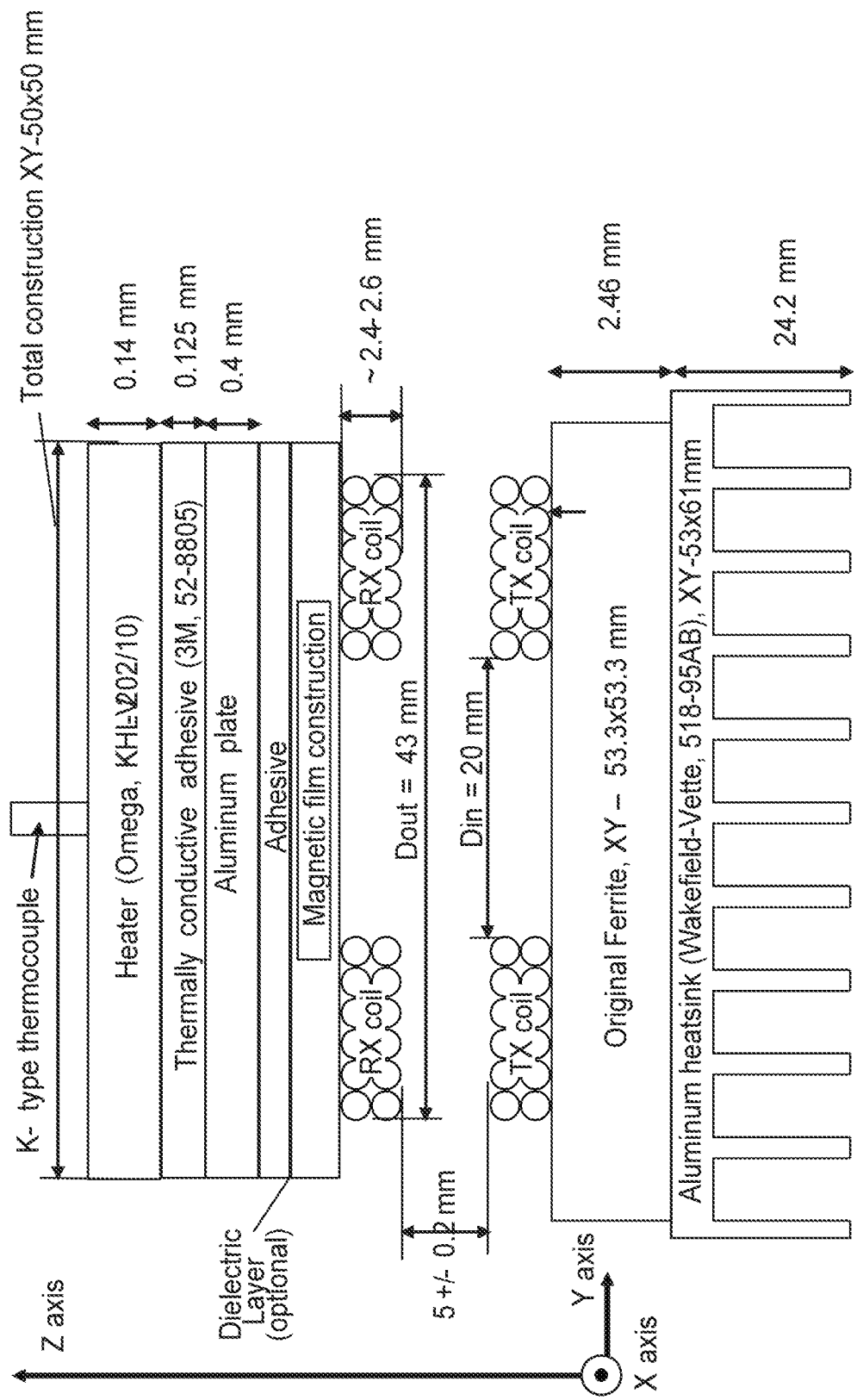
FIG. 27 shows a block diagram of a system used for analyzing magnetic films.

System level performance of the magnetic films was obtained using a test set up as illustrated in the block diagram of FIG. 27 which simulates a wireless charging application. On the transmit side, a transmit coil (Tx) is centered on a ferrite layer which is centered on an aluminum heat sink as shown. The transmit coil, ferrite, and heatsink are movable in the XY plane and locked in the Z direction.

The receive side includes the magnetic film construction under test, adhesive layer on the magnetic film construction which adhere the magnetic film to an aluminum plate. The aluminum plate is attached to a heater using a thermally conductive adhesive. A thermocouple is in tight thermal contact with the heater. The magnetic film (and other layers of the receive side) are centered with the receive coil (Rx) with precision of less than or equal to 1 mm. The receive side (receive coil, magnetic film, adhesive layer on film, aluminum plate, thermally conductive adhesive, and heater) is locked in the XY plane and moveable in the Z direction. The total construction on the receive side may have cross sectional dimensions in the XY plane of about 50 mm×50 mm for example. Example dimensions of the test set up are as shown in FIG. 27, although other values could be used.

Figure 28:
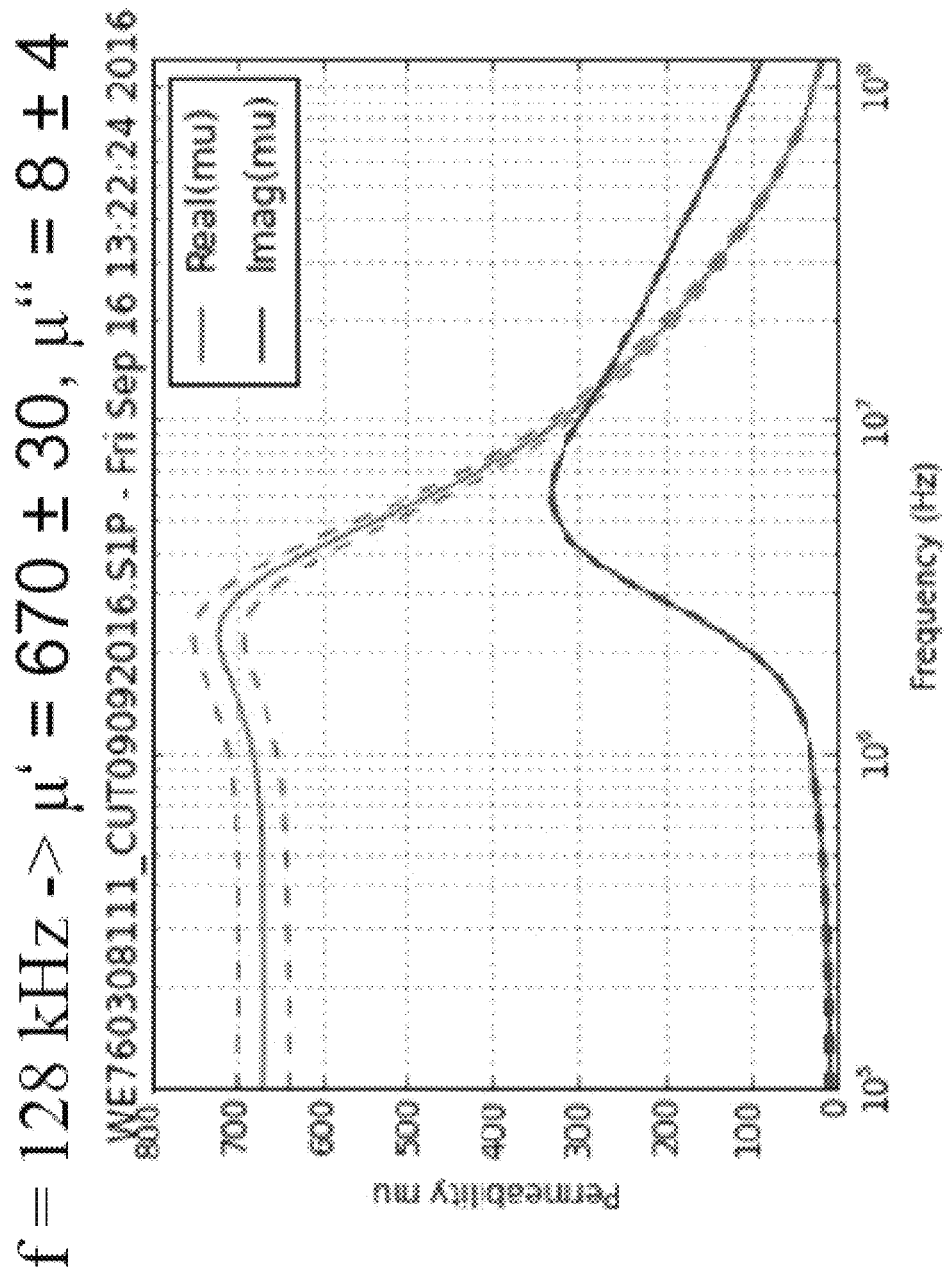
FIG. 28 shows the permeability of the original ferrite on the Tx coils for the system shown in FIG. 27.

The Tx and Rx coils are WE 760308111 coils available from WURTH Electronics, Inc. The coils are wound of LITZ wire, had two wires in parallel. The number of turns was may be N=5, for example. Single wire dimensions were may be about 1 mm without insulation, about 1.2 mm with insulation. The wires were multi-stranded, with strand diameters of about 80 µm. DC Resistance of the coil was about 0.0218 Ohms. As purchased, the coil included a ferrite layer which was removed for the Rx coil. The Tx coil with the original ferrite was mounted on the heat sink as shown in FIG. 27. The permeability of the original ferrite on the Tx coils is shown in FIG. 28. The impedance of the coil was measured with the coil lead included using the set up shown in FIG. 29 with E4980A LCR meter and impedance evaluation test fixture 16047E: L=6.0767 µH, Rac=54.93 mOhm @ 128 kHz.

The total wiring impedance of the transmit coil: TX coil–L~217 nH, R~13 mOhm @ 128 kHz; the RX load–L~180 nH, R~12 mOhm @ 128 kHz; the Receiver load (resistor) impedance: R=10.23 Ohm, X=<60 mOhm @ 128 kHz. The total impedance, including wires and the load resistor "seen" by the receiver coil is R=10.24 Ohm, X=83.3 mOhm @ 128 kHz).

Figure 29:
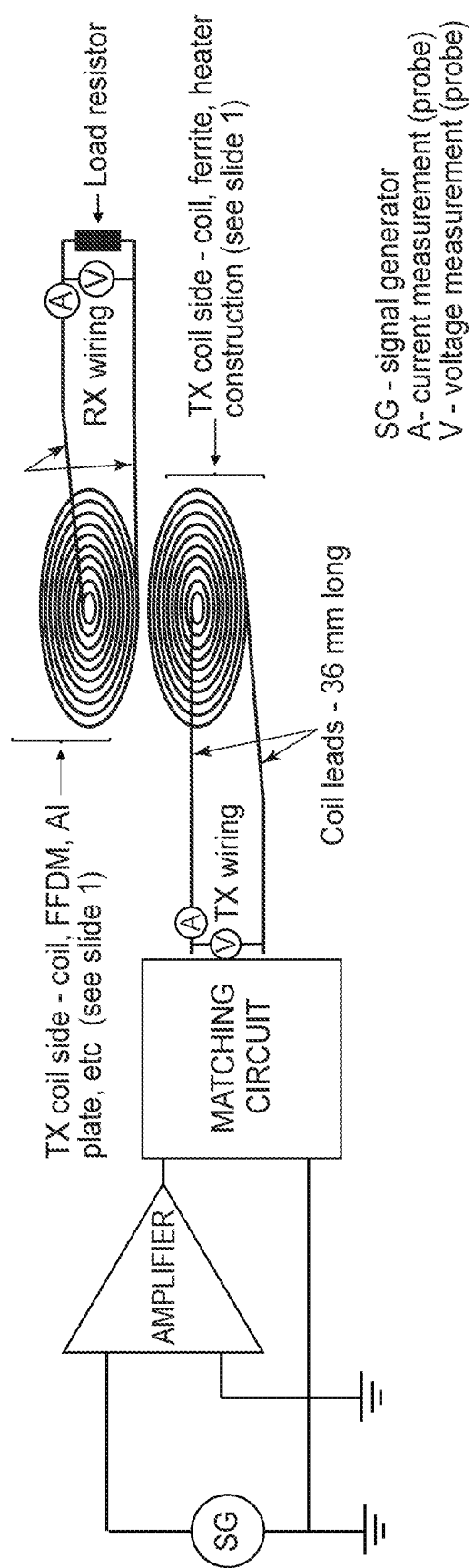
FIG. 29 is a graph of the measured impedance of the coil used in the test set up of FIG. 27.

Measured quantities using the test set up of FIGS. 27-29 included:
Current amplitude I (main harmonic)
Voltage amplitude V (main harmonic)
Voltage-Current phase $\varphi$
Power=0.5*I*V*cos($\varphi$)

The test signal was sinusoidal with ON time—230 µs (MAX current/power to TX), OFF time—20 ms (no current/power to TX), ON/OFF current ratio>=300 @ I=5 Amp (amplitude)

TX current/power control had the signal generator (SG) amplitude~2+/−0.3 dBm with the amplifier gain varied to reach needed current/power.

The XY position for each new sample is tuned to get max Irx at TX current amplitude~0.4-0.5 Amp.

Temperature was controlled better then <3% of the set value. The temperature measurements (T>23 deg C.) were performed after 10 min of the reaching the set temperature.

The equipment used included:
Arbitrary function generator Stanford Research, DS345
Pulse delay generator Stanford Research, DG 535
High power amplifier Amplifier Research, 100A250A
Oscilloscope Tektronix TDS 3014B
  Current probe Tektronix, P6022
  Voltage probe Tektronix, P6138
Temperature measurements and control
  Measurements—K-type thermocouple with multimeter Keithley 2000 and 2000-SCAN Keithley Switch
  Temperature control—Flexible heater KHLV-202/10 witch source meter Keithley 2400

TABLE 2 shows Rx current, Rx power, Rx/Tx current, and Rx/Tx power for various temperatures for Sample D, Sample E, and Sample F films obtained using the test system of FIGS. 27 through 29.

TABLE 2

| Material | Temp (C.) | Appx. Rx Current (Amps) | Appx Rx Power (Watts) | Rx/Tx Current (%) | Rx/Tx Power (%) |
|---|---|---|---|---|---|
| SAMPLE E | 22.4 | 0.50 | 2.59 | 28.3 | 60.8 |
| | | 1.01 | 10.41 | 28.4 | 57.7 |
| | | 1.51 | 23.47 | 28.3 | 55.1 |
| | | 2.01 | 41.70 | 28.1 | 53.5 |
| | 40 | 0.50 | 2.59 | 28.5 | 61.3 |
| | | 1.00 | 10.32 | 28.6 | 58.0 |
| | | 1.50 | 23.43 | 28.4 | 55.2 |
| | | 2.01 | 41.84 | 28.2 | 52.9 |
| | 80 | 0.50 | 2.58 | 28.4 | 61.1 |
| | | 1.00 | 10.36 | 28.5 | 57.4 |
| | | 1.50 | 23.43 | 28.5 | 55.3 |
| | | 2.01 | 41.75 | 28.3 | 52.9 |
| SAMPLE D | 22.4 | 0.50 | 2.59 | 26.1 | 56.8 |
| | | 1.01 | 10.41 | 26.1 | 53.6 |
| | | 1.51 | 23.60 | 26.0 | 50.5 |
| | | 2.01 | 41.95 | 25.8 | 48.8 |
| | 40 | 0.50 | 2.57 | 26.1 | 57.3 |
| | | 1.01 | 10.42 | 26.2 | 53.8 |
| | | 1.50 | 23.43 | 26.1 | 50.9 |
| | | 2.01 | 41.76 | 25.9 | 48.3 |
| | 80 | 0.50 | 2.58 | 26.1 | 56.6 |
| | | 1.00 | 52.81 | 26.2 | 52.8 |
| | | 1.51 | 50.71 | 26.0 | 50.7 |
| | | 2.01 | 48.90 | 25.8 | 48.9 |
| SAMPLE F | 22.4 | 0.50 | 2.58 | 27.7 | 59.7 |
| | | 1.01 | 10.45 | 28.0 | 56.3 |
| | | 1.51 | 27.74 | 27.7 | 53.8 |
| | | 2.00 | 26.09 | 26.1 | 48.5 |
| | 40 | 0.50 | 2.59 | 27.9 | 60.0 |
| | | 1.01 | 10.39 | 28.1 | 56.6 |
| | | 1.50 | 23.40 | 27.5 | 53.1 |
| | | 2.02 | 42.30 | 23.6 | 43.0 |
| | 80 | 0.50 | 2.58 | 28.1 | 59.5 |
| | | 1.00 | 10.37 | 26.6 | 53.0 |

Figure 30:
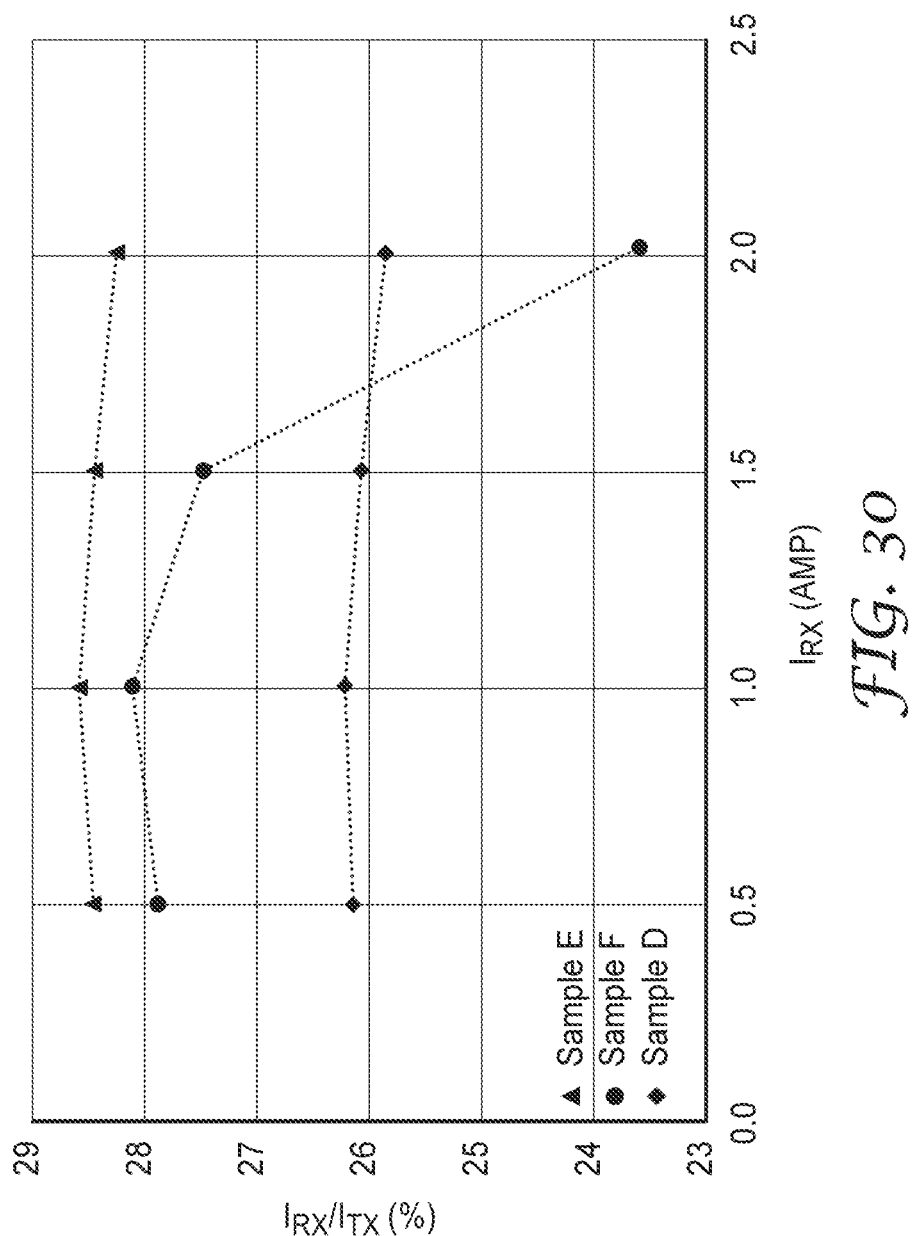
FIG. 30 is a graph showing overlaid plots of the ratio of the receive coil current (IRX) to the transmit coil current (ITX) current at 40 degrees C. for three magnetic film sample types.

FIG. 30 is a graph showing overlaid plots of the ratio of the receive coil current (IRX) to the transmit coil current (ITX) current at 40 degrees C. for the three sample types indicated in Table 2. FIGS. 30-33 shows IRX/ITX data for five layer constructions using magnetic film sample types D and E at various temperatures.

According to some embodiments, a magnetic film heat is treated at a temperature exceeding 530 degrees C. under an ammonia atmosphere and is intentionally cracked to form a plurality of interconnected cracks covering substantially the entire magnetic film. The cracks define a plurality of electrically conductive magnetic islands. A magnetic stack can be formed by stacking five repeat units, each repeat unit comprising the magnetic film and an adhesive layer. Each magnetic film can have an average thickness in a range from about 18 microns to about 22 microns and each adhesive layer can have a thickness in a range from about 4 microns to about 6 microns. A receiver assembly is formed by disposing the magnetic stack between a metal plate and a receiver coil. The receiver coil has an outer diameter in a range from about 42 mm to about 44 mm, an inner diameter in a range from about 19 mm to about 21 mm, and is formed by wrapping two parallel insulated copper wires between 4 and 6 turns. Each insulated copper wire has a wire diameter in a range from about 0.9 mm to about 1.1 mm with a core copper diameter of about 80 microns. The receiver coil is terminated at a load resistor of about 9.7 ohms to about 10.7. A transmitter assembly is formed by disposing a transmitter coil on a reference magnetic film having a thickness in a range from about 2 mm to about 3 mm. The transmitter coil can be substantially identical to the receiver coil. The reference magnetic film comprises an electrically insulative magnetic material comprising a complex magnetic permeability comprising a real part $\mu'$ and an imaginary part $\mu''$. For example, $\mu'$ may be in a range from about 640 to about 710 and $\mu''<10$ at 128 kHz. The receiver assembly is disposed on the transmitter assembly with the receiver coil facing, and spaced apart by a separation distance in a range from about 4.5 mm to 5.5 mm from the transmitter coil. A current ITX flowing in the transmitter coil induces a current IRX in the load resistor wherein IRX/ITX is greater than or equal to about 0.245 when IRX is about 2 Amps and a temperature of the magnetic stack is about 40 degrees centigrade.

According to some embodiments, IRX/ITX is greater than or equal to about 0.26 when IRX is about 2 Amp and the temperature of the magnetic stack is about 40 degrees centigrade.

In some embodiments, the reference magnetic film is a ferrite film. In some embodiments, the reference magnetic film is a ferrite film comprising Ni and Zn.

Figure 31:
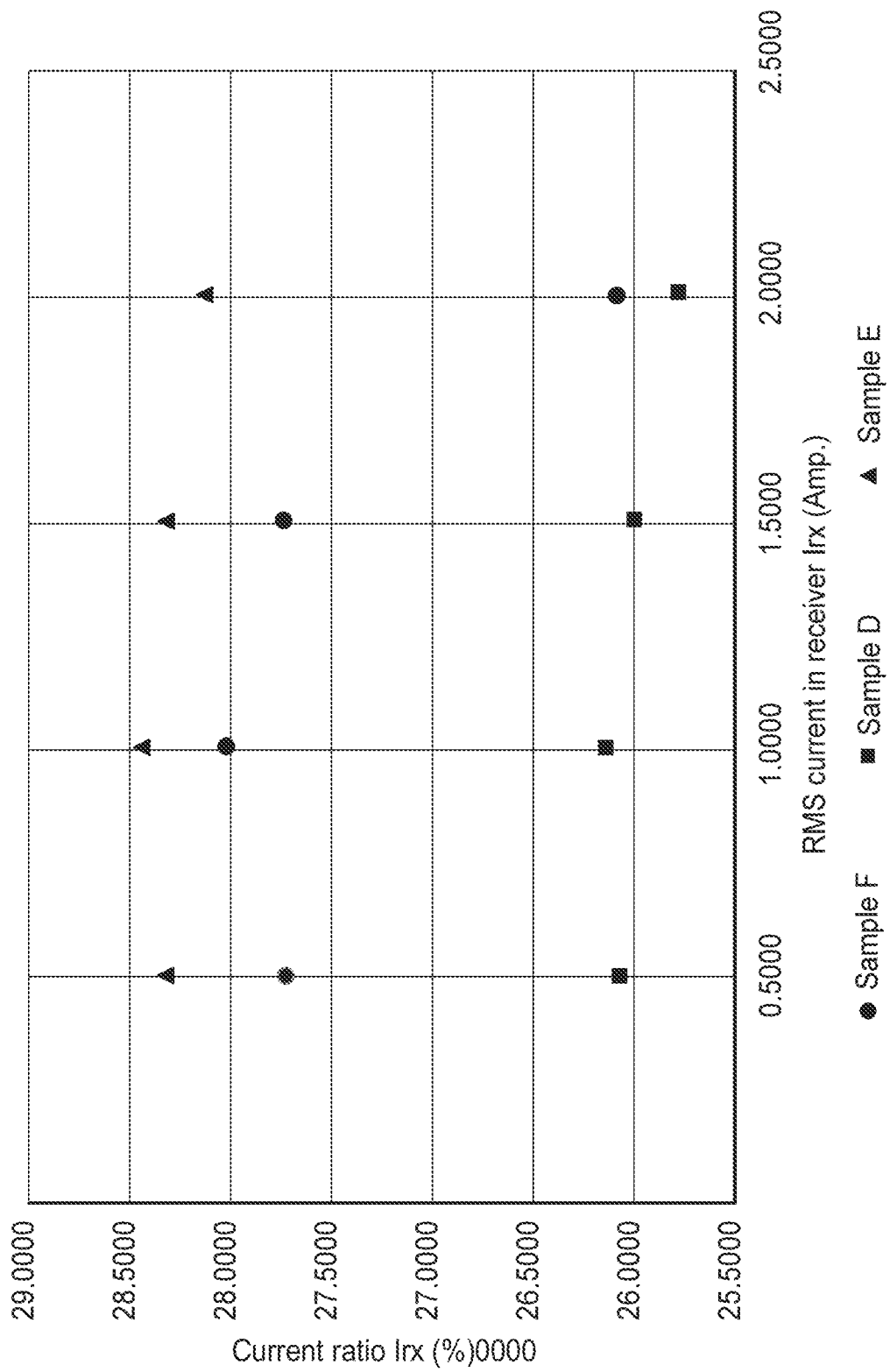
FIG. 31 is a graph showing plots of the IRX/ITX ratio for three magnetic film sample types at 22.4 degrees C.
Figure 32:
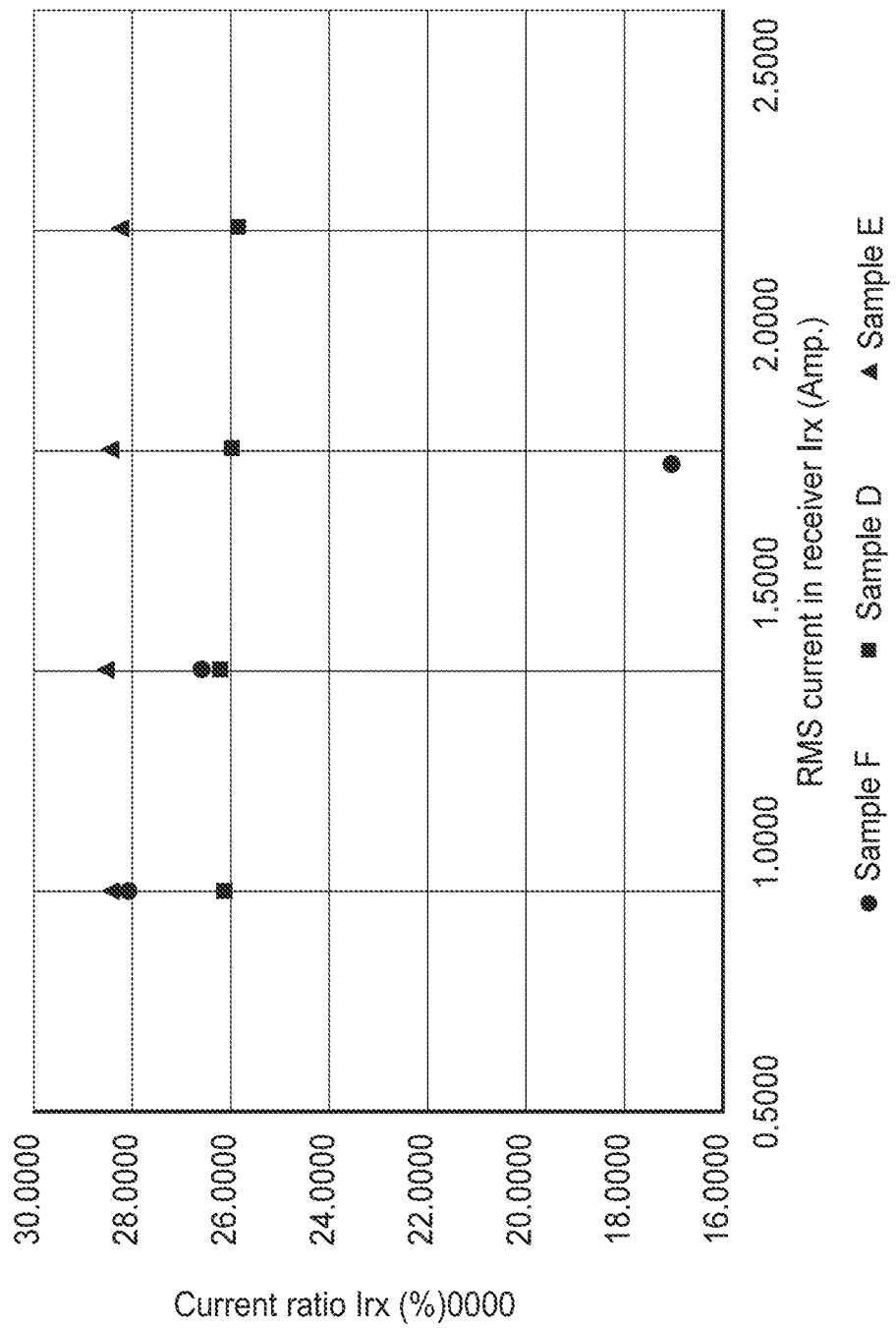
FIG. 32 are plots of the IRX/ITX ratio for the three magnetic film sample types at 80 degrees C.
Figure 33:
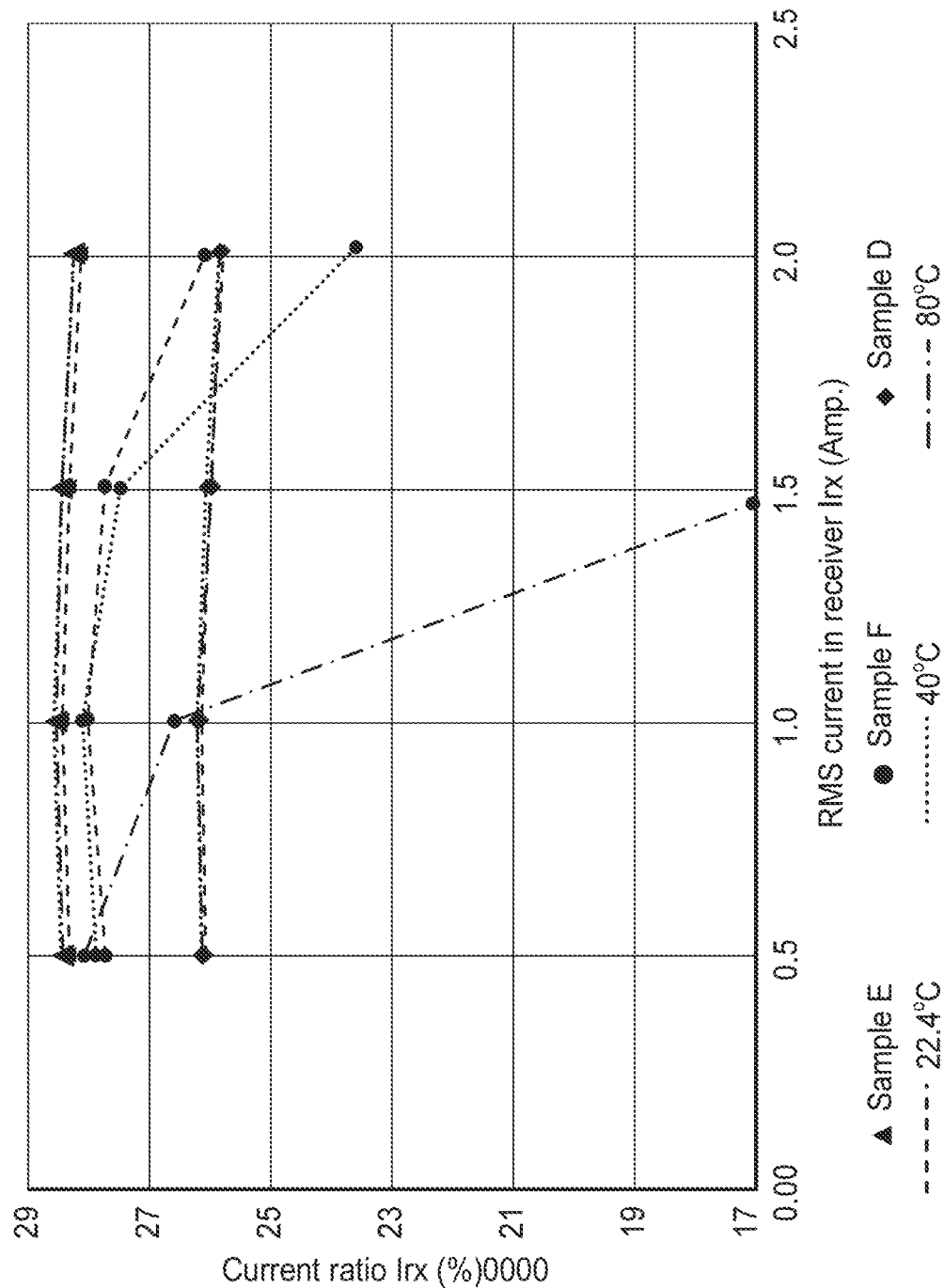
FIG. 33 is a consolidated graph showing the overlaid plots of FIGS. 30-32.

FIG. 31 is a graph showing plots of the IRX/ITX ratio for the sample types of FIG. 30 at 22.4 degrees C. FIG. 32 are plots of the IRX/ITX ratio for the sample types of FIG. 30 at 80 degrees C. FIG. 33 is a consolidated graph showing the overlaid plots of FIGS. 30-32. Table 2 and FIGS. 30-33 indicate the temperature stability of a construction comprising multiple layers of magnetic film Sample type E. In some embodiments, when the temperature of the magnetic stack is in a range from about 35 degrees to about 45 degrees C., and ITX is changed to vary IRX from about 0.5 Amp to about 2 Amp, the ratio IRX/ITX varies by no more than about 10%, or no more than about 5%, or no more than about 4%.

According to the behavior exhibited by a magnetic stack construction comprising multiple layers of Sample E magnetic film, in some embodiments, when the temperature of the magnetic stack is about 40 degrees centigrade, and ITX is changed to vary IRX from about 0.5 Amp to about 2 Amp, IRX/ITX remains greater than about 0.27 and varies by no more than about 3%, or by no more than about 2%.

Figure 34:
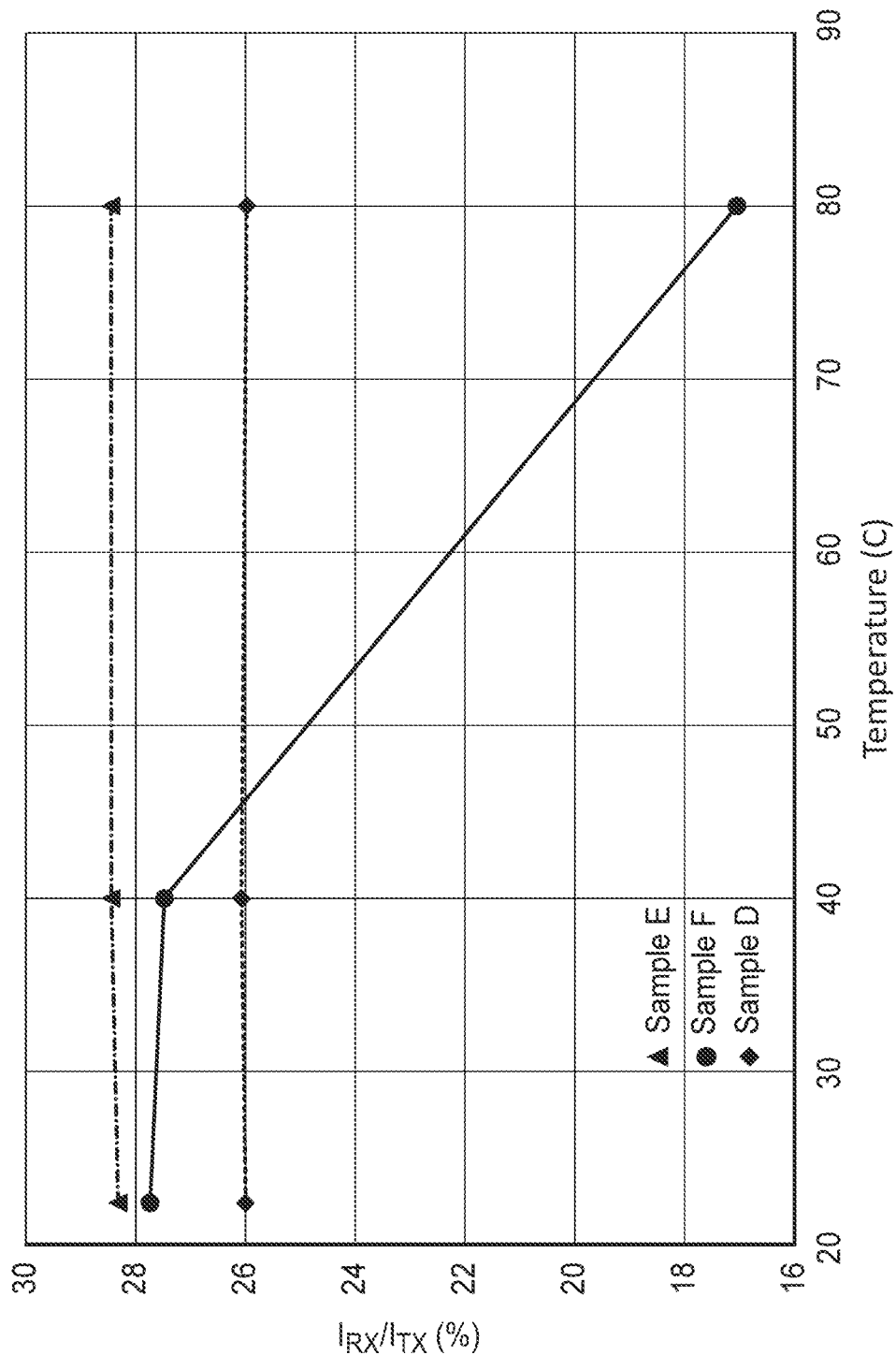
FIG. 34 is a graph showing overlaid plots of the received to transmitted current ratio at a receive current of 1.5 amps with respect to temperature for several magnetic films.

FIG. 34 is a graph showing overlaid plots of the received to transmitted current ratio at a receive current of 1.5 amps with respect to temperature for a 5 layer Sample E magnetic stack, a 5 layer Sample D magnetic stack, and a ferrite layer (Sample F). The Sample E stack exhibits a higher receive to transmit current ratio throughout the indicated temperature range.

According to some embodiments, a magnetic film heat is treated at a temperature exceeding 530 degrees C. under an ammonia atmosphere and is intentionally cracked to form a plurality of interconnected cracks covering substantially the entire magnetic film, the cracks defining a plurality of electrically conductive magnetic islands. A magnetic stack is formed by stacking five repeat units, each repeat unit comprising the magnetic film having an average thickness in a range from about 18 microns to about 22 microns and an adhesive layer having a thickness in a range from about 4 microns to about 6 microns. A receiver assembly is formed by disposing the magnetic stack between a metal plate and a receiver coil. The receiver coil has an outer diameter in a range from about 42 mm to about 44 mm, an inner diameter in a range from about 19 mm to about 21 mm, and is formed by wrapping two parallel insulated copper wires between 4 and 6 turns. Each insulated copper wire has a wire diameter in a range from about 0.9 mm to about 1.1 mm with a core copper diameter of about 80 microns. The receiver coil is terminated at a load resistor of about 9.7 ohms to about 10.7. A transmitter assembly is formed by disposing a transmitter coil on a reference magnetic film having a thickness in a range from about 2 mm to about 3 mm, the transmitter coil is substantially identical to the receiver coil. The reference magnetic film comprises an electrically insulative magnetic material having a complex magnetic permeability that includes a real part µ' and an imaginary part µ", wherein µ' is in a range from about 640 to about 710 and µ"<10 at 128 kHz. The receiver assembly is disposed on the transmitter assembly with the receiver coil facing, and spaced apart by a separation distance in a range from about 4.5 mm to 5.5 mm from, the transmitter coil. A current ITX flowing in the transmitter coil induces a current IRX in the load resistor. According to some implementations, IRX/ITX≥0.18 when IRX is about 1.5 Amp and the temperature of the magnetic stack is about 80 degrees centigrade. According to some embodiments, IRX/ITX≥0.265 when IRX is about 1.5 Amp and the temperature of the magnetic stack is about 80 degrees centigrade.

Figure 35:
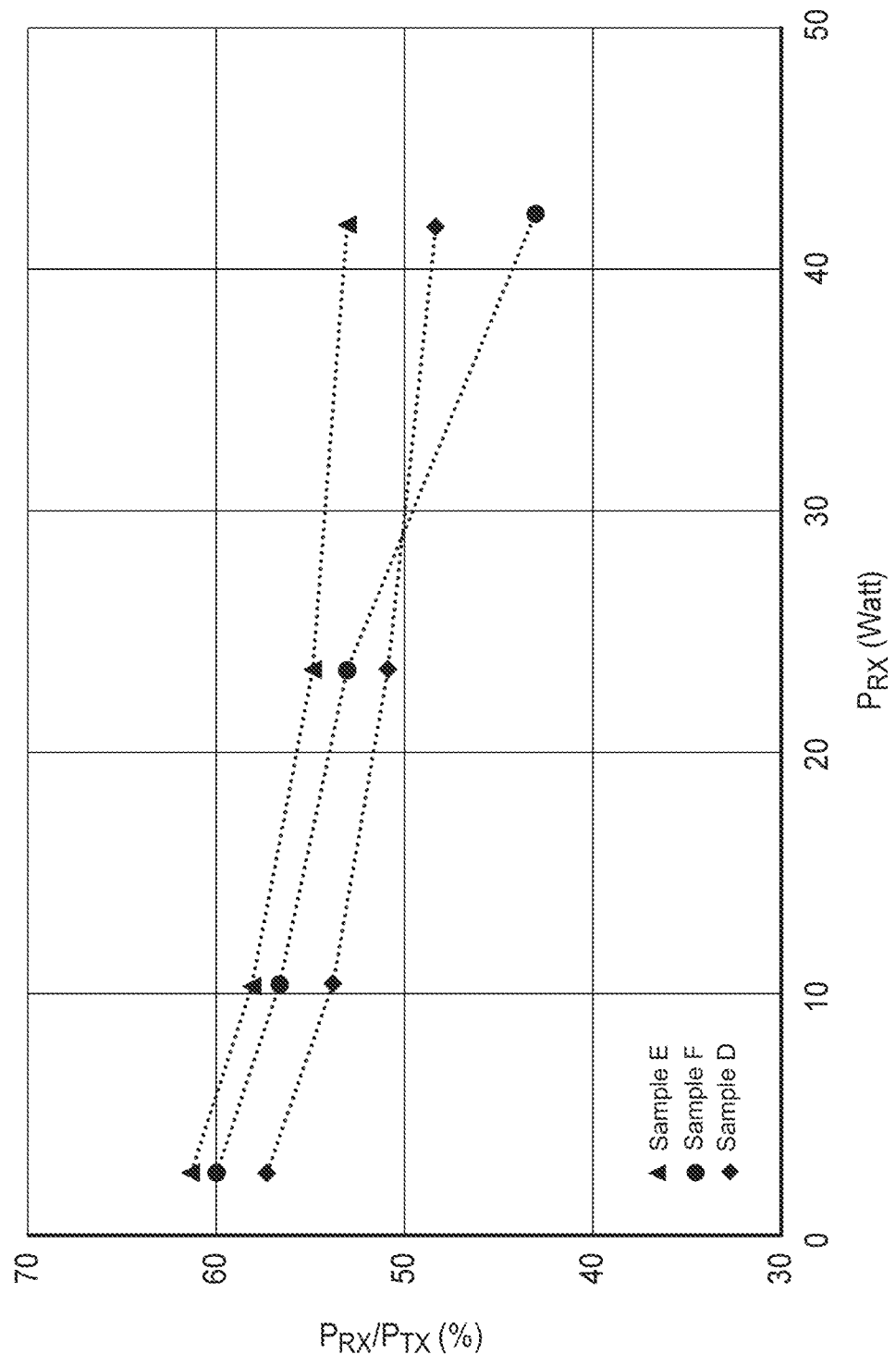
FIG. 35 is a graph showing overlaid plots of the received to transmitted power ratio of the receive and transmit coils $P_{RX}/P_{TX}$ as a function of $P_{RX}$ at 40 degrees C. for magnetic stack multi-layer constructions.

FIG. 35 is a graph showing overlaid plots of the received to transmitted power ratio of the receive and transmit coils $P_{RX}/P_{TX}$ as a function of $P_{RX}$ at 40 degrees C. for magnetic stack multi-layer constructions comprising Sample type E and Sample type D as well as a Sample F ferrite magnetic film. According to some configurations, a magnetic film is heat treated at a temperature exceeding 530 degrees C. under an ammonia atmosphere and is intentionally cracked to form a plurality of interconnected cracks covering substantially the entire magnetic film, the cracks defining a plurality of electrically conductive magnetic islands. A magnetic stack construction is formed by stacking five repeat units, each repeat unit comprising the magnetic film having an average thickness in a range from about 18 microns to about 22 microns and an adhesive layer having a thickness in a range from about 4 microns to about 6 microns. A receiver assembly is formed by disposing the magnetic stack between a metal plate and a receiver coil, the receiver coil having an outer diameter in a range from about 42 mm to about 44 mm, an inner diameter in a range from about 19 mm to about 21 mm, and formed by wrapping two parallel insulated copper wires between 4 and 6 turns. Each insulated copper wire has a wire diameter in a range from about 0.9 mm to about 1.1 mm with a core copper diameter of about 80 microns. The receiver coil terminated at a load resistor of about 9.7 ohms to about 10.7. The transmitter assembly is formed by disposing a transmitter coil on a reference magnetic film having a thickness in a range from about 2 mm to about 3 mm. The transmitter coil can be substantially identical to the receiver coil. The reference magnetic film comprises an electrically insulative magnetic material having a complex magnetic permeability including a real part µ' and an imaginary part µ", µ' in a range from about 640 to about 710 and µ"<10 at 128 kHz. The receiver assembly is disposed on the transmitter assembly with the receiver coil facing, and spaced apart by a separation distance in a range from about 4.5 mm to 5.5 mm from, the transmitter coil. The power $P_{TX}$ delivered to the transmitter coil induces a power $P_{RX}$ transferred to the load resistor. According to some embodiments, $P_{RX}/P_{TX}$ is greater than or equal to about 0.45, or greater than or equal to about 0.50, when Pix is about 40 W and a temperature of the magnetic stack is about 40 degrees centigrade.

Figure 36:
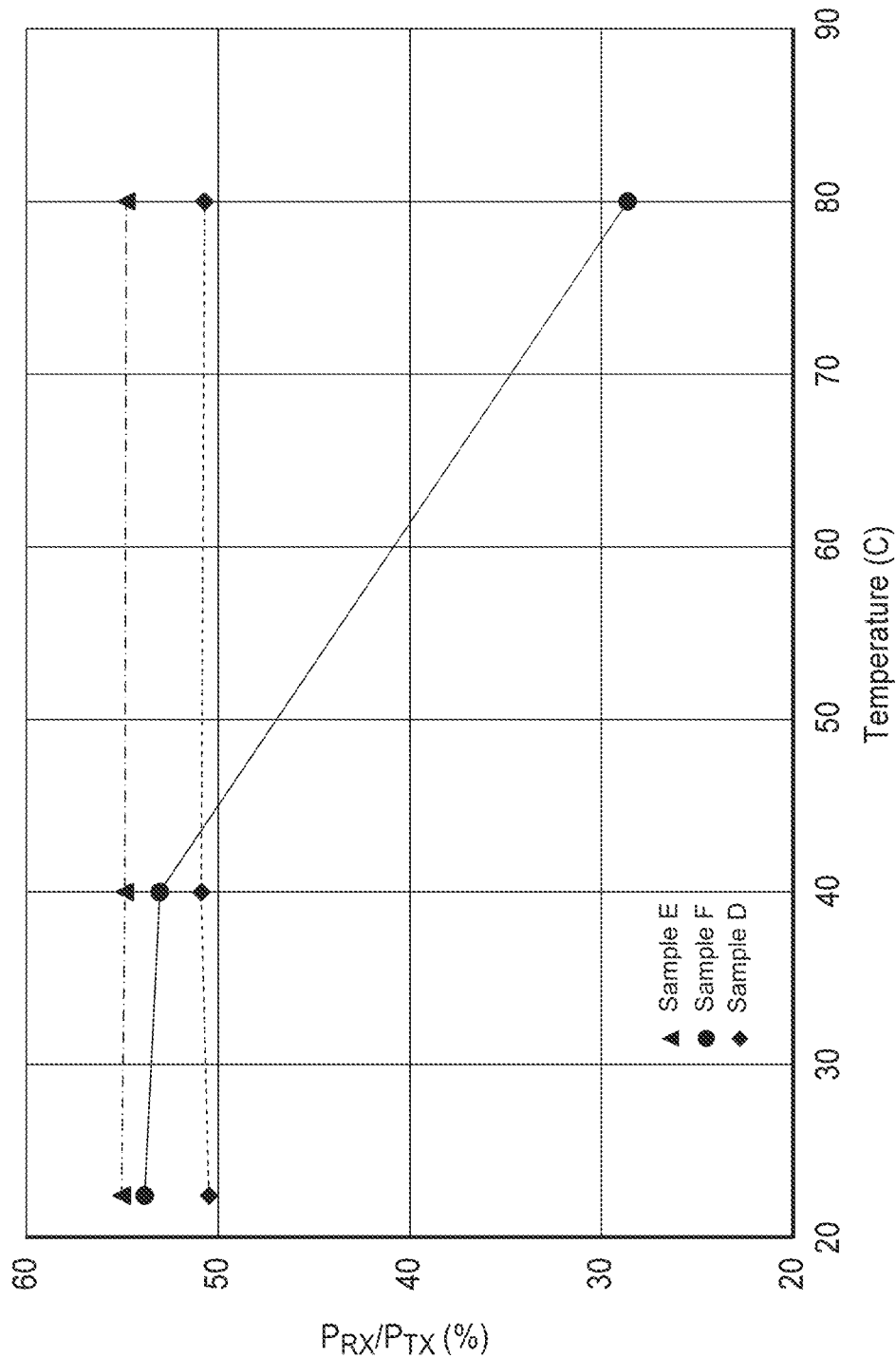
FIG. 36 is a graph showing overlaid plots of the received to transmitted power ratio of the receive and transmit coils $P_{RX}/P_{TX}$ as a function of temperature when $P_{RX}$ is about 23.5 Watts for magnetic stack multi-layer constructions.

FIG. 36 is a graph showing overlaid plots of the received to transmitted power ratio of the receive and transmit coils $P_{RX}/P_{TX}$ as a function of temperature when $P_{RX}$ is about 23.5 Watts for magnetic stack multi-layer constructions comprising Sample type E and Sample type D as well as a Sample F ferrite magnetic film.

According to some embodiments, a magnetic film is heat treated at a temperature exceeding 530 degrees C. under an ammonia atmosphere and intentionally cracked to form a plurality of interconnected cracks covering substantially the entire magnetic film, the cracks defining a plurality of electrically conductive magnetic islands. A magnetic stack is formed by stacking five repeat units, each repeat unit comprising the magnetic film having an average thickness in a range from about 18 microns to about 22 microns and an adhesive layer having a thickness in a range from about 4 microns to about 6 microns. A receiver assembly is formed by disposing the magnetic stack between a metal plate and a receiver coil, the receiver coil having an outer diameter in a range from about 42 mm to about 44 mm, an inner diameter in a range from about 19 mm to about 21 mm, and formed by wrapping two parallel insulated copper wires between 4 and 6 turns, each insulated copper wire having a wire diameter in a range from about 0.9 mm to about 1.1 mm with a core copper diameter of about 80 microns, the receiver coil terminated at a load resistor of about 9.7 ohms to about 10.7. A transmitter assembly is formed by disposing a transmitter coil on a reference magnetic film having a thickness in a range from about 2 mm to about 3 mm, the transmitter coil being substantially identical to the receiver coil, the reference magnetic film comprising an electrically insulative magnetic material comprising a complex magnetic permeability comprising a real part µ' and an imaginary part µ", µ' in a range from about 640 to about 710 and µ"<10 at 128 kHz. The receiver assembly is disposed on the transmitter assembly with the receiver coil facing, and spaced apart by a separation distance in a range from about 4.5 mm to 5.5 mm from, the transmitter coil. A power $P_{TX}$ delivered to the transmitter coil induces a power $P_{RX}$ transferred to the load resistor, $P_{RX}/P_{TX}$ greater than or equal to about 0.35, or even greater than or equal to about 0.52, when $P_{RX}$ is about 23.5 W and a temperature of the magnetic stack is about 80 degrees centigrade.

Items discussed in this disclosure include the following items:

Item 1. A magnetic film comprising iron and copper distributed between opposing first and second major surfaces of the magnetic film, the copper having a first atomic concentration C1 at a first depth d1 from the first major surface and a peak second atomic concentration C2 at a second depth d2 from the first major surface, d2>d1, C2/C1≥5.

Item 2. The magnetic film of item 1, wherein d1<5 nm.

Item 3. The magnetic film of item 1, wherein d1<3 nm.

Item 4. The magnetic film of item 1, wherein 5<d2<20 nm.

Item 5. The magnetic film of item 1, wherein the copper has a third atomic concentration C3 at a third depth d3 from the second major surface and a peak fourth atomic concentration at a fourth depth d4 from the second major surface, d4>d3, C4/C3≥5.

Item 6. The magnetic film of claim item 5, wherein d1 and d3 are within 20% of each other.

Item 7. The magnetic film of claim item 5, wherein d2 and d4 are within 20% of each other.

Item 8. The magnetic film of any of items 1 through 7 further comprising silicon.

Item 9. A magnetic film comprising iron and copper distributed between opposing first and second major surfaces of the magnetic film, the copper having atomic concentrations C1 and C2 at the respective first and second major surfaces and a peak atomic concentration C3 in an interior region of the film between the first and second major surfaces, C3/Cs≥5, Cs being a greater of C1 and C2.

Item 10. A magnetic film comprising a plurality of interconnected channels forming a two-dimensional array of electrically conductive magnetic islands, the channels at least partially suppressing eddy currents induced within the magnetic film by a magnetic field, each magnetic island comprising iron and a copper migration layer at each major surface of the magnetic island by migrating copper from an interior region of the magnetic island to the migration layer.

Item 11. A magnetic film comprising an alloy comprising iron, silicon, boron, niobium and copper, wherein at least portions of the copper have phase separated from the alloy and migrated from a first region of the magnetic film farther from a first major surface of the magnetic film to a second region of the magnetic film closer to the first major surface, so that the second region has a higher % atomic copper concentration than the first region.

Item 12. The magnetic film of item 11 having a larger permeability at least in part because of the migration of the copper from the first region to the second region.

Item 13. A magnetic film comprising iron, silicon and a plurality of copper particles distributed therein, wherein the copper particles are distributed non-uniformly in a thickness direction of the magnetic film.

Item 14. The magnetic film of item 13, wherein an average size of the copper particles is less than about 50 nm.

Item 15. The magnetic film of any of items 13 through 14, wherein the copper particles are substantially crystalline.

Item 16. A magnetic film comprising a plurality of copper particles dispersed therein so that the copper has a first peak atomic concentration within a depth of about 50 nm from a first major surface of the magnetic film and away from the first major surface.

Item 17. A magnetic film comprising iron and manganese distributed between opposing first and second major surfaces of the magnetic film, the manganese having a peak first atomic concentration C1 within a first depth d1 from the first major surface, wherein an atomic concentration of the manganese throughout the first depth is greater than about 4%.

Item 18. The magnetic film of item 17, wherein d1<4 nm.

Item 19. The magnetic film of item 17, wherein d1<3 nm.

Item 20. The magnetic film of any of items 17 through 19, wherein C1>5%.

Item 21. The magnetic film of any of items 17 through 19, wherein C1>7%.

Item 22. The magnetic film of any of items 17 through 19, wherein C1>8%.

Item 23. The magnetic film of any of items 17 through 22, wherein the manganese has a peak second atomic concentration C2 within a second depth d2 from the second major surface, wherein the atomic concentration of the manganese throughout the second depth is greater than about 4%.

Item 24. The magnetic film of item 23, wherein d1 and d2 are within 20% of each other.

Item 25. The magnetic film of item 23, wherein C2>7%.

Item 26. The magnetic film of any of items 17 through 25 further comprising silicon.

Item 27. A magnetic film comprising iron and manganese distributed between opposing first and second major surfaces of the magnetic film, the manganese having a first peak atomic concentration C1 within a first depth d1 from the first major surface and a second peak atomic concentration C2 within a second depth from the second major surface, wherein C1 and C2 are each greater than about 4%.

Item 28. The magnetic film of item 27, wherein d1 and d2 are each less than about 10 nm.

Item 29. An electromagnetic interference suppression film comprising a substrate having a layer of an electrically conductive soft magnetic material bonded thereto, wherein the layer of electrically conductive soft magnetic material comprises a plurality of electrically conductive soft magnetic islands separated from each other by a network of interconnected gaps, each magnetic island comprising iron and a region adjacent each major surface of the magnetic island having a non-uniform atomic concentration of manganese along a thickness direction of the region.

Item 30. A magnetic film comprising an alloy comprising iron, silicon, boron, niobium and manganese, wherein at least portions of the manganese have migrated from a first region of the magnetic film farther from a first major surface of the magnetic film to a second region of the magnetic film closer to the first major surface, so that the second region has a higher % atomic manganese concentration than the first region.

Item 31. The magnetic film of item 30 having a larger permeability at least in part because of the migration of the manganese from the first region to the second region.

Item 32. A magnetic film comprising iron, copper, nitrogen, niobium and manganese distributed between opposing first and second major surfaces of the magnetic film, across a first region of the magnetic film extending between a first depth d1 from the first major surface to a second depth d2 from the first major surface, the manganese having a greater atomic concentration than each of the iron, copper, nitrogen and niobium, across a second region of the magnetic film extending between a third depth d3 from the first major surface to a fourth depth d4 from the first major surface, the manganese having a smaller atomic concentration than each of the iron, copper, nitrogen and niobium, wherein d4>d3≥d2>d1.

Item 33. A magnetic film comprising iron, silicon and copper distributed between opposing first and second major surfaces of the magnetic film, the silicon having a first peak atomic concentration C1 at a first depth d1 from the first major surface, the copper having a second peak atomic concentration C2 at a second depth d2 from the first major surface, wherein d1<d2 and C1>C2.

Item 34. A magnetic film comprising iron, boron and manganese distributed between opposing first and second major surfaces of the magnetic film, such that in a first region adjacent the first major surface, atomic concentrations of the iron and boron increase along a thickness direction of the first region, and the manganese has a first peak atomic concentration C1.

Item 35. A magnetic film comprising iron, silicon and manganese distributed between opposing first and second major surfaces of the magnetic film, such that in a first region adjacent the first major surface, atomic concentrations of the iron and boron increase along a thickness direction of the first region, and the manganese has a first peak atomic concentration C1.

Item 36. A magnetic film comprising iron, silicon, boron and nitrogen distributed between opposing first and second major surfaces of the magnetic film, the nitrogen having a first peak atomic concentration C1 at a first non-zero depth d1 from the first major surface, wherein at the first depth d1, the boron has an atomic concentration C2, the iron has an atomic concentration C3 and the silicon has an atomic concentration C4, and wherein C4>C3>C2>C1.

Item 37. A method of making a magnetic film having high permeability, comprising the following steps in sequence:
providing a nanocrystalline soft magnetic layer comprising an iron alloy;
heating the soft magnetic layer at a first elevated temperature for a first time interval under a nitrogen atmosphere;
heating the soft magnetic layer at a second elevated temperature, greater than the first elevated temperature, for a second time interval under an ammonia or a nitrogen atmosphere; and
heating the soft magnetic layer at a third elevated temperature, greater than the second elevated temperature, for a third time interval under a nitrogen atmosphere.

Item 38. The method of item 37, wherein heating the soft magnetic layer at the second elevated temperature for the second time interval is carried out under an ammonia atmosphere.

Item 39. The method of item 37, wherein heating the soft magnetic layer at the second elevated temperature for the second time interval is carried out under a nitrogen atmosphere.

Item 40. A magnetic film comprising iron, silicon and manganese distributed between opposing first and second major surfaces of the magnetic film, such that when the magnetic film is in a form of a disc having a diameter of about 6 mm and a thickness of about 20 microns, cracking the magnetic disc to form a plurality of interconnected cracks defining a plurality of electrically conductive magnetic islands changes a measured DC magnetic permeability of the magnetic disc for a DC magnetic field applied substantially perpendicular to a thickness direction of the magnetic disc, by less than about 10%.

Item 41. The magnetic film of item 40, wherein the measured DC magnetic permeability of the magnetic disc for the DC magnetic field applied substantially perpendicular to the thickness direction of the magnetic disc is greater than 100 and less than 500.

Item 42. The magnetic film of item 40, wherein the measured DC magnetic permeability of the magnetic disc for the DC magnetic field applied substantially perpendicular to the thickness direction of the magnetic disc is greater than 150 and less than 400.

43. The magnetic film of item 40, wherein the measured DC magnetic permeability of the magnetic disc for the DC magnetic field applied substantially perpendicular to the thickness direction of the magnetic disc is greater than 200 and less than 300.

Item 44. A magnetic film comprising iron, silicon and manganese distributed between opposing first and second major surfaces of the magnetic film, the magnetic film having a minimum lateral dimension d and a maximum thickness h, d/h≥100, such that cracking the magnetic film to form a plurality of electrically conductive magnetic islands changes a measured DC magnetic permeability of the magnetic film for a DC magnetic field applied substantially along the lateral direction of the magnetic film by less than about 10%.

Item 45. A magnetic film comprising iron, silicon and manganese distributed between opposing first and second major surfaces of the magnetic film, the magnetic film having a relative magnetic permeability $\mu'$ at 1 kHz and a saturation magnetization M, M/$\mu'$≥2.5.

Item 46. A magnetic film comprising a plurality of interconnected channels forming a two-dimensional array of electrically conductive magnetic islands, the channels at least partially suppressing eddy currents induced within the magnetic film by a magnetic field, each magnetic island comprising copper having a peak atomic concentration inside the island, the magnetic film comprising respective measured DC magnetic permeability and coercivity $\mu'$ and $H_C$ for a DC magnetic field applied substantially along a lateral direction of the magnetic film, $\mu'/H_c$≥1000.

Item 47. A magnetic film comprising a plurality of electrically conductive magnetic islands separated by a plurality of interconnected channels, the channels at least partially suppressing eddy current induced within the magnetic film by a magnetic field, the magnetic film having a relative magnetic permeability $\mu'$ measured at an applied magnetic field H and a frequency f, such that for f in a range from about 100 kHz to about 500 kHz and H in a range from about 60 A/m to about 1200 A/m, $\mu'$ changes by greater than about 20%.

Item 48. A magnetic film comprises at least iron, silicon and manganese distributed between opposing first and second major surfaces of the magnetic film, the magnetic film having a plurality of interconnected cracks defining a plurality of electrically conductive islands, wherein the magnetic film has a ferromagnetic resonance frequency, $f_{gc}$, that is at least five times greater than a ferromagnetic resonance frequency, $f_{gun}$, of an identical magnetic film that does not include a plurality of interconnected cracks defining a plurality of electrically conductive islands.

Item 49. A magnetic film comprising a plurality of interconnected channels forming a two-dimensional array of electrically conductive magnetic islands, the channels at least partially suppressing eddy currents induced within the magnetic film by a magnetic field, each magnetic island comprising copper having a peak atomic concentration inside the island, the magnetic film comprising a complex magnetic permeability comprising a real part $\mu'$ and an imaginary part $\mu''$, 6≤$\mu'/\mu''$≤14 at a frequency of $10^5$ Hz, and $\mu'/\mu''$≤6 at a frequency of $3\times10^5$ Hz.

Item 50. A magnetic film heat treated at a temperature exceeding 530° C. under an ammonia or a nitrogen atmosphere and intentionally cracked to form a plurality of interconnected cracks covering substantially the entire magnetic film, the cracks defining a plurality of electrically conductive magnetic islands, such that when a magnetic stack is formed by stacking five repeat units, each repeat unit comprising the magnetic film having an average thickness in a range from about 15 microns to about 25 microns and an adhesive layer having a thickness in a range from about 2 microns to about 10 microns, and an assembly is formed by disposing the magnetic stack between a metal plate and a coil, the coil having an outer diameter in a range from about 40 mm to about 45 mm, an inner diameter in a range from about 15 mm to about 25 mm, and formed by wrapping two parallel copper wires a preselected number of turns, each copper wire having a wire diameter in a range from about 0.5 mm to about 1.5 mm, the assembly has a Q-value less than about 90 at a frequency of about 400 kHz and a Q-value less than about 60 at a frequency of about 800 kHz for a current in a range from about 8 milli-Amps to about 12 milli-Amps passing through the coil.

Item 51. The magnetic film of item 50, wherein the magnetic film in each repeat unit has an average thickness in a range from about 16 microns to about 24 microns.

Item 52. The magnetic film of item 50, wherein the magnetic film in each repeat unit has an average thickness in a range from about 17 microns to about 23 microns.

Item 53. The magnetic film of item 50, wherein the magnetic film in each repeat unit has an average thickness in a range from about 18 microns to about 22 microns.

Item 54. The magnetic film of item 50, wherein the magnetic film in each repeat unit has an average thickness in a range from about 18 microns to about 21 microns.

Item 55. The magnetic film of item 50, wherein the magnetic film in each repeat unit has an average thickness in a range from about 18 microns to about 20 microns.

Item 56. The magnetic film of item 50, wherein the adhesive layer in each repeat unit has a thickness in a range from about 2 microns to about 8 microns.

Item 57. The magnetic film of item 50, wherein the adhesive layer in each repeat unit has a thickness in a range from about 3 microns to about 7 microns.

Item 58. The magnetic film of item 50, wherein the adhesive layer in each repeat unit has a thickness in a range from about 4 microns to about 6 microns.

Item 59. The magnetic film of item 50, wherein the adhesive layer in each repeat unit has a thickness of about 5 microns.

Item 60. The magnetic film of item 50, wherein the metal plate is an aluminum plate having a thickness in a range from about 0.2 mm to about 1 mm.

Item 61. The magnetic film of item 50, wherein the metal plate is an aluminum plate has a thickness of about 0.4 mm.

Item 62. The magnetic film of item 50, wherein the coil has an outer diameter in a range from about 41 mm to about 44 mm.

Item 63. The magnetic film of item 50, wherein the coil has an outer diameter in a range from about 42 mm to about 44 mm.

Item 64. The magnetic film of item 50, wherein the coil has an outer diameter of about 43 mm.

Item 65. The magnetic film of item 50, wherein the coil has an inner diameter in a range from about 16 mm to about 24 mm.

Item 66. The magnetic film of item 50, wherein the coil has an inner diameter in a range from about 17 mm to about 23 mm.

Item 67. The magnetic film of item 50, wherein the coil has an inner diameter in a range from about 18 mm to about 22 mm.

Item 68. The magnetic film of item 50, wherein the coil has an inner diameter in a range from about 19 mm to about 21 mm.

Item 69. The magnetic film of item 50, wherein the coil has an inner diameter of about 20 mm.

Item 70. The magnetic film of item 50, wherein the preselected number of turns is between 2 and 10.

Item 71. The magnetic film of item 50, wherein the preselected number of turns is between 3 and 8.

Item 72. The magnetic film of item 50, wherein the preselected number of turns is between 4 and 7.

Item 73. The magnetic film of item 50, wherein the preselected number of turns is between 4 and 6.

Item 74. The magnetic film of item 50, wherein the preselected number of turns is 5.

Item 75. The magnetic film of item 50, wherein the copper wire diameter is in a range from about 0.6 mm to about 1.4 mm.

Item 76. The magnetic film of item 50, wherein the copper wire diameter is in a range from about 0.7 mm to about 1.3 mm.

Item 77. The magnetic film of item 50, wherein the copper wire diameter is in a range from about 0.8 mm to about 1.2 mm.

Item 78. The magnetic film of item 50, wherein the copper wire diameter is in a range from about 0.9 mm to about 1.1 mm.

Item 79. The magnetic film of item 50, wherein the copper wire diameter is about 1 mm.

Item 80. The magnetic film of item 50, wherein the copper wire is an insulated wire having a dimeter of about 1 mm and a core copper conductor having a dimeter of about 80 microns.

Item 81. The magnetic film of item 50, wherein the Q-value is less than about 90 at a frequency of about 400 kHz and a Q-value less than about 60 at a frequency of about 800 kHz for a current in a range from about 9 milli-Amps to about 11 milli-Amps passing through the coil.

Item 82. The magnetic film of item 50, wherein the Q-value is less than about 90 at a frequency of about 400 kHz and a Q-value less than about 60 at a frequency of about 800 kHz for a current of about 10 milli-Amps passing through the coil.

Item 83. The magnetic film of item 50, wherein the Q-value is less than about 80 at a frequency of about 400 kHz and a Q-value less than about 55 at a frequency of about 800 kHz for a current of about 10 milli-Amps passing through the coil.

Item 84. The magnetic film of item 50, wherein the Q-value is less than about 70 at a frequency of about 400 kHz and a Q-value less than about 50 at a frequency of about 800 kHz for a current of about 10 milli-Amps passing through the coil.

Item 85. The magnetic film of item 50, wherein the Q-value is less than about 65 at a frequency of about 400 kHz and a Q-value less than about 45 at a frequency of about 800 kHz for a current of about 10 milli-Amps passing through the coil.

Item 86. The magnetic film of item 50, wherein the coil has a thickness in a range from about 2 mm to about 3 mm.

Item 87. The magnetic film of item 50, wherein the coil has a thickness in a range from about 2.2 mm to about 2.8 mm.

Item 88. The magnetic film of item 50, wherein the coil has a thickness in a range from about 2.4 mm to about 2.6 mm.

Item 89. The magnetic film of item 50, wherein the magnetic stack further comprises a dielectric cover layer disposed on the five repeat units, the dielectric cover layer having a thickness in a range from about 2 to 10 microns.

Item 90. The magnetic film of item 50, wherein the magnetic stack further comprises a dielectric cover layer disposed on the five repeat units, the dielectric cover layer having a thickness in a range from about 3 to 9 microns.

Item 91. The magnetic film of item 50, wherein the magnetic stack further comprises a dielectric cover layer disposed on the five repeat units, the dielectric cover layer having a thickness in a range from about 2 to 10 microns.

Item 92. An electromagnetic interference suppression multilayer stack comprising one or more stacked magnetic films, each magnetic film comprising a plurality of interconnected gaps forming a two-dimensional array of electrically conductive magnetic islands, the gaps extending substantially vertically between opposing first and second major surfaces of the magnetic film and at least partially suppressing eddy currents induced within the magnetic film by a magnetic field, a maximum width of the gaps in the plurality of interconnected gaps being less than about 500 nm.

93. The electromagnetic interference suppression multilayer stack of item 92 comprising at least two stacked magnetic films.

Item 94. The electromagnetic interference suppression multilayer stack of item 92 comprising one or more stacked repeat units, each repeat unit comprising a magnetic film of the one or more stacked magnetic films and an adhesive layer.

Item 95. The electromagnetic interference suppression multilayer stack of any of items 92 through 94, wherein the maximum width of the gaps in the plurality of interconnected gaps is less than about 450 nm.

Item 96. The electromagnetic interference suppression multilayer stack of any of items 92 through 94, wherein the maximum width of the gaps in the plurality of interconnected gaps is less than about 400 nm.

Item 97. The electromagnetic interference suppression multilayer stack of any of items 92 through 94, wherein the maximum width of the gaps in the plurality of interconnected gaps is less than about 350 nm.

Item 98. A magnetic film heat treated at a temperature exceeding 530° C. under an ammonia atmosphere and intentionally cracked to form a plurality of interconnected cracks covering substantially the entire magnetic film, the cracks defining a plurality of electrically conductive magnetic islands, such that when: a magnetic stack is formed by stacking five repeat units, each repeat unit comprising the magnetic film having an average thickness in a range from about 18 microns to about 22 microns and an adhesive layer having a thickness in a range from about 4 microns to about 6 microns;

a receiver assembly is formed by disposing the magnetic stack between a metal plate and a receiver coil, the receiver coil having an outer diameter in a range from about 42 mm to about 44 mm, an inner diameter in a range from about 19 mm to about 21 mm, and formed by wrapping two parallel insulated copper wires between 4 and 6 turns, each insulated copper wire having a wire diameter in a range from about 0.9 mm to about 1.1 mm with a core copper diameter of about 80 microns, the receiver coil terminated at a load resistor of about 9.7 ohms to about 10.7;

a transmitter assembly is formed by disposing a transmitter coil on a reference magnetic film having a thickness in a range from about 2 mm to about 3 mm, the transmitter coil being substantially identical to the receiver coil, the reference magnetic film comprising an electrically insulative magnetic material comprising a complex magnetic permeability comprising a real part $\mu'$ and an imaginary part $\mu''$, $\mu'$ in a range from about 640 to about 710 and $\mu''<10$ at 128 kHz; and the receiver assembly is disposed on the transmitter assembly with the receiver coil facing, and spaced apart by a separation distance in a range from about 4.5 mm to 5.5 mm from, the transmitter coil, a current ITX flowing in the transmitter coil induces a current IRX in the load resistor, IRX/ITX≥0.245 when IRX is about 2 Amp and a temperature of the magnetic stack is about 40 degrees centigrade.

Item 99. The magnetic film of item 98, wherein IRX/ITX≥0.245 when IRX is about 2 Amp and the temperature of the magnetic stack is about 40 degrees centigrade.

Item 100. The magnetic film of item 98, wherein the reference magnetic film comprises a ferrite.

Item 101. The magnetic film of item 98, wherein the reference magnetic film comprises a ferrite comprising Ni and Zn.

Item 102. A magnetic film heat treated at a temperature exceeding 530° C. under an ammonia and intentionally cracked to form a plurality of interconnected cracks covering substantially the entire magnetic film, the cracks defining a plurality of electrically conductive magnetic islands, such that when: a magnetic stack is formed by stacking five repeat units, each repeat unit comprising the magnetic film having an average thickness in a range from about 18 microns to about 22 microns and an adhesive layer having a thickness in a range from about 4 microns to about 6 microns;

a receiver assembly is formed by disposing the magnetic stack between a metal plate and a receiver coil, the receiver coil having an outer diameter in a range from about 42 mm to about 44 mm, an inner diameter in a range from about 19 mm to about 21 mm, and formed by wrapping two parallel insulated copper wires between 4 and 6 turns, each insulated copper wire having a wire diameter in a range from about 0.9 mm to about 1.1 mm with a core copper diameter of about 80 microns, the receiver coil terminated at a load resistor of about 9.7 ohms to about 10.7;

a transmitter assembly is formed by disposing a transmitter coil on a reference magnetic film having a thickness in a range from about 2 mm to about 3 mm, the transmitter coil being substantially identical to the receiver coil, the reference magnetic film comprising an electrically insulative magnetic material comprising a complex magnetic permeability comprising a real part $\mu'$ and an imaginary part $\mu''$, $\mu'$ in a range from about 640 to about 710 and $\mu''<10$ at 128 kHz; and the receiver assembly is disposed on the transmitter assembly with the receiver coil facing, and spaced apart by a separation distance in a range from about 4.5 mm to 5.5 mm from, the transmitter coil, a current ITX flowing in the transmitter coil induces a current IRX in the load resistor, such that when a temperature of the magnetic stack is in a arrange from about 35 degrees to about 45 degrees centigrade, and ITX is changed to vary IRX from about 0.5 Amp to about 2 Amp, IRX/ITX varies by no more than about 10%.

Item 103. The magnetic film of claim 102, wherein when the temperature of the magnetic stack is about 40 degrees centigrade, and ITX is changed to very IRX from about 0.5 Amp to about 2 Amp, IRX/ITX varies by no more than about 5%.

Item 104. The magnetic film of claim 102, wherein when the temperature of the magnetic stack is about 40 degrees centigrade, and ITX is changed to very IRX from about 0.5 Amp to about 2 Amp, IRX/ITX varies by no more than about 4%.

Item 105. The magnetic film of claim 102, wherein when the temperature of the magnetic stack is about 40 degrees centigrade, and ITX is changed to very IRX from about 0.5 Amp to about 2 Amp, IRX/ITX remains greater than about 0.27 and varies by no more than about 3%.

Item 106. The magnetic film of claim 102, wherein when the temperature of the magnetic stack is about 40 degrees centigrade, and ITX is changed to very IRX from about 0.5 Amp to about 2 Amp, IRX/ITX remains greater than about 0.27 and varies by no more than about 2%.

Item 107. A magnetic film heat treated at a temperature exceeding 530° C. under an ammonia atmosphere and intentionally cracked to form a plurality of interconnected cracks covering substantially the entire magnetic film, the cracks defining a plurality of electrically conductive magnetic islands, such that when:
  a magnetic stack is formed by stacking five repeat units, each repeat unit comprising the magnetic film having an average thickness in a range from about 18 microns to about 22 microns and an adhesive layer having a thickness in a range from about 4 microns to about 6 microns;
  a receiver assembly is formed by disposing the magnetic stack between a metal plate and a receiver coil, the receiver coil having an outer diameter in a range from about 42 mm to about 44 mm, an inner diameter in a range from about 19 mm to about 21 mm, and formed by wrapping two parallel insulated copper wires between 4 and 6 turns, each insulated copper wire having a wire diameter in a range from about 0.9 mm to about 1.1 mm with a core copper diameter of about 80 microns, the receiver coil terminated at a load resistor of about 9.7 ohms to about 10.7;
  a transmitter assembly is formed by disposing a transmitter coil on a reference magnetic film having a thickness in a range from about 2 mm to about 3 mm, the transmitter coil being substantially identical to the receiver coil, the reference magnetic film comprising an electrically insulative magnetic material comprising a complex magnetic permeability comprising a real part $\mu'$ and an imaginary part $\mu''$, $\mu'$ in a range from about 640 to about 710 and $\mu''<10$ at 128 kHz; and
  the receiver assembly is disposed on the transmitter assembly with the receiver coil facing, and spaced apart by a separation distance in a range from about 4.5 mm to 5.5 mm from, the transmitter coil, a current ITX flowing in the transmitter coil induces a current IRX in the load resistor, IRX/ITX≥0.18 when IRX is about 1.5 Amp and a temperature of the magnetic stack is about 80 degrees centigrade.

Item 108. A magnetic film heat treated at a temperature exceeding 530° C. under an ammonia atmosphere and intentionally cracked to form a plurality of interconnected cracks covering substantially the entire magnetic film, the cracks defining a plurality of electrically conductive magnetic islands, such that when:
  a magnetic stack is formed by stacking five repeat units, each repeat unit comprising the magnetic film having an average thickness in a range from about 18 microns to about 22 microns and an adhesive layer having a thickness in a range from about 4 microns to about 6 microns;
  a receiver assembly is formed by disposing the magnetic stack between a metal plate and a receiver coil, the receiver coil having an outer diameter in a range from about 42 mm to about 44 mm, an inner diameter in a range from about 19 mm to about 21 mm, and formed by wrapping two parallel insulated copper wires between 4 and 6 turns, each insulated copper wire having a wire diameter in a range from about 0.9 mm to about 1.1 mm with a core copper diameter of about 80 microns, the receiver coil terminated at a load resistor of about 9.7 ohms to about 10.7;
  a transmitter assembly is formed by disposing a transmitter coil on a reference magnetic film having a thickness in a range from about 2 mm to about 3 mm, the transmitter coil being substantially identical to the receiver coil, the reference magnetic film comprising an electrically insulative magnetic material comprising a complex magnetic permeability comprising a real part $\mu'$ and an imaginary part $\mu''$, $\mu'$ in a range from about 640 to about 710 and $\mu''<10$ at 128 kHz; and
  the receiver assembly is disposed on the transmitter assembly with the receiver coil facing, and spaced apart by a separation distance in a range from about 4.5 mm to 5.5 mm from, the transmitter coil, a power PTX delivered to the transmitter coil induces a power PRX transferred to the load resistor, PRX/PTX≥0.45 when PRX is about 40 W and a temperature of the magnetic stack is about 40 degrees centigrade.

Item 109. A magnetic film heat treated at a temperature exceeding 530° C. under an ammonia atmosphere and intentionally cracked to form a plurality of interconnected cracks covering substantially the entire magnetic film, the cracks defining a plurality of electrically conductive magnetic islands, such that when: a magnetic stack is formed by stacking five repeat units, each repeat unit comprising the magnetic film having an average thickness in a range from about 18 microns to about 22 microns and an adhesive layer having a thickness in a range from about 4 microns to about 6 microns;
  a receiver assembly is formed by disposing the magnetic stack between a metal plate and a receiver coil, the receiver coil having an outer diameter in a range from about 42 mm to about 44 mm, an inner diameter in a range from about 19 mm to about 21 mm, and formed by wrapping two parallel insulated copper wires between 4 and 6 turns, each insulated copper wire having a wire diameter in a range from about 0.9 mm to about 1.1 mm with a core copper diameter of about 80 microns, the receiver coil terminated at a load resistor of about 9.7 ohms to about 10.7;

a transmitter assembly is formed by disposing a transmitter coil on a reference magnetic film having a thickness in a range from about 2 mm to about 3 mm, the transmitter coil being substantially identical to the receiver coil, the reference magnetic film comprising an electrically insulative magnetic material comprising a complex magnetic permeability comprising a real part $\mu'$ and an imaginary part $\mu''$, $\mu'$ in a range from about 640 to about 710 and $\mu'' < 10$ at 128 kHz; and the receiver assembly is disposed on the transmitter assembly with the receiver coil facing, and spaced apart by a separation distance in a range from about 4.5 mm to 5.5 mm from, the transmitter coil, a power PTX delivered to the transmitter coil induces a power PRX transferred to the load resistor, PRX/PTX≥0.35 when PRX is about 23.5 W and a temperature of the magnetic stack is about 80 degrees centigrade.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments will be apparent to those skilled in the art and it should be understood that this scope of this disclosure is not limited to the illustrative embodiments set forth herein. For example, the reader should assume that features of one disclosed embodiment can also be applied to all other disclosed embodiments unless otherwise indicated.

The invention claimed is:

1. A magnetic film comprising iron and copper distributed between opposing first and second major surfaces of the magnetic film, the copper having atomic concentrations C1 and C2 at the respective first and second major surfaces and respective depths d1 and d2 and a peak atomic concentration C3 at a third depth d3 in an interior region of the film between the first and second major surfaces, C3/Cs≥5, Cs being a greater of C1 and C2, wherein the magnetic film has been subjected to a cracking process such that the film comprises a two-dimensional array of electrically conductive magnetic islands separated by interconnected channels.

2. The magnetic film of claim 1, wherein d1 and d3 are within 20% of each other.

3. A magnetic film comprising a plurality of interconnected channels forming a two-dimensional array of electrically conductive magnetic islands, the channels at least partially suppressing eddy currents induced within the magnetic film by a magnetic field, each magnetic island comprising iron and a copper migration layer at each major surface of the magnetic island by migrating copper from an interior region of the magnetic island to the migration layer.

* * * * *